(12) United States Patent
Yamazaki et al.

(10) Patent No.: US 9,679,768 B2
(45) Date of Patent: Jun. 13, 2017

(54) METHOD FOR REMOVING HYDROGEN FROM OXIDE SEMICONDUCTOR LAYER HAVING INSULATING LAYER CONTAINING HALOGEN ELEMENT FORMED THEREOVER

(71) Applicant: Semiconductor Energy Laboratory Co., Ltd., Atsugi-shi, Kanagawa-ken (JP)

(72) Inventors: Shunpei Yamazaki, Setagaya (JP); Kunihiko Suzuki, Atsugi (JP); Masahiro Takahashi, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/551,754

(22) Filed: Nov. 24, 2014

(65) Prior Publication Data

US 2015/0079731 A1 Mar. 19, 2015

Related U.S. Application Data

(62) Division of application No. 14/165,917, filed on Jan. 28, 2014, which is a division of application No.
(Continued)

(30) Foreign Application Priority Data

Oct. 21, 2009 (JP) ................................ 2009-242777

(51) Int. Cl.
*H01L 21/02* (2006.01)
*H01L 29/49* (2006.01)
(Continued)

(52) U.S. Cl.
CPC .. *H01L 21/02664* (2013.01); *H01L 21/02565* (2013.01); *H01L 23/564* (2013.01);
(Continued)

(58) Field of Classification Search
CPC ......... H01L 21/02131; H01L 21/02565; H01L 21/31629; H01L 27/1214; H01L 27/1225;
(Continued)

(56) References Cited

U.S. PATENT DOCUMENTS 5,585,949 A 12/1996 Yamazaki et al.
5,731,856 A 3/1998 Kim et al.
(Continued)

FOREIGN PATENT DOCUMENTS

CN 101258607 A 9/2008
CN 101335276 A 12/2008
(Continued)

OTHER PUBLICATIONS

International Search Report (Application No. PCT/JP2010/067697) Dated Dec. 14, 2010.
(Continued)

*Primary Examiner* — Anh Mai
(74) *Attorney, Agent, or Firm* — Robinson Intellectual Property Law Office; Eric J. Robinson

(57) ABSTRACT

An object is to provide a semiconductor device with stable electric characteristics in which an oxide semiconductor is used. An impurity such as hydrogen or moisture (e.g., a hydrogen atom or a compound containing a hydrogen atom such as $H_2O$) is eliminated from an oxide semiconductor layer with use of a halogen element typified by fluorine or chlorine, so that the impurity concentration in the oxide semiconductor layer is reduced. A gate insulating layer and/or an insulating layer provided in contact with the oxide semiconductor layer can be formed to contain a halogen element. In addition, a halogen element may be attached to the oxide semiconductor layer through plasma treatment under an atmosphere of a gas containing a halogen element.

20 Claims, 30 Drawing Sheets

Related U.S. Application Data

12/906,175, filed on Oct. 18, 2010, now Pat. No. 8,642,412.

(51) Int. Cl.
*H01L 29/786* (2006.01)
*H01L 23/00* (2006.01)
*H01L 29/66* (2006.01)

(52) U.S. Cl.
CPC .... *H01L 29/4908* (2013.01); *H01L 29/66969* (2013.01); *H01L 29/7869* (2013.01); *H01L 29/78606* (2013.01); *H01L 21/02554* (2013.01); *H01L 21/02631* (2013.01); *H01L 2924/0002* (2013.01)

(58) Field of Classification Search
CPC ............. H01L 29/4908; H01L 29/7869; H01L 51/4233
See application file for complete search history.

(56) References Cited

U.S. PATENT DOCUMENTS

| | | | |
|---|---|---|---|
| 5,744,864 A | 4/1998 | Cillessen et al. | |
| 5,837,614 A | 11/1998 | Yamazaki et al. | |
| 5,866,932 A | 2/1999 | Yamazaki et al. | |
| 6,025,630 A | 2/2000 | Yamazaki et al. | |
| 6,100,562 A | 8/2000 | Yamazaki et al. | |
| 6,177,302 B1 | 1/2001 | Yamazaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,332,383 B2 | 2/2008 | Fang et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,465,679 B1 | 12/2008 | Yamazaki et al. | |
| 7,468,304 B2 | 12/2008 | Kaji et al. | |
| 7,501,293 B2 | 3/2009 | Ito et al. | |
| 7,541,646 B2 | 6/2009 | Nagata et al. | |
| 7,601,984 B2 | 10/2009 | Sano et al. | |
| 7,674,650 B2 | 3/2010 | Akimoto et al. | |
| 7,732,819 B2 | 6/2010 | Akimoto et al. | |
| 7,786,514 B2 | 8/2010 | Fang et al. | |
| 7,791,072 B2 | 9/2010 | Kumomi et al. | |
| 7,791,074 B2 | 9/2010 | Iwasaki | |
| 7,888,681 B2 | 2/2011 | Yamazaki et al. | |
| 7,910,490 B2 | 3/2011 | Akimoto et al. | |
| 7,923,722 B2 | 4/2011 | Ryu et al. | |
| 7,923,723 B2 | 4/2011 | Hayashi et al. | |
| 7,932,521 B2 | 4/2011 | Akimoto et al. | |
| 7,935,582 B2 | 5/2011 | Iwasaki | |
| 7,956,361 B2 | 6/2011 | Iwasaki | |
| 8,154,024 B2 | 4/2012 | Iwasaki | |
| 8,158,517 B2 | 4/2012 | Yamamoto et al. | |
| 8,164,256 B2 | 4/2012 | Sano et al. | |
| 8,193,031 B2 | 6/2012 | Hosoba et al. | |
| 8,236,627 B2 | 8/2012 | Tsubuku et al. | |
| 8,247,965 B2 | 8/2012 | Yamazaki et al. | |
| 8,274,077 B2 | 9/2012 | Akimoto et al. | |
| 8,293,594 B2 | 10/2012 | Yamazaki et al. | |
| 8,293,595 B2 | 10/2012 | Yamazaki et al. | |
| 8,343,817 B2 | 1/2013 | Miyairi et al. | |
| 8,344,374 B2 | 1/2013 | Yamazaki et al. | |
| 8,349,647 B2 | 1/2013 | Ryu et al. | |
| 8,368,066 B2 * | 2/2013 | Yamazaki | H01L 27/1225 257/43 |
| 8,373,443 B2 * | 2/2013 | Koyama | H01L 27/1225 257/268 |
| 8,461,583 B2 | 6/2013 | Yano et al. | |
| 8,466,463 B2 | 6/2013 | Akimoto et al. | |
| 8,541,944 B2 | 9/2013 | Sano et al. | |
| 8,566,502 B2 | 10/2013 | Vaghani | |
| 8,629,069 B2 | 1/2014 | Akimoto et al. | |
| 8,642,402 B2 | 2/2014 | Yano et al. | |
| 8,642,412 B2 * | 2/2014 | Yamazaki | H01L 21/02565 257/E21.466 |
| 8,669,550 B2 | 3/2014 | Akimoto et al. | |
| 8,723,175 B2 | 5/2014 | Yano et al. | |
| 8,785,240 B2 | 7/2014 | Watanabe | |
| 8,790,959 B2 | 7/2014 | Akimoto et al. | |
| 8,791,457 B2 | 7/2014 | Yano et al. | |
| 8,796,069 B2 | 8/2014 | Akimoto et al. | |
| 9,099,562 B2 | 8/2015 | Akimoto et al. | |
| 9,142,648 B2 * | 9/2015 | Yamazaki | H01L 27/1225 257/43 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2002/0153565 A1 | 10/2002 | Yamazaki et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |

(56) References Cited

U.S. PATENT DOCUMENTS

| | | |
|---|---|---|
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0299702 A1* | 12/2008 | Son .................... H01L 29/7869 438/104 |
| 2008/0308805 A1 | 12/2008 | Akimoto et al. |
| 2008/0315193 A1 | 12/2008 | Kim et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0184315 A1 | 7/2009 | Lee et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0025677 A1* | 2/2010 | Yamazaki .......... H01L 27/1225 257/43 |
| 2010/0025678 A1 | 2/2010 | Yamazaki et al. |
| 2010/0065844 A1 | 3/2010 | Tokunaga |
| 2010/0084648 A1 | 4/2010 | Watanabe |
| 2010/0092800 A1 | 4/2010 | Itagaki et al. |
| 2010/0109002 A1 | 5/2010 | Itagaki et al. |
| 2010/0283049 A1 | 11/2010 | Sato et al. |
| 2010/0295042 A1 | 11/2010 | Yano et al. |
| 2011/0104851 A1 | 5/2011 | Akimoto et al. |
| 2011/0121290 A1 | 5/2011 | Akimoto et al. |
| 2011/0233541 A1 | 9/2011 | Yamazaki |
| 2012/0122277 A1 | 5/2012 | Yamazaki et al. |
| 2012/0231581 A1 | 9/2012 | Yamazaki et al. |
| 2012/0235140 A1 | 9/2012 | Suzawa et al. |
| 2012/0295399 A1 | 11/2012 | Kim et al. |
| 2015/0340513 A1 | 11/2015 | Akimoto et al. |

FOREIGN PATENT DOCUMENTS

| | | |
|---|---|---|
| EP | 1737044 A | 12/2006 |
| EP | 1770788 A | 4/2007 |
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| EP | 2339639 A | 6/2011 |
| EP | 2816607 A | 12/2014 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-303128 A | 11/1998 |
| JP | 11-505377 | 5/1999 |
| JP | 2000-044236 A | 2/2000 |
| JP | 2000-150900 A | 5/2000 |
| JP | 2001-125141 A | 5/2001 |
| JP | 2002-076356 A | 3/2002 |
| JP | 2002-289859 A | 10/2002 |
| JP | 2003-078146 A | 3/2003 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-167226 A | 6/2005 |
| JP | 2005-294865 A | 10/2005 |
| JP | 2006-049847 A | 2/2006 |
| JP | 2006-165527 A | 6/2006 |
| JP | 2006-165528 A | 6/2006 |
| JP | 2006-165529 A | 6/2006 |
| JP | 2007-073558 A | 3/2007 |
| JP | 2007-103918 A | 4/2007 |
| JP | 2007-123861 A | 5/2007 |
| JP | 3923458 | 5/2007 |
| JP | 2007-220816 A | 8/2007 |
| JP | 2007-250982 A | 9/2007 |
| JP | 2007-299913 A | 11/2007 |
| JP | 2008-281988 A | 11/2008 |
| JP | 2009-004787 A | 1/2009 |
| JP | 2009-141002 A | 6/2009 |
| JP | 2009-224479 A | 10/2009 |
| JP | 2010-056539 A | 3/2010 |
| KR | 2008-0053355 A | 6/2008 |
| KR | 2008-0095538 A | 10/2008 |
| KR | 2008-0104860 A | 12/2008 |
| KR | 2009-0018572 A | 2/2009 |
| KR | 2009-0079686 A | 7/2009 |
| TW | 200701464 | 1/2007 |
| TW | 200735374 | 9/2007 |
| TW | 200847421 | 12/2008 |
| TW | 200910468 | 3/2009 |
| TW | 200941729 | 10/2009 |
| TW | 200943552 | 10/2009 |
| WO | WO-2004/114391 | 12/2004 |
| WO | WO-2005/048222 | 5/2005 |
| WO | WO-2007/029844 | 3/2007 |
| WO | WO-2007/108293 | 9/2007 |
| WO | WO-2008/069286 | 6/2008 |
| WO | WO-2008/096768 | 8/2008 |
| WO | WO-2008/126879 | 10/2008 |
| WO | WO-2009/072532 | 6/2009 |

OTHER PUBLICATIONS

Written Opinion (Application No. PCT/JP2010/067697) Dated Dec. 14, 2010.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG—Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 62106-1-262106-3.

Takahashi.M et al., "Theoretical Analysis of Igzo Transparent Amorphous Oxide Semiconductor", IDW'08: Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—ZnO system at 1350° C", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m = 3, 4, and 5), $InGaO_3(ZnO)3$, and $Ga_2O_3(ZnO)m$ (m = 7, 8, 9, and 16) in the $In_2O_3$—

(56) References Cited

OTHER PUBLICATIONS

ZnGa2O4—ZnO System", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor", Science, May 23, 2003, vol. 300, No. 5623, pp. 1269-1272.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Osada.T et al., "15.2: Development of Driver-Integrated Panel using Amorphous In—Ga—Zn—Oxide TFT", SID Digest '09: SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous Gizo (Ga2O3—In2O3—ZnO) TFT", SID Digest '08 : SID Intenternational Symposium Digest of Technical Papers, May 20, 2008, vol. 39, pp. 633-636.
Lee.J et al., "World's Largest (15-Inch) XGA AMLCD Panel Using Igzo Oxide TFT", SID Digest '08 : SID International Symposium of Technical Papers, May 20, 2008, vol. 39, pp. 625-628.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs ", IDW '02: Proceedings of the 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays"; AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array", SID Digest '08 : SID International Symposium Digest fo Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits , 2008, vol. 43, No. 1, pp. 292-299.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquip-Cholesteric Liquid Crystal Transition:The "Blue Phase"", Physics letters, Sep. 10, 1973, vol. 45A, No. 2, pp. 115-116.
Cho.D et al., "21.2:Al and Sn-Doped Zinc Indium Oxide Thin Film Transistors for AMOLED Back-plane", SID Digest '09: SID International Symposium Digest of Technical Papers, May 31, 2009, pp. 280-283.
Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTS", IDW '09 : Proceedings of the 16th International Display Workshops, 2009, pp. 689-692.
Park.J et al., "Amorphous Indium—Gallium—Zinc Oxide TFTS and Their Application for Large Size AMOLED", AM-FPD '08 Digest of Technical Papers, Jul. 2, 2008, pp. 275-278.
Park.S et al., "Challenge to Future Displays: Transparent AM-OLED Driven by Peald Grown ZnO TFT", IMID '07 Digest, 2007, pp. 1249-1252.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.
Miyasaka.M, "Suftla Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactins on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09: SID International Symposium Digest of Technical Papers, May 31, 2009, pp. 395-398.
Lee.H et al., "Current Status of, Challenges to, and Perspective View of AM-OLED ", IDW '06: Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", Nirim Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N. et al., "Spinel,YBFE2O4, and YB2FE3O7 Types of Structures for Compounds in the In2O3 and SC2O3—A2O3—BO

(56) References Cited

OTHER PUBLICATIONS

Systems [A; Fe, Ga, or Al; B: Mg, Mn, Fe, Ni, Cu,or Zn] at Temperatures Over 1000° C", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08: SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m <4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08: Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Taiwanese Office Action (Application No. 099135075) Dated Apr. 27, 2015.

Taiwanese Office Action (Application No. 104124539) Dated Mar. 1, 2016.

Korean Office Action (Application No. 2012-7006654) Dated Mar. 31, 2017.

Korean Office Action (Application No. 2017-7004916) Dated Mar. 29, 2017.

\* cited by examiner

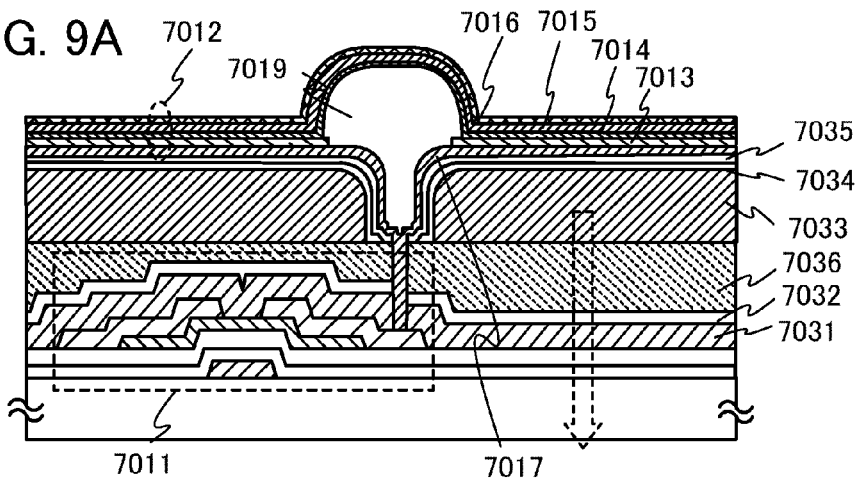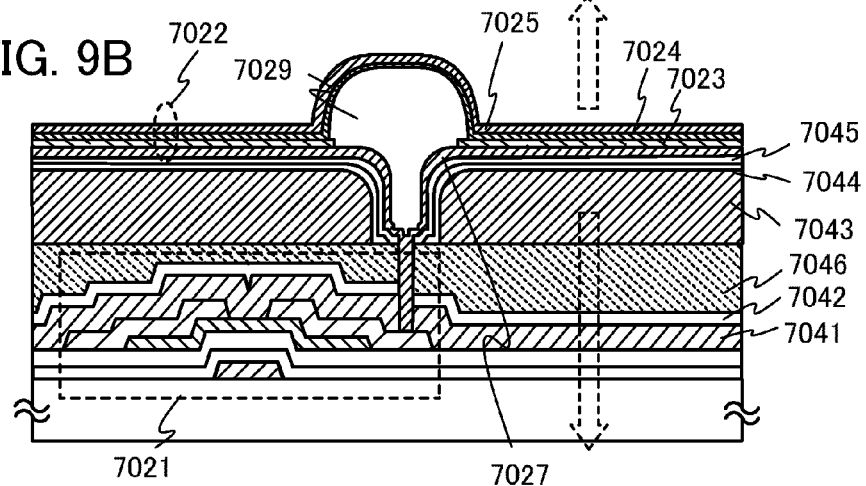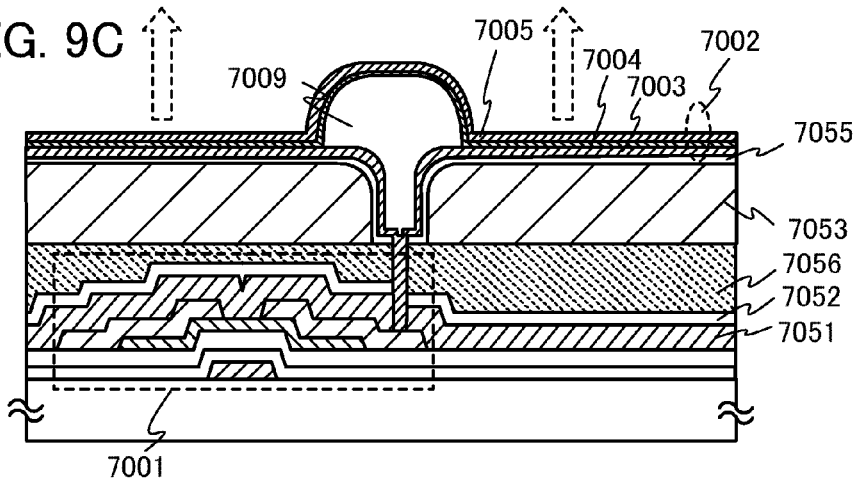

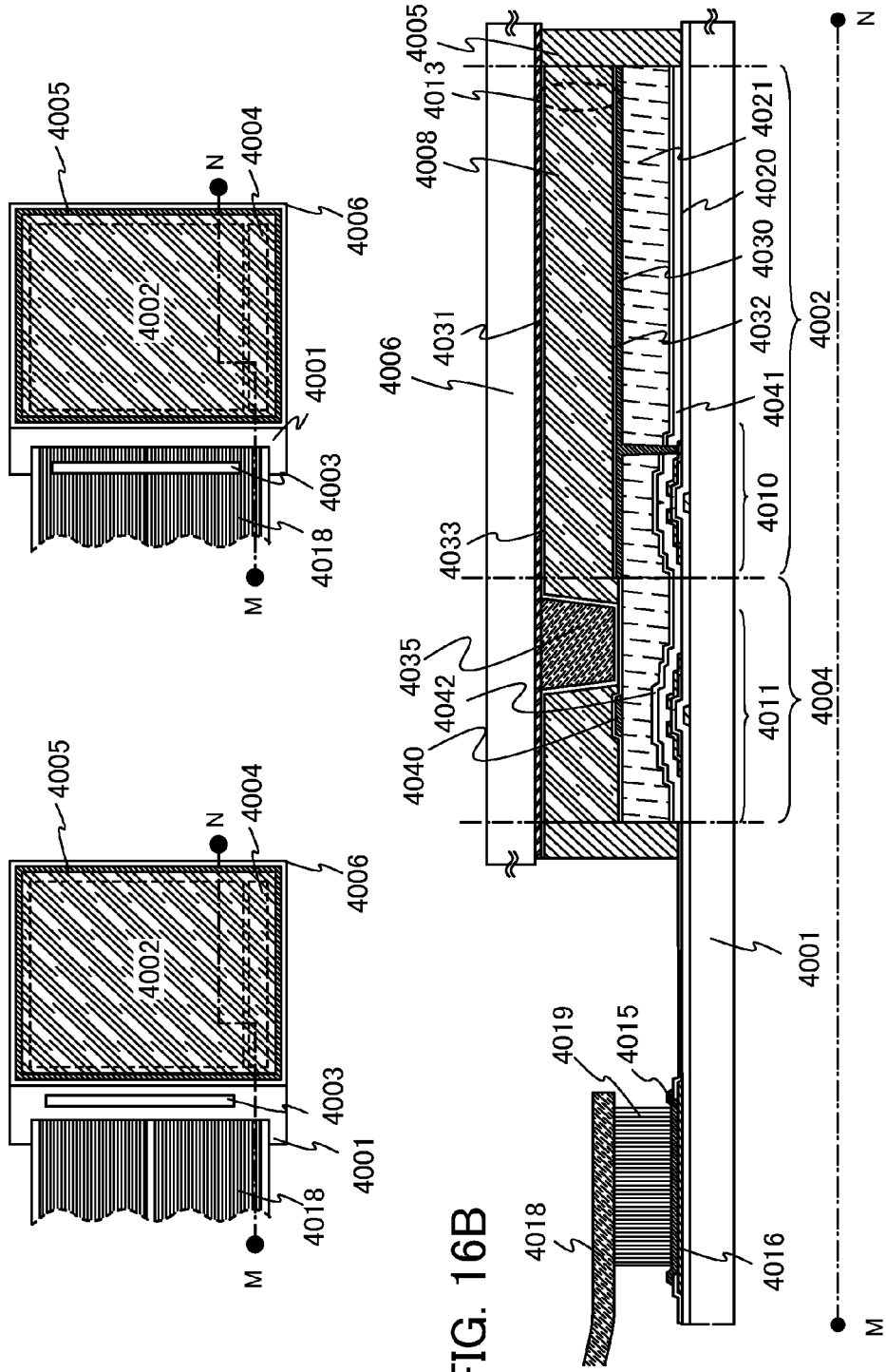

Energy band diagram of a cross section A-A'

Energy band diagram when voltage is applied

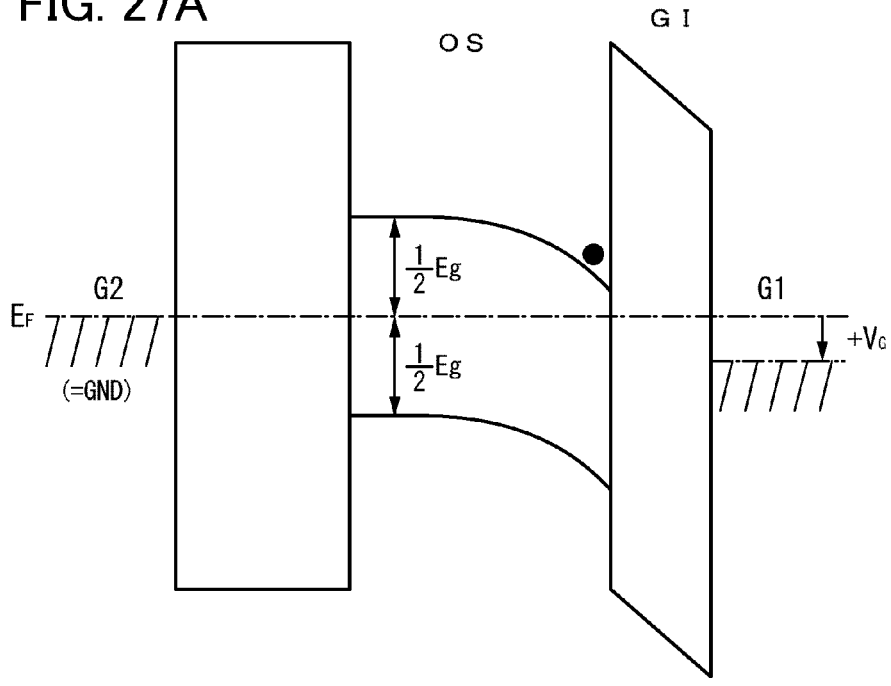
Energy band diagram of a cross section B-B' (+V$_G$)
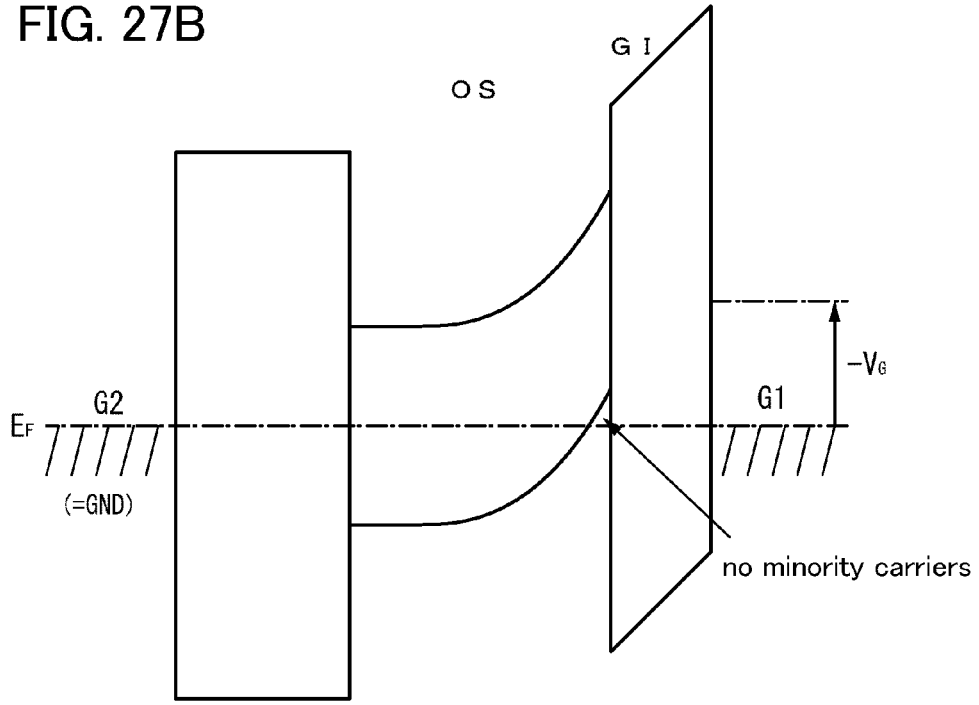
Energy band diagram of a cross section B-B' (-V$_G$)

METHOD FOR REMOVING HYDROGEN FROM OXIDE SEMICONDUCTOR LAYER HAVING INSULATING LAYER CONTAINING HALOGEN ELEMENT FORMED THEREOVER

TECHNICAL FIELD

The present invention relates to a semiconductor device including an oxide semiconductor and a method for manufacturing the semiconductor device.

Note that the semiconductor devices in this specification indicate all the devices which can operate by using semiconductor characteristics, and an electronic optical device, a semiconductor circuit, and an electronic device are all included in the semiconductor devices.

BACKGROUND ART

A technique for forming a thin film transistor (TFT) by using a semiconductor thin film formed over a substrate having an insulating surface has attracted attention. A thin film transistor is used for a display device typified by a liquid crystal television device. A silicon-based semiconductor material is known as a semiconductor thin film that can be applied to a thin film transistor, and in addition, an oxide semiconductor has attracted attention as another material that can be applied to a thin film transistor.

As a material for the oxide semiconductor, zinc oxide and a material containing zinc oxide as its component are known. Further, a thin film transistor formed using an amorphous oxide (oxide semiconductor) having an electron carrier concentration of less than $10^{18}/cm^3$ is disclosed (see Patent Documents 1 to 3).

REFERENCE

Patent Document

[Patent Document 1] Japanese Published Patent Application No. 2006-165527
[Patent Document 2] Japanese Published Patent Application No. 2006-165528
[Patent Document 3] Japanese Published Patent Application No. 2006-165529

DISCLOSURE OF INVENTION

However, a difference from the stoichiometric composition in an oxide semiconductor arises in a thin film formation process. For example, electrical conductivity of an oxide semiconductor is changed due to excess or deficiency of oxygen. Further, hydrogen or moisture that enters the oxide semiconductor thin film during the formation of the thin film forms an O—H (oxygen-hydrogen) bond and serves as an electron donor, which is a factor of changing electrical conductivity. Furthermore, since the O—H bond is a polar molecule, it is a factor of varying characteristics of an active device such as a thin film transistor manufactured using an oxide semiconductor.

In view of such problems, it is an object of one embodiment of the present invention to provide a semiconductor device with stable electric characteristics in which an oxide semiconductor is used.

In order to suppress variation in electric characteristics of a thin film transistor in which an oxide semiconductor layer is used, an impurity such as hydrogen, moisture, hydroxyl, or hydride (also referred to as a hydrogen compound) which is a factor of the variation is eliminated from the interface between the oxide semiconductor layer and an insulating layer provided in contact with the oxide semiconductor layer.

An impurity such as hydrogen or moisture (e.g., a hydrogen atom or a compound containing a hydrogen atom such as $H_2O$) is eliminated from the oxide semiconductor layer with use of a halogen element typified by fluorine or chlorine, so that the impurity concentration in the oxide semiconductor layer is reduced. In this specification, a halogen element means an element belonging to Group 17 in the periodic table (such as fluorine (F), chlorine (Cl), bromine (Br), or iodine (I)); typically, fluorine or chlorine can be used, and one kind of halogen element or a plurality of kinds of halogen elements may be used.

A gate insulating layer and an insulating layer serving as a protective insulating layer, which are provided in contact with the oxide semiconductor layer, can be formed to contain a halogen element. In addition, a halogen element may be attached to the oxide semiconductor layer through plasma treatment under an atmosphere of a gas containing a halogen element.

A halogen element may be introduced into a deposition gas (a sputtering gas) during deposition so as to be contained in the gate insulating layer and the insulating layer. Alternatively, a halogen element remaining in a treatment chamber due to cleaning treatment in the previous step may be contained in the gate insulating layer and the insulating layer. Alternatively, a halogen element may be added to the gate insulating layer and the insulating layer after deposition. Further alternatively, a halogen element may be attached to the interface between the gate insulating layer and the oxide semiconductor layer and the interface between the insulating layer and the oxide semiconductor layer through plasma treatment. In the case where the gate insulating layer and the insulating layer contain a halogen element, the concentration of the halogen element in the gate insulating layer and the insulating layer may be approximately $5 \times 10^{18}$ atoms/cm$^3$ to $1 \times 10^{20}$ atoms/cm$^3$.

By any of the above methods, an impurity such as hydrogen, moisture, hydroxyl, or hydride included in the oxide semiconductor layer is diffused into the gate insulating layer and/or the insulating layer with use of a halogen element, so that the impurity concentration in the oxide semiconductor layer is reduced.

The insulating layer preferably contains excessive oxygen and includes a large number of defects typified by dangling bonds. The insulating layer preferably includes a large number of defects because the insulating layer has higher binding energy mainly with respect to hydrogen, so that diffusion of an impurity from the oxide semiconductor layer to the insulating layer is promoted and the impurity can be stabilized in the insulating layer.

Further, the gate insulating layer, the oxide semiconductor layer, or the insulating layer in contact with the oxide semiconductor layer may be formed in a deposition chamber in which the impurity concentration is reduced by evacuation with use of a cryopump.

As a sputtering gas (including a gas containing a halogen element) used for deposition of the gate insulating layer, the oxide semiconductor layer, and the insulating layer in contact with the oxide semiconductor layer, a high-purity gas is preferably used, in which an impurity such as hydrogen, water, hydroxyl, or hydride is reduced to such a degree that the impurity concentration level is represented by the unit "ppm" or "ppb".

One embodiment of the invention disclosed in this specification is a semiconductor device including a gate electrode layer; a gate insulating layer containing a halogen element over the gate electrode layer; an oxide semiconductor layer over the gate insulating layer containing the halogen element; a source electrode layer and a drain electrode layer over the oxide semiconductor layer; and an insulating layer over the oxide semiconductor layer, the source electrode layer, and the drain electrode layer and in contact with part of the oxide semiconductor layer.

Another embodiment of the invention disclosed in this specification is a semiconductor device including a gate electrode layer; a gate insulating layer over the gate electrode layer; an oxide semiconductor layer over the gate insulating layer; a source electrode layer and a drain electrode layer over the oxide semiconductor layer; and an insulating layer containing a halogen element over the oxide semiconductor layer, the source electrode layer, and the drain electrode layer and in contact with part of the oxide semiconductor layer.

Another embodiment of the invention disclosed in this specification is a semiconductor device including a gate electrode layer; a gate insulating layer containing a halogen element over the gate electrode layer; an oxide semiconductor layer over the gate insulating layer containing the halogen element; a source electrode layer and a drain electrode layer over the oxide semiconductor layer; and an insulating layer containing a halogen element over the oxide semiconductor layer, the source electrode layer, and the drain electrode layer and in contact with part of the oxide semiconductor layer.

In the above structure, a protective insulating layer may be further provided to cover the insulating layer. The gate insulating layer may have a stacked-layer structure in which a nitride insulating layer and an oxide insulating layer are stacked in this order over the gate electrode layer. In this case, at least the oxide insulating layer in contact with the oxide semiconductor layer may contain a halogen element.

Another embodiment of the invention disclosed in this specification is a method for manufacturing a semiconductor device, including the steps of forming a gate electrode layer over a substrate; introducing the substrate into a first treatment chamber on which cleaning treatment is performed with use of a gas containing a halogen element and which is kept in a reduced-pressure state, forming a gate insulating layer containing a halogen element which covers the gate electrode layer, and introducing the substrate into a second treatment chamber which is kept in a reduced-pressure state; introducing a sputtering gas from which hydrogen and moisture are removed in a state where remaining moisture in the second treatment chamber is removed and forming an oxide semiconductor layer over the gate insulating layer containing the halogen element with use of a metal oxide target which is placed in the second treatment chamber; and forming a source electrode layer and a drain electrode layer over the oxide semiconductor layer, introducing the substrate into a third treatment chamber, introducing a sputtering gas containing oxygen from which hydrogen and moisture are removed in a state where remaining moisture in the third treatment chamber is removed, forming an insulating layer over the oxide semiconductor layer with use of a target containing silicon which is placed in the third treatment chamber, and heating the substrate at 100° C. to 400° C. to diffuse hydrogen or moisture included in the oxide semiconductor layer into the gate insulating layer containing the halogen element.

In the above structure, there is no particular limitation on the timing of heat treatment for diffusing hydrogen or moisture included in the oxide semiconductor layer into the gate insulating layer containing the halogen element as long as it is after the oxide semiconductor layer is formed over the gate insulating layer containing the halogen element, and the heat treatment may be performed before the insulating layer is formed.

Another embodiment of the invention disclosed in this specification is a method for manufacturing a semiconductor device, including the steps of forming a gate electrode layer and a gate insulating layer covering the gate electrode layer over a substrate and introducing the substrate into a first treatment chamber which is kept in a reduced-pressure state; introducing a sputtering gas from which hydrogen and moisture are removed in a state where remaining moisture in the first treatment chamber is removed and forming an oxide semiconductor layer over the gate insulating layer with use of a metal oxide target which is placed in the first treatment chamber; and forming a source electrode layer and a drain electrode layer over the oxide semiconductor layer, introducing the substrate into a second treatment chamber, introducing a sputtering gas containing oxygen and a halogen element from which hydrogen and moisture are removed in a state where remaining moisture in the second treatment chamber is removed, forming an insulating layer containing a halogen element over the oxide semiconductor layer with use of a target containing silicon which is placed in the second treatment chamber, and heating the substrate at 100° C. to 400° C. to diffuse hydrogen or moisture included in the oxide semiconductor layer into the insulating layer containing the halogen element.

Another embodiment of the invention disclosed in this specification is a method for manufacturing a semiconductor device, including the steps of forming a gate electrode layer and a gate insulating layer covering the gate electrode layer over a substrate and introducing the substrate into a first treatment chamber which is kept in a reduced-pressure state; introducing a sputtering gas from which hydrogen and moisture are removed in a state where remaining moisture in the first treatment chamber is removed and forming an oxide semiconductor layer over the gate insulating layer with use of a metal oxide target which is placed in the first treatment chamber; and forming a source electrode layer and a drain electrode layer over the oxide semiconductor layer, performing plasma treatment on the oxide semiconductor layer under an atmosphere of a gas containing a halogen element to attach the halogen element to a surface of the oxide semiconductor layer, introducing the substrate into a second treatment chamber, introducing a sputtering gas containing oxygen from which hydrogen and moisture are removed in a state where remaining moisture in the second treatment chamber is removed, forming an insulating layer over the oxide semiconductor layer with use of a target containing silicon which is placed in the second treatment chamber, and heating the substrate at 100° C. to 400° C. to diffuse hydrogen or moisture included in the oxide semiconductor layer into the insulating layer.

In the method for manufacturing a semiconductor device, the substrate temperature during formation of the insulating layer can be set to 0° C. to 50° C.

In the method for manufacturing a semiconductor device, when the gate insulating layer and/or the oxide semiconductor layer and/or the insulating layer are/is formed, an entrapment vacuum pump is preferably used for evacuating the first treatment chamber and/or the second treatment chamber and/or the third treatment chamber. For example, a cryopump, an ion pump, or a titanium sublimation pump is preferably used. The above entrapment vacuum pump functions so as to reduce the amount of hydrogen, water, hydroxyl, or hydride in the gate insulating layer and/or the oxide semiconductor layer and/or the insulating layer.

In the method for manufacturing a semiconductor device, a metal oxide containing zinc oxide as its main component can be used as the target for forming the oxide semiconductor layer. Alternatively, a metal oxide containing indium, gallium, and zinc can be used as the target.

In the method for manufacturing a semiconductor device, as the target containing silicon for forming the silicon oxide layer as the insulating layer, a silicon semiconductor target or a synthetic quartz target can be used.

With the above structures, at least one of the objects can be achieved.

The oxide semiconductor layer is a thin film of $InMO_3(ZnO)_m$ (m>0). This thin film is used as the oxide semiconductor layer to fabricate the thin film transistor. Note that M denotes one metal element or a plurality of metal elements selected from Ga, Fe, Ni, Mn, and Co. For example, M may be Ga or may include the above metal element in addition to Ga, for example, M may be Ga and Ni or Ga and Fe. Moreover, in the above oxide semiconductor, in some cases, a transition metal element such as Fe or Ni or an oxide of the transition metal is contained as an impurity element in addition to a metal element contained as M. In this specification, as for the oxide semiconductor layers whose composition formulae are represented by $InMO_3(ZnO)_m$ (m>0), an oxide semiconductor which includes Ga as M is referred to as an In—Ga—Zn—O-based oxide semiconductor, and a thin film thereof is referred to as an In—Ga—Zn—O-based non-single-crystal film.

As a metal oxide applied to the oxide semiconductor layer, any of the following metal oxides can be used besides the above: an In—Sn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, an In—Zn—O-based metal oxide, a Sn—Zn—O-based metal oxide, an Al—Zn—O-based metal oxide, an In—O-based metal oxide, a Sn—O-based metal oxide, and a Zn—O-based metal oxide. Silicon oxide may be contained in the oxide semiconductor layer formed using any of the above metal oxides.

Further, an oxide conductive layer may be formed between the oxide semiconductor layer and the source and drain electrodes. The oxide conductive layer and a metal layer for forming the source and drain electrodes can be formed in succession.

Since a thin film transistor is easily broken due to static electricity or the like, a protective circuit for protecting the thin film transistor for the pixel portion is preferably provided over the same substrate for a gate line or a source line. The protective circuit is preferably formed using a non-linear element including an oxide semiconductor layer.

Note that the ordinal numbers such as "first" and "second" in this specification are used for convenience and do not denote the order of steps and the stacking order of layers. In addition, the ordinal numbers in this specification do not denote particular names which specify the present invention.

A semiconductor device with stable electric characteristics in which an oxide semiconductor is used can be provided.

BRIEF DESCRIPTION OF DRAWINGS

FIGS. 9A to 9C illustrate semiconductor devices.

FIGS. 16A to 16C illustrates a semiconductor device.

FIG. 27A shows the state where a positive potential ($+V_G$) is applied to a gate (G1), and FIG. 27B shows the state where a negative potential ($-V_G$) is applied to the gate (G1).

BEST MODE FOR CARRYING OUT THE INVENTION

Figure 1A:
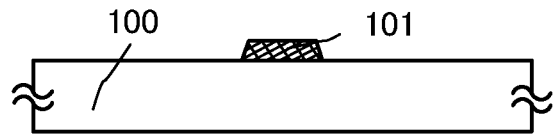
FIGS. 1A to 1F illustrate a semiconductor device and a method for manufacturing the semiconductor device.

Embodiments of the present invention will be hereinafter described in detail with reference to the accompanying drawings. Note that the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments below.

Embodiment 1

In this embodiment, one embodiment of a semiconductor device and a method for manufacturing the semiconductor device will be described with reference to FIGS. 1A to 1F. The semiconductor device described in this embodiment is a thin film transistor.

FIGS. 1A to 1F illustrate an example of a cross-sectional structure of a semiconductor device. A thin film transistor 110 illustrated in FIGS. 1A to 1F is a kind of bottom-gate structure and is also called an inverted staggered thin film transistor.

The thin film transistor 110 illustrated in FIGS. 1A to 1F includes a gate electrode layer 101, a gate insulating layer 131, a gate insulating layer 132, an oxide semiconductor layer 112, a source electrode layer 115a, and a drain electrode layer 115b over a substrate 100 having an insulating surface. In addition, an oxide insulating layer 116 which covers the thin film transistor 110 and is in contact with the oxide semiconductor layer 112 is provided, and a protective insulating layer 103 is stacked thereover.

In order to suppress variation in electric characteristics of the thin film transistor in which the oxide semiconductor layer is used, an impurity such as hydrogen, moisture, hydroxyl, or hydride (also referred to as a hydrogen compound) which is a factor of the variation is eliminated from the interface between the oxide semiconductor layer and the gate insulating layer provided in contact with the oxide semiconductor layer and/or the interface between the oxide semiconductor layer and the insulating layer provided in contact with the oxide semiconductor layer. Specifically, the interface between the oxide semiconductor layer and the insulating layer provided in contact with the oxide semiconductor layer has a hydrogen concentration of $5\times10^{19}$ atoms/cm$^3$ or lower, preferably $1\times10^{19}$ atoms/cm$^3$ or lower.

An impurity such as hydrogen or moisture (e.g., a hydrogen atom or a compound containing a hydrogen atom such as $H_2O$) is eliminated from the oxide semiconductor layer with use of a halogen element typified by fluorine or chlorine, so that the impurity concentration in the oxide semiconductor layer is reduced. In the case where the gate insulating layer and the insulating layer contain a halogen element, the concentration of the halogen element in the gate insulating layer and the insulating layer may be approximately $5\times10^{18}$ atoms/cm$^3$ to $1\times10^{20}$ atoms/cm$^3$.

The hydrogen concentration and the concentration of the halogen element are values obtained from the quantified results by secondary ion mass spectrometry (SIMS).

The gate insulating layer and the insulating layer which are provided in contact with the oxide semiconductor layer can be formed to contain a halogen element. In addition, a halogen element may be attached to the oxide semiconductor layer through plasma treatment under an atmosphere of a gas containing a halogen element. At least one of the above methods for making a halogen element be contained in a semiconductor device (making a halogen element be contained in the gate insulating layer during deposition, making a halogen element be contained in the insulating layer during deposition, and making a halogen element be attached to the interface between the insulating layer and the oxide semiconductor layer through plasma treatment) may be used, and needless to say, a plurality of the above methods may be used.

By at least one of the above methods, an impurity such as hydrogen, moisture, hydroxyl, or hydride included in the oxide semiconductor layer is diffused into the gate insulating layer and/or the insulating layer with use of a halogen element, so that the impurity concentration in the oxide semiconductor layer is reduced.

The effect of a halogen element on an impurity such as hydrogen was examined by calculation of bond energy. Fluorine (F) was used as the halogen element, and silicon oxide (SiO$_x$) was used as an insulating layer containing the halogen element.

Note that the density functional theory (DFT) using Gaussian basis was employed for the calculation. In the DFT, an exchange-correlation interaction is approximated by a functional (that is, a function of another function) of one electron potential represented in terms of electron density to enable high-speed and highly-accurate calculations. Here, B3LYP which is a hybrid functional was used to specify the weight of each parameter related to exchange-correlation energy. In addition, as a basis function, 6-311G (a basis function of a triple-split valence basis set using three contraction functions for each valence orbital) was applied to all the atoms. By the above basis functions, for example, orbits of 1s to 3s are considered in the case of hydrogen atoms while orbits of 1s to 4s and 2p to 4p are considered in the case of oxygen atoms. Furthermore, to improve calculation accuracy, the p function and the d function as polarization basis sets were added respectively to hydrogen atoms and atoms other than hydrogen atoms. Note that Gaussian 03 was used as a quantum chemistry computational program. A high performance computer (Altix 4700, manufactured by SGI Japan, Ltd.,) was used for the calculations.

Figure 30:
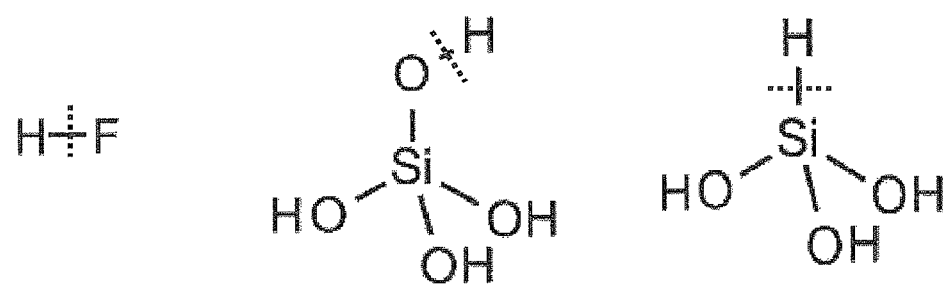
FIG. 30 is a schematic diagram of a calculation model.

Calculation was performed to examine which of fluorine, oxygen in silicon oxide (SiO$_2$), or silicon in SiO$_2$ is bonded to hydrogen in the case of migration of hydrogen into SiO$_2$ that is dotted with fluorine. Specifically, calculation was performed to examine which of fluorine, oxygen, or silicon is suitable for bonding with hydrogen in the case where hydrogen is present in SiO$_2$ to which fluorine is added. FIG. 30 is a schematic diagram of a calculation model. Table 1 shows the bond energy of H—F bond, H—O bond, and H—Si bond.

TABLE 1

| H—F | H—O | H—Si |
|---|---|---|
| 5.82 | 5.37 | 4.38 | unit: eV

As shown in Table 1, fluorine is more likely to be bonded to H than oxygen and silicon are. Therefore, with use of SiO$_x$ to which fluorine is added, migrating hydrogen due to heat treatment is bonded to fluorine in SiO$_x$ to be stabilized and be easily captured.

Since a halogen element typified by fluorine or chlorine has high electronegativity and the difference between the electronegativity of a halogen element and that of hydrogen which is an impurity is large, the bond force of ion bond between a halogen element and hydrogen is high.

Therefore, due to a halogen element contained in the gate insulating layer and/or the insulating layer, an impurity such as hydrogen or moisture (e.g., a hydrogen atom or a compound containing a hydrogen atom such as $H_2O$) in the oxide semiconductor layer can be effectively diffused into the gate insulating layer and/or the insulating layer, so that the impurity can be eliminated from the oxide semiconductor layer.

In this embodiment, an example in which a gate insulating layer contains a halogen element is employed; thus, the gate insulating layer 132 provided in contact with the oxide semiconductor layer 112 contains a halogen element.

Figure 25:
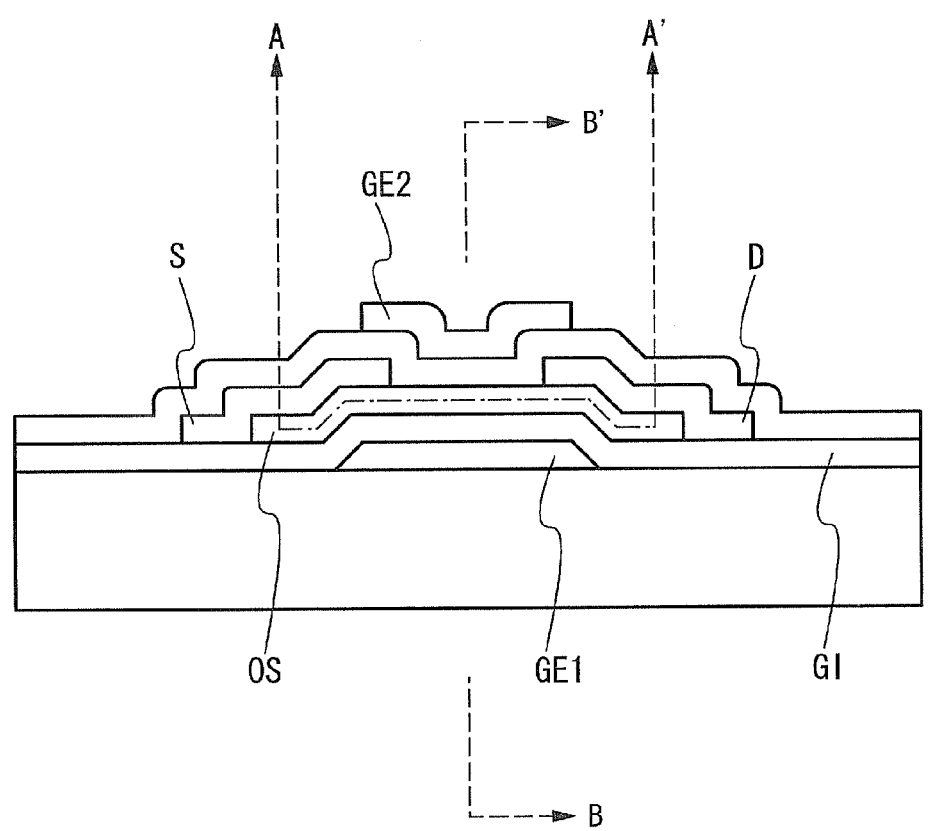
FIG. 25 is a longitudinal sectional view of an inverted staggered thin film transistor using an oxide semiconductor.

FIG. 25 is a longitudinal sectional view of an inverted staggered thin film transistor in which an oxide semiconductor is used. An oxide semiconductor layer (OS) is provided over a gate electrode (GE1) with a gate insulating film (GI) therebetween, and a source electrode (S) and a drain electrode (D) are provided thereover.

Figure 26A:
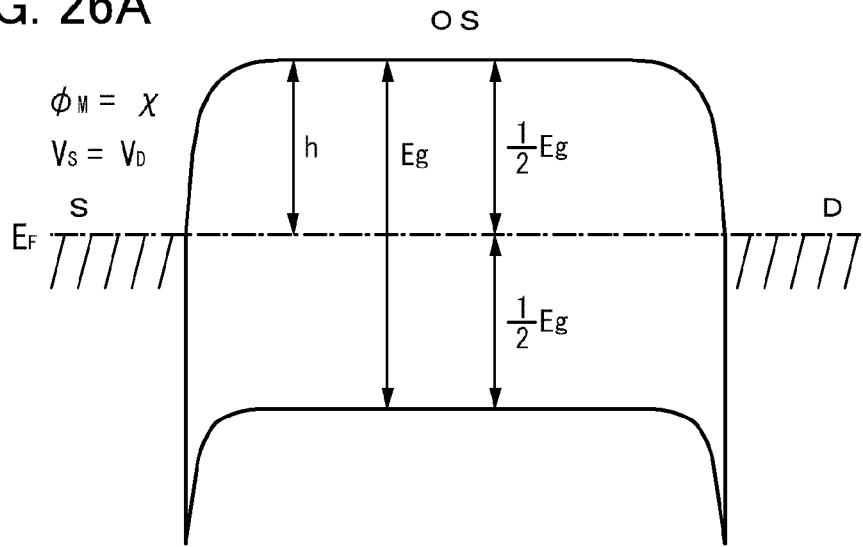
FIGS. 26A and 26B are energy band diagrams (schematic diagrams) of a cross section taken along line A-A' in FIG. 25.
Figure 26B:
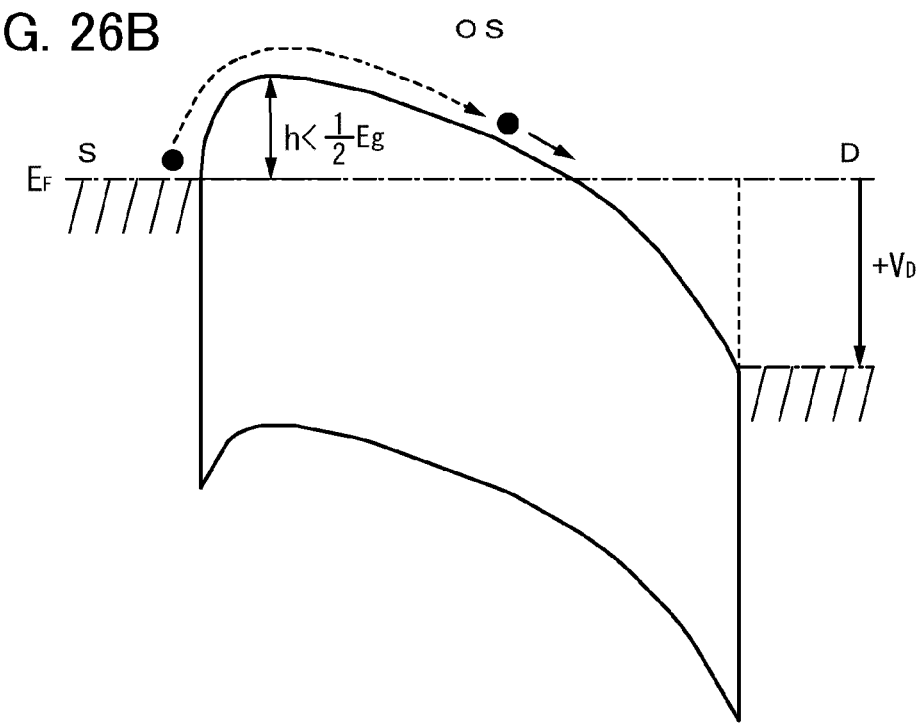

FIGS. 26A and 26B are energy band diagrams (schematic diagrams) of the layers of the thin film transistor in cross section along line A-A' in FIG. 25. FIG. 26A shows a case where the source and the drain have voltage of the same potential ($V_D=0$ V). FIG. 26B shows a case where positive potential is applied to the drain ($V_D>0$ V) whereas positive potential is not applied to the source.

FIGS. 27A and 27B are energy band diagrams (schematic diagrams) of the layers of the thin film transistor in cross section along line B-B' in FIG. 25. FIG. 27A shows a state where positive potential ($+V_G$) is applied to a gate (G1), that is, a case where the thin film transistor is in an on state where carriers (electrons) flow between the source and the drain. FIG. 27B shows a state where negative potential ($-V_G$) is applied to the gate (G1), that is, a case where the thin film transistor is in an off state (where minority carriers do not flow).

Figure 28:
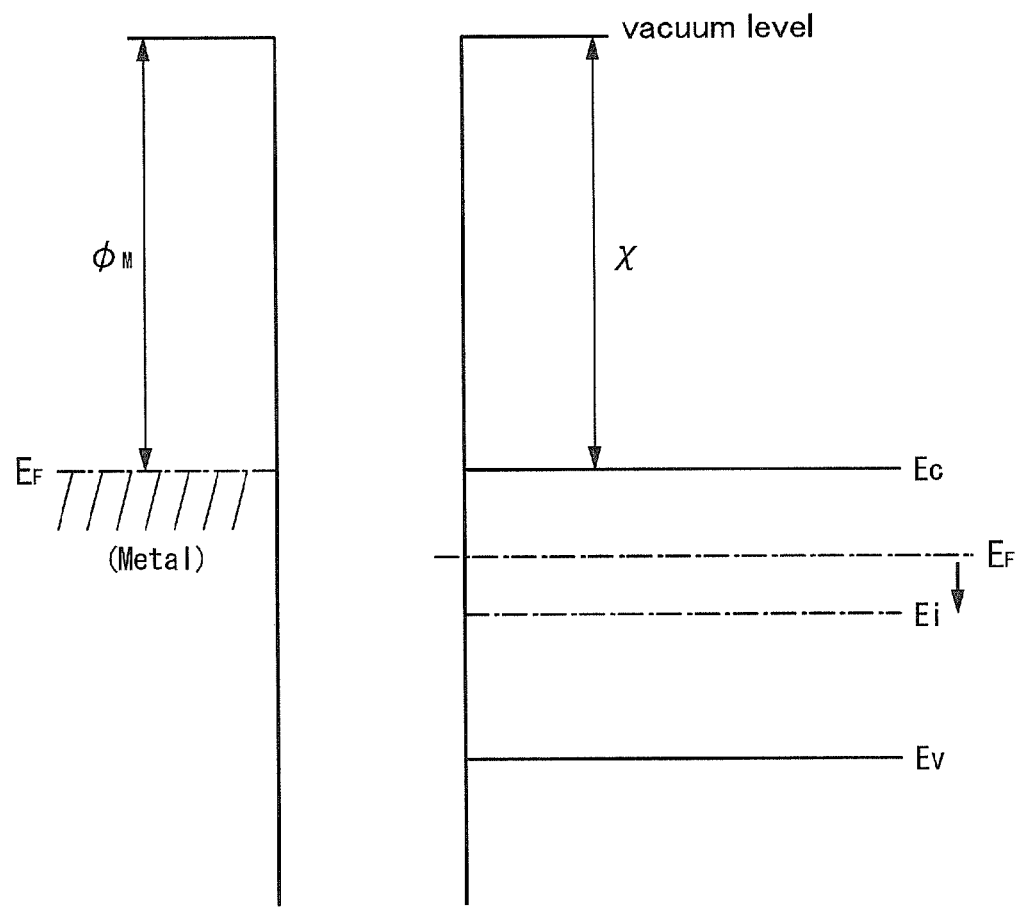
FIG. 28 shows relation between the vacuum level the work function of a metal ($\phi_M$) and relation between the vacuum level and the electron affinity of an oxide semiconductor ($\chi$).

FIG. 28 shows relation between the vacuum level and the work function of a metal ($\phi_M$) and relation between the vacuum level and the electron affinity of an oxide semiconductor ($\chi$).

Electrons in a metal are degenerated, and the Fermi level is located in the conduction band. A conventional oxide semiconductor is generally of n-type, and the Fermi level ($E_F$) in that case is positioned closer to the conduction band and is away from the intrinsic Fermi level ($E_i$) that is located in the middle of the band gap. Note that it is known that some hydrogen in the oxide semiconductor form a donor and might be a factor that causes an oxide semiconductor to be an n-type oxide semiconductor.

In contrast, the oxide semiconductor according to the present invention is an oxide semiconductor that is made to be an intrinsic (i-type) semiconductor or made to be as close to an intrinsic semiconductor as possible by being highly purified by removal of hydrogen that is an n-type impurity so that an impurity other than a main component of the oxide semiconductor is prevented from being contained therein as much as possible. In other words, the oxide semiconductor according to the present invention has a feature in that it is made to be an i-type (intrinsic) semiconductor or made to be close thereto not by addition of an impurity but by being highly purified by removal of an impurity such as hydrogen or water as much as possible. As a result, the Fermi level ($E_F$) can be at the same level as the intrinsic Fermi level ($E_i$).

It is said that the electron affinity ($\chi$) of an oxide semiconductor is 4.3 eV in the case where the band gap (Eg) thereof is 3.15 eV. The work function of titanium (Ti) used for forming the source and drain electrodes is substantially equal to the electron affinity ($\chi$) of the oxide semiconductor. In the case where titanium is used for the source and drain electrodes, the Schottky electron barrier is not formed at the interface between the metal and the oxide semiconductor.

In other words, an energy band diagram (a schematic diagram) like FIG. 26A is obtained in the case where a metal and an oxide semiconductor are in contact with each other when the work function of the metal ($\phi_M$) and the electron affinity of the oxide semiconductor ($\chi$) are substantially equal.

In FIG. 26B, a black circle (●) represents an electron. When positive potential is applied to the drain, the electrons cross a barrier (h) to be injected into the oxide semiconductor and flow toward the drain. In that case, the height of the barrier (h) changes depending on the gate voltage and the drain voltage. In the case where positive drain voltage is applied, the height of the barrier (h) is smaller than the height of the barrier (h) in FIG. 26A of the case where no voltage is applied; that is, the height of the barrier (h) is smaller than half of the band gap (Eg).

In this case, as shown in FIG. 27A, the electron moves along the lowest part of the oxide semiconductor, which is energetically stable, at the interface between the gate insulating film and the highly-purified oxide semiconductor.

In FIG. 27B, when negative potential (reverse bias) is applied to the gate (G1), the number of holes that are minority carriers is substantially zero; thus, the current value becomes a value extremely close to zero.

For example, even when the thin film transistor has a channel width W of $1\times10^4$ μm and a channel length of 3 μm, an off current of $10^{-13}$ A or lower and a subthreshold value (S value) of 0.1 V/dec. (the thickness of the gate insulating film: 100 nm) can be obtained.

In this manner, the oxide semiconductor contains an impurity other than the main component of the oxide semiconductor as few as possible to be highly purified, whereby the operation of the thin film transistor can be favorable.

The thin film transistor 110 is described using a single-gate thin film transistor; a multi-gate thin film transistor including a plurality of channel formation regions can be formed when needed.

A process for forming the thin film transistor 110 over the substrate 100 is described below with reference to FIGS. 1A to 1F.

First, a conductive film is formed over the substrate 100 having an insulating surface, and then, the gate electrode layer 101 is formed through a first photolithography step and an etching step (see FIG. 1A). It is preferable that an end portion of the formed gate electrode layer have a tapered shape because coverage with the gate insulating layer stacked thereover is improved. Note that a resist mask may be formed by an inkjet method. Formation of the resist mask by an inkjet method needs no photomask; thus, manufacturing cost can be reduced.

Although there is no particular limitation on a substrate which can be used as the substrate 100 having an insulating surface, it is necessary that the substrate have at least enough heat resistance to withstand heat treatment performed later. As the substrate 100 having an insulating surface, a glass substrate formed of barium borosilicate glass, aluminoborosilicate glass, or the like can be used.

As the glass substrate, the one whose strain point is 730° C. or higher may be used in the case where the temperature of the heat treatment to be performed later is high. As a material of the glass substrate, a glass material such as aluminosilicate glass, aluminoborosilicate glass, or barium borosilicate glass is used. Note that by containing a larger amount of barium oxide (BaO) than boric acid, a glass substrate is heat-resistant and of more practical use. Therefore, it is preferable that a glass substrate containing more BaO than $B_2O_3$ be used.

Note that a substrate formed of an insulator such as a ceramic substrate, a quartz substrate, or a sapphire substrate may be used instead of the above glass substrate. Alternatively, crystallized glass or the like may be used. Further alternatively, a plastic substrate or the like can be used as appropriate.

An insulating film serving as a base film may be provided between the substrate 100 and the gate electrode layer 101. The base film has a function of preventing diffusion of an impurity element from the substrate 100, and can be formed to have a single-layer or stacked-layer structure of a silicon nitride film, a silicon oxide film, a silicon nitride oxide film, or a silicon oxynitride film.

The gate electrode layer 101 can be formed to have a single-layer or stacked-layer structure using a metal material such as molybdenum, titanium, chromium, tantalum, tungsten, aluminum, copper, neodymium, or scandium, or an alloy material which contains any of these materials as its main component.

For example, as a two-layer structure of the gate electrode layer 101, the following structures are preferable: a two-layer structure of an aluminum layer and a molybdenum layer stacked thereover, a two-layer structure of a copper layer and a titanium nitride layer or a tantalum nitride layer stacked thereover, and a two-layer structure of a titanium nitride layer and a molybdenum layer. Alternatively, a three-layer structure of a tungsten layer or a tungsten nitride layer, an aluminum-silicon alloy layer or an aluminum-titanium alloy layer, and a titanium nitride layer or a titanium layer, or a three-layer structure of a molybdenum layer, an aluminum layer, and a molybdenum layer can be used. Note that the gate electrode layer can also be formed using a light-transmitting conductive film. As a light-transmitting conductive film, a light-transmitting conductive oxide film or the like can be given.

Next, a gate insulating layer is formed over the gate electrode layer 101. In this embodiment, the gate insulating layer contains a halogen element. In the case where the gate insulating layer has a stacked-layer structure, at least a gate insulating layer in contact with the oxide semiconductor layer contains a halogen element.

The gate insulating layer can be formed to have a single-layer or stacked-layer structure using a silicon oxide layer, a silicon nitride layer, a silicon oxynitride layer, a silicon nitride oxide layer, or an aluminum oxide layer by a plasma CVD method, a sputtering method, or the like. In the case where a silicon oxide layer is formed by a sputtering method, a silicon target or a quartz target is used as a target, and oxygen or a mixed gas of oxygen and argon is used as a sputtering gas.

Here, the oxide semiconductor that is made to be an intrinsic oxide semiconductor or a substantially intrinsic oxide semiconductor (the oxide semiconductor that is highly purified) by removal of an impurity is extremely sensitive to an interface state and an interface electric charge; thus, the interface between the oxide semiconductor and the gate insulating layer is important. Therefore, the gate insulating layer (GI) that is in contact with the highly-purified oxide semiconductor needs to have higher quality.

For example, high-density plasma CVD using a microwave (2.45 GHz) is preferably used, in which case an insulating layer which is dense, has high withstand voltage, and has high quality can be formed. The highly-purified oxide semiconductor and the high-quality gate insulating layer are in close contact with each other, whereby the interface state density can be reduced to obtain favorable interface characteristics.

Needless to say, another film formation method such as a sputtering method or a plasma CVD method can be employed as long as the method enables formation of a good-quality insulating layer as a gate insulating layer. Further, an insulating layer whose film quality and characteristic of the interface between the insulating layer and an oxide semiconductor are improved by heat treatment which is performed after formation of the insulating layer may be formed as a gate insulating layer. In any case, any insulating layer may be used as long as the insulating layer has characteristics of enabling reduction in interface state density of the interface between the insulating layer and an oxide semiconductor and formation of a favorable interface as well as having favorable film quality as a gate insulating layer.

Further, when an oxide semiconductor containing an impurity is subjected to a gate bias-temperature stress test (BT test) for 12 hours under conditions that the temperature is 85° C. and the voltage applied to the gate is $2\times10^6$ V/cm, a bond between the impurity and a main component of the oxide semiconductor is cleaved by a high electric field (B: bias) and a high temperature (T: temperature), and a generated dangling bond induces drift of threshold voltage ($V_{th}$).

In contrast, the invention disclosed in this specification makes it possible to obtain a thin film transistor which is stable to a BT test by removal of an impurity in an oxide semiconductor, especially hydrogen, water, or the like as much as possible to obtain a favorable characteristic of the interface between the oxide semiconductor film and a gate insulating layer as described above.

Figure 1B:
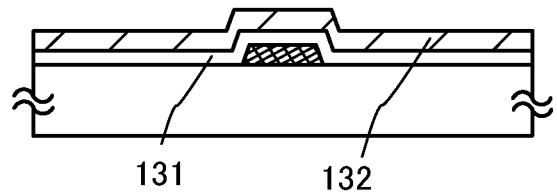

In this embodiment, the gate insulating layer is formed to have a structure in which the gate insulating layer 131 and the gate insulating layer 132 are stacked in this order over the gate electrode layer 101 (see FIG. 1B). As a stacked structure of the gate insulating layer, a structure in which a silicon nitride layer and a silicon oxide layer are stacked over the gate electrode layer 101 can be employed. The gate insulating layer with a thickness of 100 nm has a structure in which a silicon nitride layer ($SiN_y$ (y>0)) with a thickness of greater than or equal to 50 nm and less than or equal to 200 nm is formed as the gate insulating layer 131 by a sputtering method and a silicon oxide layer ($SiO_x$ (x>0)) containing a halogen element with a thickness of greater than or equal to 5 nm and less than or equal to 300 nm is formed as the gate insulating layer 132 over the gate insulating layer 131.

A halogen element may be introduced into a deposition gas (a sputtering gas) during deposition so as to be contained in the gate insulating layer. Alternatively, a halogen element remaining in a treatment chamber due to cleaning treatment in the previous step may be contained in the gate insulating layer. Further alternatively, a halogen element may be added to the gate insulating layer after deposition.

As a deposition gas (a sputtering gas) containing a halogen element which is introduced during deposition, $NF_3$ or the like can be used. With use of a gas containing a halogen element such as $NF_3$ described above for cleaning treatment on a treatment chamber for deposition, the gate insulating layer can be formed to contain a halogen element such as fluorine remaining in the treatment chamber. By addition of a halogen element to the gate insulating layer during deposition as described above, the gate insulating layer containing a halogen element can be formed without increase in the number of steps.

As a gas containing a halogen element, a gas containing fluorine (a fluorine-based gas such as tetrafluoride ($CF_4$), sulfur fluoride ($SF_6$), nitrogen fluoride ($NF_3$), or trifluoromethane ($CHF_3$)), a gas containing chlorine (a chlorine-based gas such as chlorine ($Cl_2$), boron chloride ($BCl_3$), silicon chloride ($SiCl_4$), or carbon tetrachloride ($CCl_4$)), or the like can be used as appropriate.

As a deposition gas (including a gas containing a halogen element) used for deposition of the gate insulating layer, a high-purity gas is preferably used, in which an impurity such as hydrogen, water, hydroxyl, or hydride is reduced to such a degree that the impurity concentration level is represented by the unit "ppm" or "ppb".

It is preferable that hydrogen, hydroxyl, and moisture be contained in the gate insulating layer 131 and the gate insulating layer 132 as little as possible; therefore, the substrate 100 over which the gate electrode layer 101 is formed is preferably heated at 200° C. or higher in a preheating chamber of a sputtering apparatus as pretreatment for deposition, so that an impurity attached to the substrate 100 can be removed.

Then, an oxide semiconductor film is formed to a thickness of greater than or equal to 2 nm and less than or equal to 200 nm over the gate insulating layer 131 and the gate insulating layer 132.

Note that before the oxide semiconductor film is formed by a sputtering method, dust on a surface of the gate insulating layer 132 is preferably removed by reverse sputtering in which an argon gas is introduced and plasma is generated. The reverse sputtering refers to a method in which, without application of voltage to a target side, an RF power source is used for application of voltage to a substrate side in an argon atmosphere to generate plasma in the vicinity of the substrate to modify a surface. Note that instead of an argon atmosphere, a nitrogen atmosphere, a helium atmosphere, an oxygen atmosphere, or the like may be used.

The oxide semiconductor film is formed by a sputtering method. The oxide semiconductor film is formed using an In—Ga—Zn—O-based non-single-crystal film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, a Sn—O-based oxide semiconductor film, or a Zn—O-based oxide semiconductor film. In this embodiment, the oxide semiconductor film is formed using an In—Ga—Zn—O-based oxide semiconductor target by a sputtering method. The oxide semiconductor film can be formed using a rare gas (typically, argon), oxygen, or a rare gas (typically, argon) and oxygen as a sputtering gas under an atmosphere including the sputtering gas by a sputtering method. In the case where a sputtering method is employed, deposition may be performed with a target containing $SiO_2$ at greater than or equal to 2 wt % and less than or equal to 10 wt %.

As a sputtering gas used for deposition of the oxide semiconductor film, a high-purity gas is preferably used, in which an impurity such as hydrogen, water, hydroxyl, or hydride is reduced to such a degree that the impurity concentration level is represented by the unit "ppm" or "ppb".

As a target for forming the oxide semiconductor film by a sputtering method, a metal oxide target containing zinc oxide as its main component can be used. As another example of a metal oxide target, an oxide semiconductor target containing In, Ga, and Zn (in a composition ratio, $In_2O_3:Ga_2O_3:ZnO=1:1:1$ [molar ratio], In:Ga:Zn=1:1:0.5 [atomic ratio]) can be used. In addition, as the oxide semiconductor target containing In, Ga, and Zn, a target having a composition ratio of In:Ga:Zn=1:1:1 [atomic ratio] or In:Ga:Zn=1:1:2 [atomic ratio] can be used. The fill rate of the oxide semiconductor target is greater than or equal to 90% and less than or equal to 100%, preferably, greater than or equal to 95% and less than or equal to 99.9%. With the use of the oxide semiconductor target with high fill rate, a dense oxide semiconductor film is formed.

The substrate is held in a treatment chamber which is kept in a reduced-pressure state, and the substrate is heated at lower than 400° C. Then, a sputtering gas from which hydrogen and moisture are removed is introduced into the treatment chamber from which remaining moisture is being removed, and an oxide semiconductor film is deposited over the substrate 100 with use of a metal oxide as a target. In order to remove remaining moisture in the treatment chamber, an entrapment vacuum pump is preferably used. For example, a cryopump, an ion pump, or a titanium sublimation pump is preferably used. The evacuation unit may be a turbo molecular pump provided with a cold trap. In the deposition chamber which is evacuated with the cryopump, a hydrogen atom, a compound containing a hydrogen atom such as $H_2O$, a compound containing a carbon atom, and the like are removed, whereby the impurity concentration in the oxide semiconductor film formed in the deposition chamber can be reduced.

As one example of the deposition condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulse direct-current (DC) power source is preferable because dust can be reduced and the film thickness can be uniform. The thickness of the oxide semiconductor film is preferably greater than or equal to 5 nm and less than or equal to 30 nm Note that an appropriate thickness differs depending on an oxide semiconductor material, and the thickness may be set as appropriate depending on the material.

By formation of the oxide semiconductor film by a sputtering method as described above, an oxide semiconductor film whose quantitative result of the hydrogen concentration measured by secondary ion mass spectrometry (SIMS) is reduced to $5\times10^{19}$ atoms/cm$^3$ or less, preferably $1\times10^{19}$ atoms/cm$^3$ or less (more preferably $5\times10^{18}$ atoms/cm$^3$ or less) can be obtained.

The oxide semiconductor film is formed under a sputtering condition where the film is not damaged during deposition. In addition, when the substrate temperature at deposition is set to lower than 400° C., change in quality of the oxide semiconductor film (for example, in the case of an In—Ga—Zn—O-based non-single-crystal film, ZnO is separated out of the film) which is caused by heat treatment at high temperature can be prevented.

Examples of a sputtering method include an RF sputtering method in which a high-frequency power source is used for a sputtering power source, a DC sputtering method, and a pulsed DC sputtering method in which a bias is applied in a pulsed manner. An RF sputtering method is mainly used in the case of forming an insulating film, and a DC sputtering method is mainly used in the case of forming a metal film.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are also a sputtering apparatus provided with a magnet system inside the chamber and used for a magnetron sputtering method, and a sputtering apparatus used for an ECR sputtering method in which plasma generated with the use of microwaves is used without using glow discharge.

In addition, as a film formation method using a sputtering method, there are also a reactive sputtering method in which a target substance and a sputtering gas component are chemically reacted with each other during film formation to form a thin film of a compound thereof, and a bias sputtering method in which voltage is also applied to a substrate during film formation.

Figure 1C:
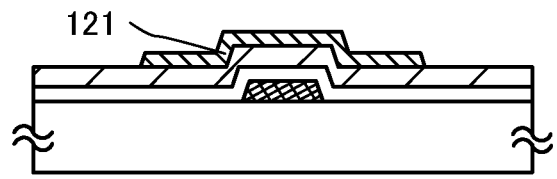
Figure 1D:
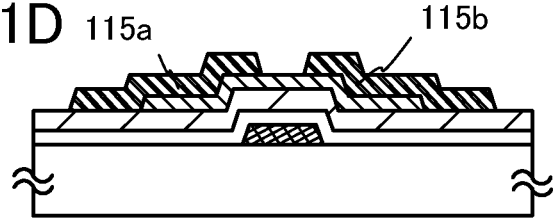

Then, the oxide semiconductor film is processed into an island-shaped oxide semiconductor layer 121 by a second photolithography step and an etching step (see FIG. 1C). A resist mask used for forming the island-shaped oxide semiconductor layer 121 may be formed by an inkjet method. Formation of the resist mask by an inkjet method needs no photomask; thus, manufacturing cost can be reduced.

In the case where a contact hole is formed in the gate insulating layer 132, the step can be formed at the time of formation of the oxide semiconductor layer 121.

Note that the etching of the oxide semiconductor film may be dry etching, wet etching, or both dry etching and wet etching.

As an etching gas used for dry etching, a gas containing chlorine (a chlorine-based gas such as chlorine ($Cl_2$), boron chloride ($BCl_3$), tetrasilicon chloride ($SiCl_4$), or tetracarbon tetrachloride ($CCl_4$)) is preferably used.

Alternatively, a gas containing fluorine (a fluorine-based gas such as carbon tetrafluoride ($CF_4$), sulfur fluoride ($SF_6$), nitrogen fluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate RIE (reactive ion etching) method or an ICP (inductively coupled plasma) etching method can be used. In order to etch the films into desired shapes, the etching conditions (the amount of electric power applied to a coil-shaped electrode, the amount of electric power applied to an electrode on a substrate side, the temperature of the electrode on the substrate side, or the like) are adjusted as appropriate.

As an etchant used for wet etching, a solution obtained by mixing phosphoric acid, acetic acid, and nitric acid, an ammonia peroxide mixture (hydrogen peroxide water at 31 wt %:ammonia water at 28 wt %:water=5:2:2), or the like can be used. In addition, ITO-07N (produced by KANTO CHEMICAL CO., INC.) may also be used.

The etchant used in the wet etching is removed by cleaning together with the material which is etched off. Waste liquid of the etchant containing the removed material may be purified and the material contained in the waste liquid may be reused. When a material such as indium contained in the oxide semiconductor layer is collected from the waste liquid after the etching and is reused, the resources can be efficiently used and the cost can be reduced.

In order to etch the film into a desired shape, etching conditions (e.g., etchant, etching time, temperature, or the like) are controlled as appropriate depending on the material.

Note that reverse sputtering is preferably performed before formation of a conductive film in a subsequent step, so that a resist residue attached to surfaces of the oxide semiconductor layer 121 and the gate insulating layer 132 is removed.

Then, a conductive film is formed over the gate insulating layer 132 and the oxide semiconductor layer 121. The conductive film may be formed by a sputtering method or a vacuum evaporation method. As a material of the conductive film, an element selected from Al, Cr, Cu, Ta, Ti, Mo, or W; an alloy containing any of these elements as a component; an alloy film containing any of these elements in combination; and the like can be given. Alternatively, one or more materials selected from manganese, magnesium, zirconium, beryllium, and thorium may be used. Further, the metal conductive film may have a single-layer structure or a stacked-layer structure of two or more layers. For example, a single-layer structure of an aluminum film containing silicon; a two-layer structure of an aluminum film and a titanium film stacked thereover; a three-layer structure of a Ti film, an aluminum film stacked thereover, and a Ti film stacked thereover; and the like can be given. Alternatively, a film containing aluminum and one or more elements selected from titanium (Ti), tantalum (Ta), tungsten (W), molybdenum (Mo), chromium (Cr), neodymium (Nd), or scandium (Sc), an alloy film containing any of these elements, or a nitride film containing any of these elements may be used.

A third photolithography step is performed. A resist mask is formed over the conductive film, and selective etching is performed, so that the source electrode layer 115a and the drain electrode layer 115b are formed; after that, the resist mask is removed (see FIG. 1D).

Materials of the layers and etching conditions are adjusted as appropriate so that the oxide semiconductor layer 121 is not removed in etching of the conductive film.

In this embodiment, a Ti film is used as the conductive film; an In—Ga—Zn—O-based oxide is used for the oxide semiconductor layer 121; and an ammonia hydrogen peroxide solution (a mixed solution of ammonia, water, and a hydrogen peroxide solution) is used as an etchant.

Note that, in the etching step after the third photolithography step, only part of the oxide semiconductor layer 121 is etched, whereby an oxide semiconductor layer having a groove (a depressed portion) is formed in some cases. Further, the resist mask for forming the source electrode layer 115a and the drain electrode layer 115b may be formed by an inkjet method. Formation of the resist mask by an inkjet method needs no photomask; thus, manufacturing cost can be reduced.

In order to reduce the number of photomasks and steps in a photolithography step, etching may be performed with the use of a resist mask formed using a multi-tone mask which is a light-exposure mask through which light is transmitted so as to have a plurality of intensities. Since a resist mask formed using a multi-tone mask has a plurality of thicknesses and can be further changed in shape by performing etching, the resist mask can be used in a plurality of etching steps to provide different patterns. Therefore, a resist mask corresponding to at least two kinds of different patterns can be formed with one multi-tone mask. Thus, the number of light-exposure masks can be reduced and the number of corresponding photolithography steps can be also reduced, whereby simplification of a process can be realized.

With plasma treatment with a gas such as $N_2O$, $N_2$, or Ar, water adsorbed to a surface of an exposed portion of the oxide semiconductor layer may be removed. In addition, plasma treatment may be performed using a mixed gas of oxygen and argon.

In the case where the plasma treatment is performed, the oxide insulating layer 116 is formed without exposure to air as an oxide insulating layer which serves as a protective insulating film in contact with part of the oxide semiconductor layer. In this embodiment, in a region where the oxide semiconductor layer 121 overlaps with neither the source electrode layer 115a nor the drain electrode layer 115b, the oxide semiconductor layer 121 and the oxide insulating layer 116 are in contact with each other (see FIG. 1E).

As the oxide insulating layer 116, a silicon oxide layer is formed in the following manner: the substrate 100 over which layers up to the island-shaped oxide semiconductor layer 121, the source electrode layer 115a, and the drain electrode layer 115b are formed is heated at lower than 100° C.; a sputtering gas containing high-purity oxygen from which hydrogen and moisture are removed is introduced; and a silicon semiconductor target is used. Note that the oxide insulating layer 116 is preferably formed to be a silicon oxide layer containing defects.

As a sputtering gas used for deposition of the oxide insulating layer 116, a high-purity gas is preferably used, in which an impurity such as hydrogen, water, hydroxyl, or hydride is reduced to such a degree that the impurity concentration level is represented by the unit "ppm" or "ppb".

For example, a silicon oxide layer is formed by a pulse DC sputtering method under the following condition: a boron-doped silicon target having a purity of 6N (99.9999%) (resistivity: 0.01 Ωcm) is used; the distance between the target and the substrate (the T-S distance) is 89 mm; the pressure is 0.4 Pa; the direct-current (DC) power source is 6 kW; and the atmosphere is an oxygen atmosphere (the proportion of the oxygen flow rate is 100%). The film thickness is 300 nm Note that instead of a silicon target, quartz (preferably, synthetic quartz) can be used as the target for forming the silicon oxide layer. Note that oxygen or a mixed gas of oxygen and argon is used as a sputtering gas.

In that case, remaining moisture in the treatment chamber is preferably removed in the deposition of the oxide insulating layer 116. This is for preventing hydrogen, hydroxyl, or moisture from being contained in the oxide semiconductor layer 121 and the oxide insulating layer 116.

Note that as the oxide insulating layer 116, a silicon oxynitride layer, an aluminum oxide layer, an aluminum oxynitride layer, or the like may be used instead of the silicon oxide layer.

Next, heat treatment is performed at 100° C. to 400° C. in the state where the oxide semiconductor layer 121 and the gate insulating layer 132 which is an oxide insulating layer containing a halogen element are in contact with each other. By this heat treatment, hydrogen or moisture included in the oxide semiconductor layer 121 can be diffused into the gate insulating layer 132 which is an oxide insulating layer containing a halogen element. Since the gate insulating layer 132 contains a halogen element, an impurity such as hydrogen, hydroxyl, or moisture included in the island-shaped oxide semiconductor layer 121 is diffused into the gate insulating layer 132 through the interface between the oxide semiconductor layer 121 and the gate insulating layer 132. Specifically, a hydrogen atom, a compound containing a hydrogen atom such as $H_2O$, or a compound containing a carbon atom in the oxide semiconductor layer 121 is easily diffused into the gate insulating layer 132.

The oxide insulating layer 116 preferably contains excessive oxygen and includes a large number of defects typified by dangling bonds. The oxide insulating layer 116 including a large number of defects has higher binding energy mainly with respect to hydrogen, so that diffusion of an impurity from the oxide semiconductor layer to the oxide semiconductor layer 116 is promoted and the impurity can be stabilized in the oxide insulating layer 116.

Through the above steps, an impurity such as hydrogen or moisture is eliminated, and the concentration of the impurity such as hydrogen or moisture is reduced as much as possible, whereby generation of parasitic channel on the back channel side, i.e., in a superficial portion of the oxide semiconductor layer can be suppressed.

Figure 1E:
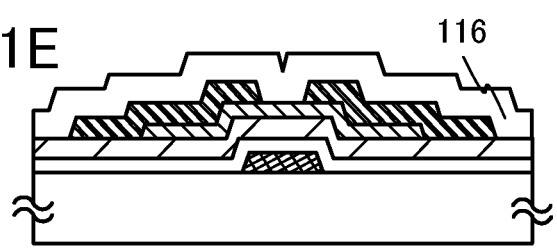
Figure 1F:
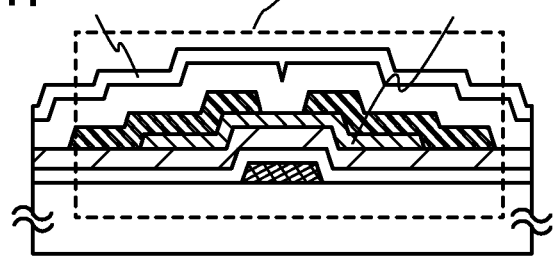

Therefore, the thin film transistor 110 including the oxide semiconductor layer 112 in which the concentration of hydrogen and hydride is reduced can be manufactured (see FIG. 1F).

When the oxide semiconductor film is formed in the above manner, remaining moisture in a reaction atmosphere is removed; thus, the concentration of hydrogen and hydride in the oxide semiconductor film can be reduced. Thus, the oxide semiconductor film can be stabilized.

A protective insulating layer may be formed over the oxide insulating layer. In this embodiment, the protective insulating layer 103 is formed over the oxide insulating layer 116. As the protective insulating layer 103, a silicon nitride film, a silicon nitride oxide film, an aluminum nitride film, or the like is used.

As the protective insulating layer 103, a silicon nitride film is formed by heating the substrate 100 over which layers up to the oxide insulating layer 116 are formed, to a temperature of 100° C. to 400° C., introducing a sputtering gas containing high-purity nitrogen from which hydrogen and moisture are removed, and using a target of a silicon semiconductor. In this case also, it is preferable that remaining moisture in the treatment chamber be removed in the formation of the protective insulating layer 103 in a manner similar to that of the oxide insulating layer 116.

In the case of forming the protective insulating layer 103, the substrate 100 is heated to a temperature of 100° C. to 400° C. at the time of deposition of the protective insulating layer 103, whereby hydrogen or moisture included in the oxide semiconductor layer can be diffused into the gate insulating layer containing a halogen element. In such a case, heat treatment after the formation of the oxide insulating layer 116 is unnecessary.

In the case where the oxide insulating layer 116 and a silicon nitride layer as the protective insulating layer 103 are stacked, the silicon oxide layer and the silicon nitride layer can be formed in the same treatment chamber using a common silicon target. First, a sputtering gas containing oxygen is introduced and the silicon oxide layer is formed using a silicon target placed inside the treatment chamber, and then the sputtering gas is changed to a sputtering gas containing nitrogen and the silicon nitride layer is formed using the same silicon target. Since the silicon oxide layer and the silicon nitride layer can be formed in succession without exposure to air, an impurity such as hydrogen or moisture can be prevented from being adsorbed on the surface of the silicon oxide layer. In this case, after the oxide insulating layer 116 and the silicon nitride layer as the protective insulating layer 103 are stacked, heat treatment (at a temperature of 100° C. to 400° C.) for diffusing hydrogen or moisture included in the oxide semiconductor layer into the gate insulating layer containing a halogen element may be performed.

After the protective insulating layer is formed, heat treatment may be further performed at higher than or equal to 100° C. and lower than or equal to 200° C. for one hour to 30 hours in an air atmosphere. This heat treatment may be performed at a fixed heating temperature; alternatively, the following change in the heating temperature may be conducted plural times repeatedly: the heating temperature is increased from room temperature to a temperature higher than or equal to 100° C. and lower than or equal to 200° C. and then decreased to room temperature. Further, this heat treatment may be performed before formation of the oxide insulating film under a reduced pressure. Under the reduced pressure, the heat treatment time can be shortened. With this heat treatment, a normally-off thin film transistor can be obtained. Therefore, reliability of the semiconductor device can be improved.

When the silicon nitride layer is formed in the state where the substrate is heated, hydrogen or moisture can be diffused from the oxide semiconductor layer to the gate insulating layer containing a halogen element, and at the same time, the barrier film which prevents entry of moisture from the outside air can be provided.

When the oxide semiconductor layer serving as the channel formation region is formed over the gate insulating layer, remaining moisture in a reaction atmosphere is removed; thus, the concentration of hydrogen and hydride in the oxide semiconductor layer can be reduced. By provision of the gate insulating layer containing a halogen element in contact with the oxide semiconductor layer, hydrogen or moisture in the oxide semiconductor layer can be diffused into the silicon oxide film, so that the concentration of hydrogen and hydride in the oxide semiconductor layer can be reduced.

Figure 23:
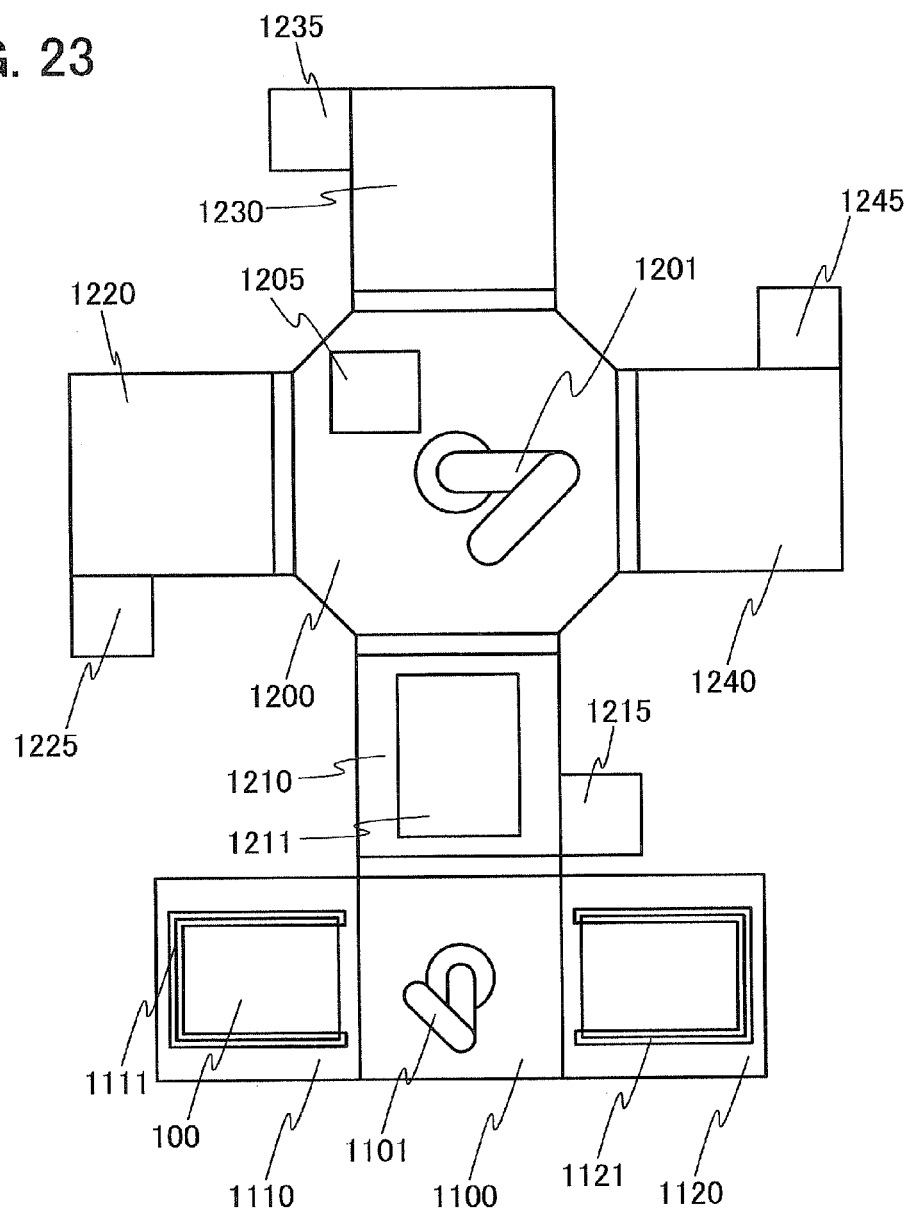
FIG. 23 illustrates an example of a deposition apparatus.

FIG. 23 illustrates an example of a deposition apparatus 1000 that can be used for forming an oxide semiconductor film and for manufacturing a semiconductor device in which an oxide semiconductor film is used.

The deposition apparatus 1000 includes a load chamber 1110 and an unload chamber 1120. The load chamber 1110 and the unload chamber 1120 are respectively provided with a cassette 1111 which stores a substrate before treatment and a cassette 1121 which stores a substrate after treatment. A first transfer chamber 1100 is provided between the load chamber 1110 and the unload chamber 1120, and is provided with a transfer unit 1101 which transfers a substrate.

The deposition apparatus 1000 is provided with a second transfer chamber 1200. The second transfer chamber 1200 is provided with a transfer unit 1201. Four treatment chambers (a first treatment chamber 1210, a second treatment chamber 1220, a third treatment chamber 1230, and a fourth treatment chamber 1240) are connected to the second transfer chamber 1200 through gate valves, and are arranged around the second transfer chamber 1200. Note that one side of the first treatment chamber 1210 is connected to the first transfer chamber 1100 through a gate valve, and the other side of the first treatment chamber 1210 is connected to the second transfer chamber 1200 through a gate valve.

The second transfer chamber 1200, the first treatment chamber 1210, the second treatment chamber 1220, the third treatment chamber 1230, and the fourth treatment chamber 1240 are respectively provided with an evacuation unit 1205, an evacuation unit 1215, an evacuation unit 1225, an evacuation unit 1235, and an evacuation unit 1245. Although the evacuation unit may be selected in accordance with the use application of each treatment chamber, an evacuation unit such as a cryopump is particularly preferable. Alternatively, as the evacuation unit, a turbo molecular pump provided with a cold trap may be used.

In the case where the oxide semiconductor film is formed, an evacuation unit such as a cryopump is preferably used in order to prevent incorporation of remaining moisture as an impurity in the treatment chambers (needless to say, including the treatment chamber for forming the oxide semiconductor film) in steps before and after formation of films in contact with the oxide semiconductor film and steps before and after formation of the oxide semiconductor film.

A substrate-heating unit 1211 is provided in the first treatment chamber 1210. The first treatment chamber 1210 serves as a delivery chamber for transferring a substrate from the first transfer chamber 1100 in an atmospheric-pressure state into the second transfer chamber 1200 in a reduced-pressure state. By provision of the delivery chamber, the second transfer chamber 1200 can be prevented from being contaminated by air.

The second treatment chamber 1220, the third treatment chamber 1230, and the fourth treatment chamber 1240 are provided with a structure for forming a silicon nitride film by a sputtering method, a structure for forming a silicon oxide film by a sputtering method, and a structure for forming an oxide semiconductor film by a sputtering method, respectively. That is, a target and a substrate-heating unit are provided in each of the treatment chambers, and the treatment chambers are each provided with a gas supply unit for introducing a sputtering gas and a glow discharge generation unit.

Next, an example of operation of the deposition apparatus 1000 is described. Here, a method for successively forming a gate insulating layer and an oxide semiconductor layer over a substrate over which the gate electrode layer 101 is formed is described.

The transfer unit 1101 transfers the substrate 100 over which the gate electrode layer 101 is formed to the first treatment chamber 1210 from the cassette 1111. Next, the substrate 100 is preheated in the first treatment chamber 1210 with the gate valve closed, whereby an impurity attached to the substrate is eliminated and evacuated. The impurity, for example, includes a hydrogen atom, a compound containing a hydrogen atom such as $H_2O$, a compound containing a carbon atom, or the like.

Next, the substrate 100 is transferred to the second treatment chamber 1220, and a silicon nitride layer is formed. Then, the substrate 100 is transferred to the third treatment chamber 1230, and a silicon oxide layer containing a halogen element is formed. In such a manner, the gate insulating layers 131 and 132 are formed. The second treatment chamber 1220 and the third treatment chamber 1230 are preferably evacuated by a cryopump or the like so that the impurity concentration in the treatment chambers can be reduced. The silicon nitride film and the silicon oxide film stacked in the treatment chambers in which the impurity concentration is reduced are used as the gate insulating layers 131 and 132 in which hydrogen, hydroxyl, moisture, or the like is reduced.

During deposition, a gas containing a halogen element is introduced into the third treatment chamber 1230, whereby the gate insulating layer 132 can contain a halogen element. Alternatively, the gate insulating layer 132 may contain a halogen element in the following manner: the third treatment chamber 1230 for forming the gate insulating layer 132 is subjected to cleaning treatment with use of a gas containing a halogen element; the substrate 100 is transferred to the third treatment chamber 1230 in which a halogen element remains; and the gate insulating layer 132 is formed to contain the remaining halogen element.

After that, the substrate 100 is transferred to the fourth treatment chamber 1240. A target for an oxide semiconductor is provided in the fourth treatment chamber 1240, and the fourth treatment chamber 1240 is provided with a cryopump as an evacuation unit. In the fourth treatment chamber 1240, an oxide semiconductor layer is formed.

Figure 22:
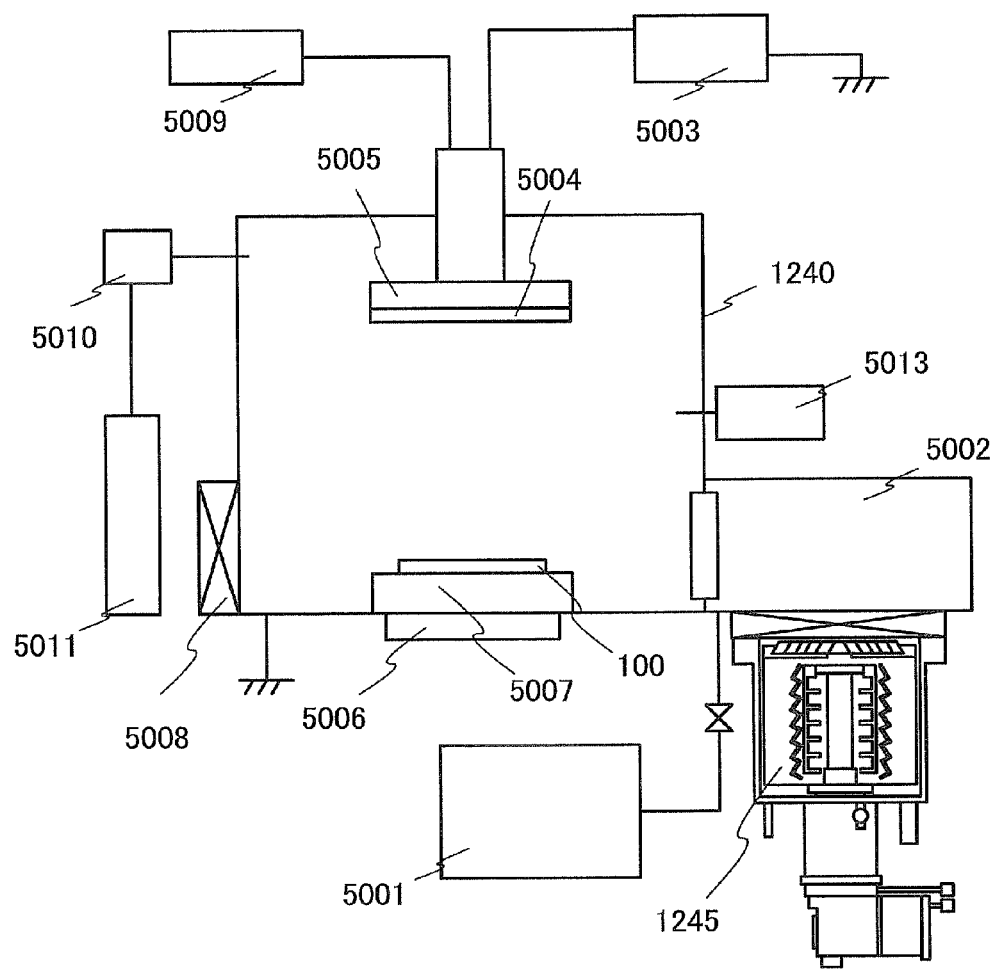
FIG. 22 illustrates an example of a deposition apparatus.

A method for forming the oxide semiconductor film in the fourth treatment chamber 1240 will be described with reference to FIG. 22. As illustrated in FIG. 22, the fourth treatment chamber 1240 is connected to the evacuation unit 1245 through an evacuation chamber 5002 with the use of a main valve. The fourth treatment chamber 1240 includes a power supply 5003, a dry pump 5001, a cathode 5005, a stage elevator 5006, a substrate stage 5007, a gate valve 5008, cooling water 5009, a flow rate controller 5010, and a gas tank 5011. The substrate 100 is held over the substrate stage 5007, and a target 5004 for an oxide semiconductor is placed on the cathode 5005 side.

First, evacuation of the fourth treatment chamber 1240 is performed using the dry pump 5001 through the evacuation chamber 5002, so that the pressure inside the fourth treatment chamber 1240 is reduced. Then, further evacuation is performed with the evacuation unit 1245 which is a cryopump, so that an impurity such as hydrogen, moisture, hydride, or a hydrogen compound inside the fourth treatment chamber 1240 is eliminated. Instead of the cryopump, a turbo molecular pump may be used; in that case, a cold trap for adsorbing moisture or the like may be provided above an inlet of the turbo molecular pump.

The substrate 100, over which layers up to the gate insulating layer 132 are formed, is transferred to the fourth treatment chamber 1240 through the gate valve 5008 and held over the substrate stage 5007. A sputtering gas is introduced from the gas tank 5011 into the fourth treatment chamber 1240 with the flow rate controlled by the flow rate controller 5010, voltage is applied to the cathode by the power supply 5003 so that plasma is generated, and the target 5004 is used; thus, the oxide semiconductor film is formed over the substrate 100.

Although the fourth treatment chamber has been described as an example with reference to FIG. 22, the method of FIG. 22 can be applied to any treatment chamber of the film formation apparatus in this specification as appropriate.

In the fourth treatment chamber 1240, remaining moisture is removed by the cryopump, so that the concentration of hydrogen in the oxide semiconductor film can be reduced. The oxide semiconductor film is formed in the state where the substrate is heated. Deposition by a sputtering method is performed in the state where remaining moisture in the treatment chamber is removed by the cryopump, whereby the substrate temperature at the time of forming the oxide semiconductor film can be 400° C. or lower.

In the above-described manner, the gate insulating layer 132 and the oxide semiconductor film can be successively formed by the deposition apparatus 1000. The structure in which three or more treatment chambers are connected through a transfer chamber is employed in FIG. 23; however, another structure may be employed. For example, a so-called in-line structure in which the entrance and the exit for the substrate are provided and the treatment chambers are connected to each other may be employed.

Figure 24:
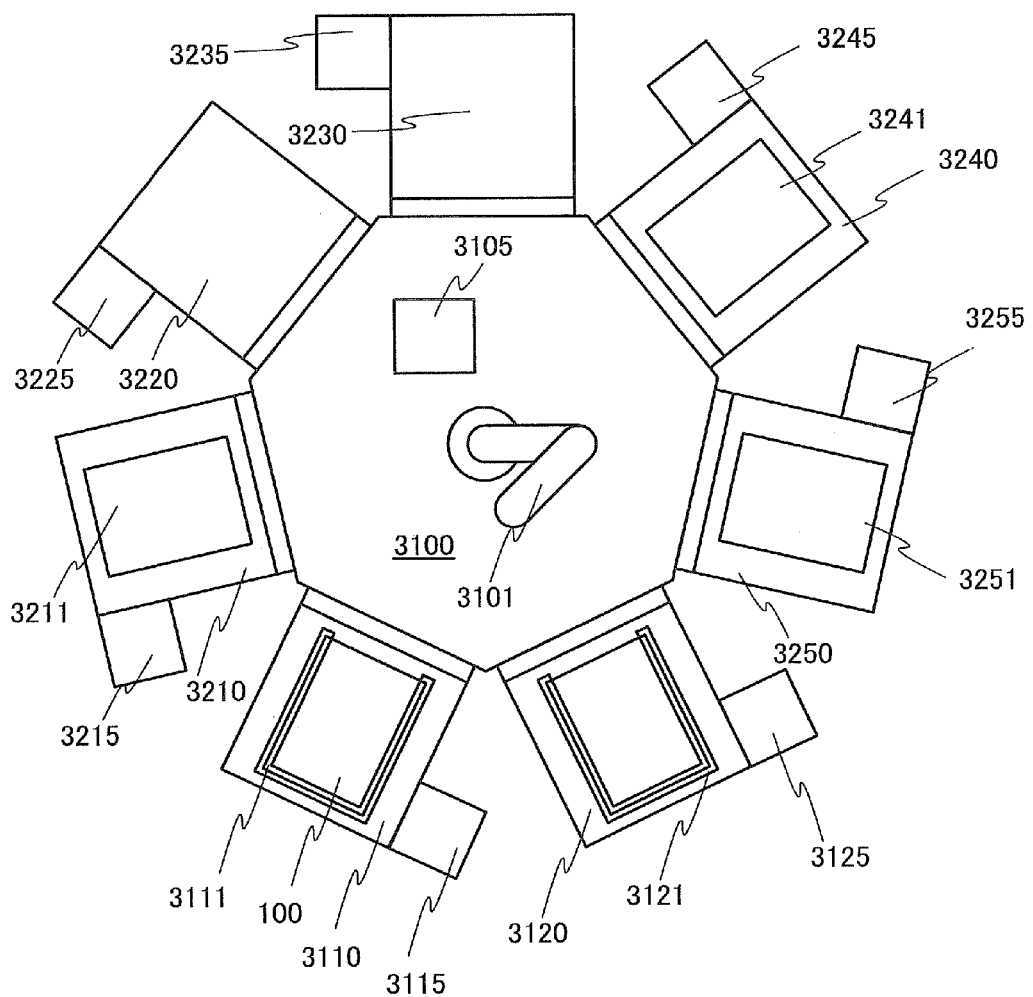
FIG. 24 illustrates an example of a deposition apparatus.

FIG. 24 shows an example of a deposition apparatus 3000 for forming the oxide insulating layer 116 and the protective insulating layer 103 over the island-shaped oxide semiconductor layer 121 as illustrated in FIGS. 1E and 1F.

The deposition apparatus 3000 includes a load chamber 3110 and an unload chamber 3120. The load chamber 3110 and the unload chamber 3120 are respectively provided with a cassette 3111 which stores a substrate before treatment and a cassette 3121 which stores a substrate after treatment.

The deposition apparatus 3000 includes a first transfer chamber 3100. The first transfer chamber 3100 is provided with a first transfer unit 3101. Five treatment chambers (a first treatment chamber 3210, a second treatment chamber 3220, a third treatment chamber 3230, a fourth treatment chamber 3240, and a fifth treatment chamber 3250) are connected to the first transfer chamber 3100 through gate valves, and are arranged around the first transfer chamber 3100.

The load chamber 3110, the unload chamber 3120, the first transfer chamber 3100, the first treatment chamber 3210, the second treatment chamber 3220, the third treatment chamber 3230, the fourth treatment chamber 3240, and the fifth treatment chamber 3250 are respectively provided with an evacuation unit 3115, an evacuation unit 3125, an evacuation unit 3105, an evacuation unit 3215, an evacuation unit 3225, an evacuation unit 3235, an evacuation unit 3245, and an evacuation unit 3255, so that a reduced pressure can be realized. Although the evacuation unit may be selected in accordance with the use application of each treatment chamber, an evacuation unit such as a cryopump is particularly preferable. Alternatively, as the evacuation unit, a turbo molecular pump provided with a cold trap may be used.

The load chamber 3110 and the unload chamber 3120 each serve as a delivery chamber for transferring a substrate to the first transfer chamber 3100. By provision of the delivery chamber, the first transfer chamber 3100 can be prevented from being contaminated by air.

The first treatment chamber 3210 and the fourth treatment chamber 3240 are respectively provided with a substrate-heating unit 3211 and a substrate-heating unit 3241. The second treatment chamber 3220 and the third treatment chamber 3230 are respectively provided with a structure for forming a silicon oxide film by a sputtering method and a structure for forming a silicon nitride film by a sputtering method. That is, a target and a substrate-heating unit are provided in each of the treatment chambers, and the treatment chambers are each provided with a gas supply unit for introducing a sputtering gas and a glow discharge generation unit. In addition, a cooling unit 3251 is provided in the fifth treatment chamber 3250.

Next, an example of operation of the deposition apparatus 3000 is described. Here, a method for forming the oxide insulating layer 116 and the protective insulating layer 103 over the island-shaped oxide semiconductor layer 121 is described.

First, the load chamber 3110 is evacuated so that the load chamber 3110 is made to have substantially the same pressure as the first transfer chamber 3100, and then, the substrate 100 is transferred from the load chamber 3110 to the first treatment chamber 3210 through the first transfer chamber 3100 with the gate valve opened.

It is preferable that the substrate 100 be preheated by the substrate-heating unit 3211 in the first treatment chamber 3210 so that an impurity attached to the substrate can be eliminated and evacuated. The impurity, for example, includes a hydrogen atom, a compound containing a hydrogen atom such as $H_2O$, a compound containing a carbon atom, or the like. Note that the temperature of the preheating is higher than or equal to 100° C. and lower than or equal to 400° C., preferably higher than or equal to 150° C. and lower than or equal to 300° C. As an evacuation unit provided for the first treatment chamber 3210, a cryopump is preferably used. Since the impurity attached to the substrate 100 is eliminated by the preheating and is diffused into the first treatment chamber 3210, the impurity should be evacuated from the first treatment chamber 3210 with use of a cryopump. Note that this preheating treatment can be omitted.

Next, the substrate 100 is transferred to the second treatment chamber 3220, and the oxide insulating layer 116 is formed. For example, a silicon oxide film is formed as the oxide insulating layer 116. The second treatment chamber 3220 is evacuated by a cryopump or the like, so that the impurity concentration in the treatment chamber is reduced. The oxide insulating film formed in the treatment chamber in which the impurity is reduced has a suppressed impurity concentration. Specifically, the concentration of hydrogen contained in the oxide insulating film can be reduced. Although the oxide insulating layer 116 may be formed in the state where the substrate 100 is heated, the oxide insulating layer 116 is formed at 0° C. to about 50° C., preferably room temperature, so that the oxide insulating layer 116 includes defects.

In the case where a silicon oxide film is formed as the oxide insulating layer 116 by a sputtering method, a quartz target or a silicon target can be used as a target. The silicon oxide film formed by a sputtering method under an atmosphere including oxygen and a rare gas with use of a silicon target can include a dangling bond of a silicon atom or an oxygen atom.

In the case where the oxide insulating layer contains a halogen element, a gas containing a halogen element is introduced into the second treatment chamber 3220 during deposition, whereby the oxide insulating layer can contain a halogen element. Alternatively, the oxide insulating layer may contain a halogen element in the following manner: the second treatment chamber 3220 for forming the oxide insulating layer is subjected to cleaning treatment with use of a gas containing a halogen element; the substrate 100 is transferred to the second treatment chamber 3220 in the state where a halogen element remains; and the oxide insulating layer is formed to contain the remaining halogen element.

Next, the substrate 100 is transferred to the third treatment chamber 3230, and the protective insulating layer 103 is formed over the oxide insulating layer 116. As the protective insulating layer 103, a film having a function of preventing diffusion of an impurity element is used; for example, a silicon nitride film, a silicon nitride oxide film, or the like can be used. The third treatment chamber 3230 is preferably evacuated by a cryopump or the like so that the impurity concentration in the treatment chamber can be reduced.

The protective insulating layer 103 prevents diffusion and entry of an impurity from an outer atmosphere of the thin film transistor 110. The impurity, for example, includes hydrogen, a compound containing a hydrogen atom such as $H_2O$, a compound containing a carbon atom, and the like.

In the case where a silicon nitride film is formed as the protective insulating layer 103 by a sputtering method, for example, the protective insulating layer 103 is formed in the following manner: a silicon target is used; a mixed gas of nitrogen and argon is introduced into the third treatment chamber 3230; and reactive sputtering is performed. The substrate temperature is set to higher than or equal to 100° C. and lower than or equal to 400° C., for example, higher than or equal to 200° C. and lower than or equal to 350° C. When film formation is performed in the state where heating is performed, an impurity including a hydrogen atom such as hydrogen, hydroxyl, or moisture can be diffused into the gate insulating layer 132 containing a halogen element, so that the impurity concentration in the island-shaped oxide semiconductor layer 121 can be reduced. In particular, the substrate temperature is preferably higher than or equal to 200° C. and lower than or equal to 350° C. so that diffusion of hydrogen atoms can be promoted.

In the case where the oxide insulating layer 116 and a silicon nitride layer as the protective insulating layer 103 are stacked, the silicon oxide layer and the silicon nitride layer can be formed in the same treatment chamber using a common silicon target. First, a sputtering gas containing oxygen is introduced and the silicon oxide layer is formed using a silicon target placed inside the treatment chamber, and then the sputtering gas is changed to a sputtering gas containing nitrogen and the silicon nitride layer is formed using the same silicon target. Since the silicon oxide layer and the silicon nitride layer can be formed in succession without exposure to air, an impurity such as hydrogen or moisture can be prevented from being adsorbed on the surface of the silicon oxide layer. In this case, after the oxide insulating layer 116 and the silicon nitride layer as the protective insulating layer 103 are stacked, heat treatment (at a temperature of 100° C. to 400° C.) for diffusing hydrogen or moisture included in the oxide semiconductor layer into the gate insulating layer 132 containing a halogen element may be performed.

Note that the heat treatment may be performed after the protective insulating layer 103 is formed in order to diffuse an impurity including a hydrogen atom such as hydrogen, hydroxyl, or moisture into the gate insulating layer 132 containing a halogen element and to reduce the impurity concentration in the island-shaped oxide semiconductor layer 121.

For example, as illustrated in FIG. 24, the substrate 100 is transferred to the fourth treatment chamber 3240, and heat treatment after deposition is performed. The substrate temperature of the heat treatment after deposition is higher than or equal to 100° C. and lower than or equal to 400° C. Through the heat treatment, an impurity included in the oxide semiconductor layer can be easily diffused into the gate insulating layer 132 containing a halogen element through the interface between the island-shaped oxide semiconductor layer 121 and the gate insulating layer 132 containing a halogen element. Specifically, a hydrogen atom or a compound containing a hydrogen atom such as $H_2O$ in the island-shaped oxide semiconductor layer 121 is easily diffused into the gate insulating layer 132 containing a halogen element. As a result, the impurity concentration in the oxide semiconductor layer is reduced.

Alternatively, the heat treatment for diffusing hydrogen or moisture included in the oxide semiconductor layer into the gate insulating layer 132 containing a halogen element may be performed before the oxide insulating layer 116 is formed.

After the heat treatment, the substrate 100 is transferred to the fifth treatment chamber 3250. The substrate 100 is cooled to such low temperature that reincorporation of an impurity such as water is suppressed from the substrate temperature T of the heat treatment after the deposition. Specifically, slow cooling is performed so that the temperature becomes 100° C. or more lower than the substrate temperature T of the heat treatment. Cooling may be performed with helium, neon, argon, or the like introduced into the fifth treatment chamber 3250. Note that it is preferable that water, hydrogen, or the like be not included in nitrogen or a rare gas such as helium, neon, or argon which is used for the cooling. The purity of nitrogen or a rare gas such as helium, neon, or argon is preferably 6N (99.9999%) or more, more preferably 7N (99.99999%) or more (that is, the impurity concentration is 1 ppm or less, preferably 0.1 ppm or less).

With use of the deposition apparatus 3000 to which an evacuation unit such as a cryopump is applied, an impurity in a treatment chamber can be reduced. An impurity attached to the inner wall of the treatment chamber is eliminated, and incorporation of an impurity into a substrate during deposition and a film can be reduced. In addition, an impurity which is eliminated from an atmosphere during preheating is evacuated, whereby the impurity can be prevented from being attached to the substrate again.

The impurity concentration in the oxide semiconductor layer formed in the above manner can be reduced. Thus, for example, in a thin film transistor in which an oxide semiconductor layer serving as a channel formation region is in contact with a gate insulating layer and an oxide insulating layer formed using a deposition apparatus described in this embodiment, the carrier concentration in the channel formation region is reduced in the state where voltage is not applied to a gate electrode, i.e., in the off state; therefore, the thin film transistor has low off current and has favorable characteristics.

A structure in which three or more treatment chambers are connected through a transfer chamber is employed in FIG. 24; however, another structure may be employed. For example, a so-called in-line structure in which the entrance and the exit for the substrate are provided and the treatment chambers are connected to each other may be employed.

The steps described in this embodiment can be used for manufacture of a liquid crystal display panel, an electroluminescence display panel, and a backplane (a substrate over which a thin film transistor is formed) of a display device using electronic ink. The steps described in this embodiment are performed at 400° C. or lower; therefore, the above steps can be applied to a manufacturing process in which a glass substrate having a thickness of 1 mm or less and having a side that is longer than 1 m is used. All the above steps can be performed at 400° C. or lower; thus, a large amount of energy is not needed for manufacturing a display panel.

In the above-described manner, a highly reliable semiconductor device with stable electric characteristics including a thin film transistor in which an oxide semiconductor layer is used can be provided.

Embodiment 2

In this embodiment, another example of a thin film transistor applicable to a semiconductor device disclosed in this specification will be described. The same portion as or a portion having a function similar to those described in the above Embodiment 1 can be formed in a manner similar to that described in Embodiment 1, and also the steps similar to those of Embodiment 1 can be performed in a manner similar to those described in Embodiment 1; therefore, repetitive description is omitted. Detailed description of the same portions is omitted.

FIGS. 2A to 2F illustrate an example of a cross-sectional structure of a semiconductor device. A thin film transistor 130 illustrated in FIGS. 2A to 2F is a kind of bottom-gate structure and is also called an inverted staggered thin film transistor.

The thin film transistor 130 illustrated in FIGS. 2A to 2F includes a gate electrode layer 101, a gate insulating layer 131, a gate insulating layer 102, an oxide semiconductor layer 112, a source electrode layer 115a, and a drain electrode layer 115b over a substrate 100 having an insulating surface. In addition, an oxide insulating layer 136 which covers the thin film transistor 130 and is in contact with the oxide semiconductor layer 112 is provided, and a protective insulating layer 103 is stacked thereover.

In order to suppress variation in electric characteristics of the thin film transistor in which the oxide semiconductor layer is used, an impurity such as hydrogen, moisture, hydroxyl, or hydride (also referred to as a hydrogen compound) which is a factor of the variation is eliminated from the interface between the oxide semiconductor layer and the oxide insulating layer (a silicon oxide layer) provided in contact with the oxide semiconductor layer. Specifically, the interface between the oxide semiconductor layer and the oxide insulating layer provided in contact with the oxide semiconductor layer has a hydrogen concentration of $5 \times 10^{19}$ atoms/cm$^3$ or lower, preferably $1 \times 10^{19}$ atoms/cm$^3$ or lower.

An impurity such as hydrogen or moisture (e.g., a hydrogen atom or a compound containing a hydrogen atom such as $H_2O$) is eliminated from the oxide semiconductor layer with use of a halogen element typified by fluorine or chlorine, so that the impurity concentration in the oxide semiconductor layer is reduced. In the case where the gate insulating layer and the oxide insulating layer contain a halogen element, the concentration of the halogen element in the gate insulating layer and the oxide insulating layer may be approximately $5 \times 10^{18}$ atoms/cm$^3$ to $1 \times 10^{20}$ atoms/cm$^3$.

Since a halogen element typified by fluorine or chlorine has high electronegativity and the difference between the electronegativity of a halogen element and that of hydrogen which is an impurity is large, the bond force of ion bond between a halogen element and hydrogen is high. Therefore, due to a halogen element contained in the gate insulating layer and/or the oxide insulating layer, an impurity such as hydrogen or moisture (e.g., a hydrogen atom or a compound containing a hydrogen atom such as $H_2O$) in the oxide semiconductor layer can be effectively diffused into the gate insulating layer and/or the oxide insulating layer, so that the impurity can be eliminated from the oxide semiconductor layer.

The gate insulating layer and the oxide insulating layer which are provided in contact with the oxide semiconductor layer can be formed to contain a halogen element. In addition, a halogen element may be attached to the oxide semiconductor layer through plasma treatment under an atmosphere of a gas containing a halogen element. At least one of the above methods for making a halogen element be contained in a semiconductor device (making a halogen element be contained in the gate insulating layer during deposition, making a halogen element be contained in the oxide insulating layer during deposition, and making a halogen element be attached to the interface between the oxide insulating layer and the oxide semiconductor layer through plasma treatment) may be used, and needless to say, a plurality of the above methods may be used.

By at least one of the above methods, an impurity such as hydrogen, moisture, hydroxyl, or hydride included in the oxide semiconductor layer is diffused into the gate insulating layer and/or the oxide insulating layer with use of a halogen element, so that the impurity concentration in the oxide semiconductor layer is reduced.

In this embodiment, an example in which the oxide insulating layer 136 serving as a protective insulating layer contains a halogen element is employed; thus, the oxide insulating layer 136 provided in contact with the oxide semiconductor layer 112 contains a halogen element.

The thin film transistor 130 is described using a single-gate thin film transistor; a multi-gate thin film transistor including a plurality of channel formation regions can be formed when needed.

A process for forming the thin film transistor 130 over the substrate 100 is described below with reference to FIGS. 2A to 2F.

Figure 2A:
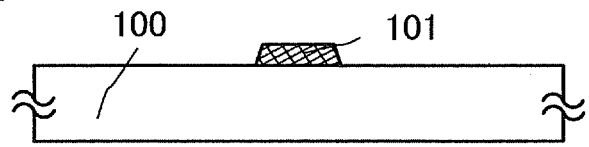
FIGS. 2A to 2F illustrate a semiconductor device and a method for manufacturing the semiconductor device.

First, a conductive film is formed over the substrate 100 having an insulating surface, and then, the gate electrode layer 101 is formed through a first photolithography step and an etching step (see FIG. 2A).

Next, the gate insulating layer 131 and the gate insulating layer 102 are formed over the gate electrode layer 101.

The gate insulating layer can be formed to have a single-layer or stacked-layer structure using a silicon oxide layer, a silicon nitride layer, a silicon oxynitride layer, a silicon nitride oxide layer, an aluminum oxide layer, an aluminum oxynitride layer, or an aluminum nitride oxide layer by a plasma CVD method, a sputtering method, or the like.

High-density plasma CVD using a microwave (2.45 GHz) is preferably used, in which case an insulating layer which is dense, has high withstand voltage, and has high quality can be formed.

Figure 2B:
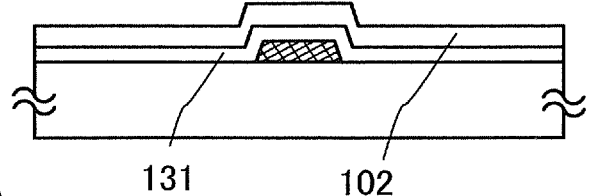

In this embodiment, the gate insulating layer is formed to have a structure in which the gate insulating layer 131 and the gate insulating layer 102 are stacked in this order over the gate electrode layer 101 (see FIG. 2B). As a stacked structure of the gate insulating layer, a structure in which a silicon nitride layer and a silicon oxide layer are stacked over the gate electrode layer 101 can be employed. The gate insulating layer with a thickness of 100 nm has a structure in which a silicon nitride layer ($SiN_y$ (y>0)) with a thickness of greater than or equal to 50 nm and less than or equal to 200 nm is formed as the gate insulating layer 131 by a sputtering method and a silicon oxide layer ($SiO_x$ (x>0)) with a thickness of greater than or equal to 5 nm and less than or equal to 300 nm is formed as the gate insulating layer 102 over the gate insulating layer 131.

As a deposition gas (including a gas containing a halogen element) used for deposition of the gate insulating layers 131 and 102, a high-purity gas is preferably used, in which an impurity such as hydrogen, water, hydroxyl, or hydride is reduced to such a degree that the impurity concentration level is represented by the unit "ppm" or "ppb".

Figure 2C:
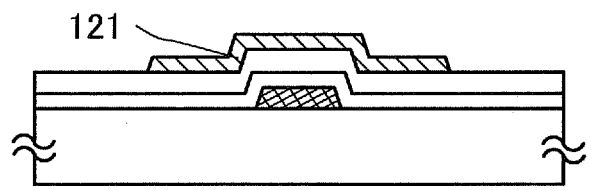
Figure 2D:
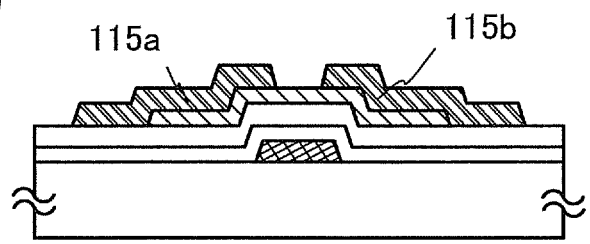

Next, an oxide semiconductor film is formed over the gate insulating layer 131 and the gate insulating layer 102, and is processed into an island-shaped oxide semiconductor layer 121 by a second photolithography step and an etching step (see FIG. 2C). In this embodiment, the oxide semiconductor film is formed using an In—Ga—Zn—O-based oxide semiconductor target by a sputtering method.

Next, a conductive film is formed over the gate insulating layer 102 and the oxide semiconductor layer 121. A third photolithography step is performed. A resist mask is formed over the conductive film, and selective etching is performed, so that the source electrode layer 115a and the drain electrode layer 115b are formed; after that, the resist mask is removed (see FIG. 2D).

Figure 2E:
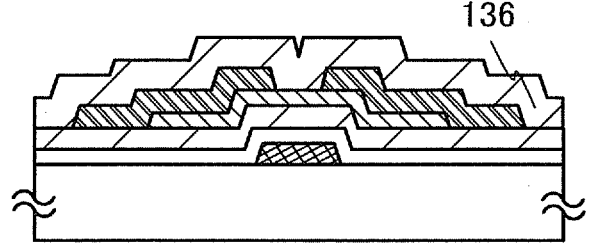

Then, the oxide insulating layer 136 is formed over the gate insulating layer 102, the oxide semiconductor layer 121, the source electrode layer 115a, and the drain electrode layer 115b (see FIG. 2E).

In order to suppress variation in electric characteristics of the thin film transistor in which the oxide semiconductor layer is used, in this embodiment, an oxide insulating layer containing a halogen element (a silicon oxide layer containing fluorine) is formed as the oxide insulating layer 136.

In this embodiment, as the oxide insulating layer 136, a silicon oxide layer containing a halogen element is formed in the following manner: the substrate 100 over which layers up to the source electrode layer 115a and the drain electrode layer 115b are formed is heated at lower than 100° C.; a sputtering gas containing high-purity oxygen and a halogen element from which hydrogen and moisture are removed is introduced; and a silicon semiconductor target is used.

A halogen element may be introduced into a deposition gas (a sputtering gas) during deposition so as to be contained in the oxide insulating layer 136. Alternatively, a halogen element remaining in a treatment chamber due to cleaning treatment in the previous step may be contained in the oxide insulating layer 136. Further alternatively, a halogen element may be added to the gate insulating layer and the oxide insulating layer after deposition.

As a deposition gas (a sputtering gas) containing a halogen element which is introduced during deposition, $NF_3$ or the like can be used. With use of a gas containing a halogen element such as $NF_3$ described above for cleaning treatment on a treatment chamber for deposition, the oxide insulating layer 136 can be formed to contain a halogen element such as fluorine remaining in the treatment chamber.

As a gas containing a halogen element, a gas containing fluorine (a fluorine-based gas such as tetrafluoride ($CF_4$), sulfur fluoride ($SF_6$), nitrogen fluoride ($NF_3$), or trifluoromethane ($CHF_3$)), a gas containing chlorine (a chlorine-based gas such as chlorine ($Cl_2$), boron chloride ($BCl_3$), silicon chloride ($SiCl_4$), or carbon tetrachloride ($CCl_4$)), or the like can be used as appropriate.

As a deposition gas (including a gas containing a halogen element) used for deposition of the oxide insulating layer 136, a high-purity gas is preferably used, in which an impurity such as hydrogen, water, hydroxyl, or hydride is reduced to such a degree that the impurity concentration level is represented by the unit "ppm" or "ppb".

In that case, remaining moisture in the treatment chamber is preferably removed in the deposition of the oxide insulating layer 136. This is for preventing hydrogen, hydroxyl, or moisture from being contained in the oxide semiconductor layer 121 and the oxide insulating layer 136.

Note that as the oxide insulating layer 136, a silicon oxynitride layer, an aluminum oxide layer, an aluminum oxynitride layer, or the like may be used instead of the silicon oxide layer.

Next, heat treatment is performed at 100° C. to 400° C. in the state where the oxide semiconductor layer 136 containing a halogen element and the oxide semiconductor layer 121 are in contact with each other. By this heat treatment, hydrogen or moisture included in the oxide semiconductor layer 121 can be diffused into the gate insulating layer 136 containing a halogen element. Since the oxide insulating layer 136 contains a halogen element, an impurity such as hydrogen, hydroxyl, or moisture included in the island-shaped oxide semiconductor layer 121 is diffused into the oxide insulating layer 136 through the interface between the oxide semiconductor layer 121 and the oxide insulating layer 136. Specifically, a hydrogen atom, a compound containing a hydrogen atom such as $H_2O$, or a compound containing a carbon atom in the oxide semiconductor layer 121 is easily diffused into the oxide insulating layer 136.

The oxide insulating layer 136 preferably contains excessive oxygen and includes a large number of defects typified by dangling bonds. The oxide insulating layer 136 preferably includes a large number of defects because the oxide insulating layer 136 has higher binding energy mainly with respect to hydrogen, so that diffusion of an impurity from the oxide semiconductor layer to the oxide insulating layer 136 is promoted and the impurity can be stabilized in the oxide insulating layer 136.

Next, the protective insulating layer 103 is formed over the oxide insulating layer 136. As the protective insulating layer 103, a silicon nitride film, a silicon nitride oxide film, an aluminum nitride film, or the like is used. As the protective insulating layer 103, a silicon nitride film is formed by heating the substrate 100 over which layers up to the oxide insulating layer 136 are formed, to a temperature of 100° C. to 400° C., introducing a sputtering gas containing high-purity nitrogen from which hydrogen and moisture are removed, and using a target of a silicon semiconductor.

Through the above steps, an impurity such as hydrogen or moisture is eliminated, and the concentration of the impurity such as hydrogen or moisture is reduced as much as possible, whereby generation of parasitic channel on the back channel side, i.e., in a superficial portion of the oxide semiconductor layer can be suppressed.

Figure 2F:
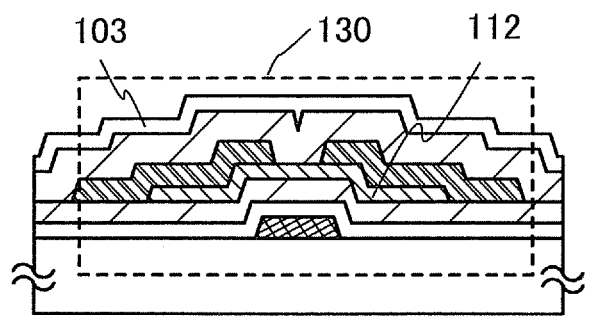

Therefore, the thin film transistor 130 including the oxide semiconductor layer 112 in which the concentration of hydrogen and hydride is reduced can be manufactured (see FIG. 2F).

By provision of the oxide insulating layer 136 containing a halogen element in contact with the oxide semiconductor layer 112, an impurity containing a hydrogen atom such as hydrogen, hydroxyl, or moisture in the oxide semiconductor layer 112 can be diffused into the oxide insulating layer 136 containing a halogen element, so that the impurity concentration in the oxide semiconductor layer 112, which is as a factor of varying electric characteristics, can be reduced.

In the above-described manner, a highly reliable semiconductor device with stable electric characteristics including a thin film transistor in which an oxide semiconductor layer is used can be provided.

Embodiment 3

In this embodiment, another example of a thin film transistor applicable to a semiconductor device disclosed in this specification will be described. The same portion as or a portion having a function similar to those described in the above embodiments can be formed in a manner similar to that described in the above embodiments, and also the steps similar to those of the above embodiments can be performed in a manner similar to those described in the above embodiments; therefore, repetitive description is omitted. Detailed description of the same portions is omitted.

FIGS. 3A to 3F illustrate an example of a cross-sectional structure of a semiconductor device. A thin film transistor 135 illustrated in FIGS. 3A to 3F is a kind of bottom-gate structure and is also called an inverted staggered thin film transistor.

The thin film transistor 135 illustrated in FIGS. 3A to 3F includes a gate electrode layer 101, a gate insulating layer 131, a gate insulating layer 132, an oxide semiconductor layer 112, a source electrode layer 115a, and a drain electrode layer 115b over a substrate 100 having an insulating surface. In addition, an oxide insulating layer 136 which covers the thin film transistor 135 and is in contact with the oxide semiconductor layer 112 is provided, and a protective insulating layer 103 is stacked thereover.

In order to suppress variation in electric characteristics of the thin film transistor in which the oxide semiconductor layer is used, an impurity such as hydrogen, moisture, hydroxyl, or hydride (also referred to as a hydrogen compound) which is factor of the variation is eliminated from the interface between the oxide semiconductor layer and the oxide insulating layer (a silicon oxide layer) provided in contact with the oxide semiconductor layer. Specifically, the interface between the oxide semiconductor layer and the oxide insulating layer provided in contact with the oxide semiconductor layer has a hydrogen concentration of $5 \times 10^{19}$ atoms/cm$^3$ or lower, preferably $1 \times 10^{19}$ atoms/cm$^3$ or lower.

An impurity such as hydrogen or moisture (e.g., a hydrogen atom or a compound containing a hydrogen atom such as H$_2$O) is eliminated from the oxide semiconductor layer with use of a halogen element typified by fluorine or chlorine, so that the impurity concentration in the oxide semiconductor layer is reduced. In the case where the gate insulating layer and the oxide insulating layer contain a halogen element, the concentration of the halogen element in the gate insulating layer and the oxide insulating layer may be approximately $5 \times 10^{18}$ atoms/cm$^3$ to $1 \times 10^{20}$ atoms/cm$^3$.

Since a halogen element typified by fluorine or chlorine has high electronegativity and the difference between the electronegativity of a halogen element and that of hydrogen which is an impurity is large, the bond force of ion bond between a halogen element and hydrogen is high. Therefore, due to a halogen element contained in the gate insulating layer and/or the oxide insulating layer, an impurity such as hydrogen or moisture (e.g., a hydrogen atom or a compound containing a hydrogen atom such as H$_2$O) in the oxide semiconductor layer can be effectively diffused into the gate insulating layer and/or the oxide insulating layer, so that the impurity can be eliminated from the oxide semiconductor layer.

The gate insulating layer and the oxide insulating layer which are provided in contact with the oxide semiconductor layer can be formed to contain a halogen element. In addition, a halogen element may be attached to the oxide semiconductor layer through plasma treatment under an atmosphere of a gas containing a halogen element. At least one of the above methods for making a halogen element be contained in a semiconductor device (making a halogen element be contained in the gate insulating layer during deposition, making a halogen element be contained in the oxide insulating layer during deposition, and making a halogen element be attached to the interface between the oxide insulating layer and the oxide semiconductor layer through plasma treatment) may be used, and needless to say, a plurality of the above methods may be used.

By at least one of the above methods, an impurity such as hydrogen, moisture, hydroxyl, or hydride included in the oxide semiconductor layer is diffused into the gate insulating layer and/or the oxide insulating layer with use of a halogen element, so that the impurity concentration in the oxide semiconductor layer is reduced.

In this embodiment, an example in which the gate insulating layer 132 and the oxide insulating layer 136 serving as a protective insulating layer contain a halogen element is employed; thus, the gate insulating layer 132 and the oxide insulating layer 136 which are provided in contact with the oxide semiconductor layer 112 contain a halogen element.

The thin film transistor 135 is described using a single-gate thin film transistor; a multi-gate thin film transistor including a plurality of channel formation regions can be formed when needed.

A process for forming the thin film transistor 135 over the substrate 100 is described below with reference to FIGS. 3A to 3F.

Figure 3A:
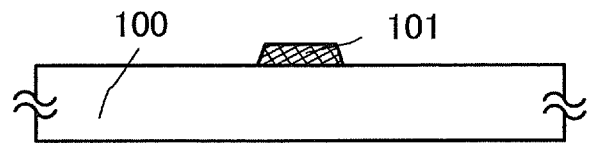
FIGS. 3A to 3F illustrate a semiconductor device and a method for manufacturing the semiconductor device.

First, a conductive film is formed over the substrate 100 having an insulating surface, and then, the gate electrode layer 101 is formed through a first photolithography step and an etching step (see FIG. 3A).

Next, the gate insulating layer 131 and the gate insulating layer 132 are formed over the gate electrode layer 101. In this embodiment, the gate insulating layer contains a halogen element. In the case where the gate insulating layer has a stacked-layer structure, at least a gate insulating layer in contact with the oxide semiconductor layer contains a halogen element.

The gate insulating layer can be formed to have a single-layer or stacked-layer structure using a silicon oxide layer, a silicon nitride layer, a silicon oxynitride layer, a silicon nitride oxide layer, an aluminum oxide layer, an aluminum oxynitride layer, or an aluminum nitride oxide layer by a plasma CVD method, a sputtering method, or the like. High-density plasma CVD using a microwave (2.45 GHz) is preferably used, in which case an insulating layer which is dense, has high withstand voltage, and has high quality can be formed.

Figure 3B:
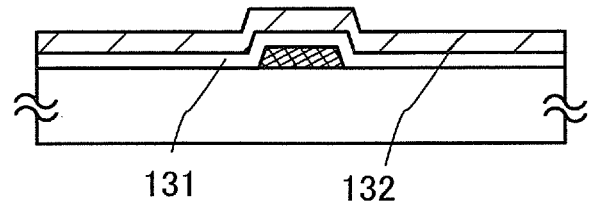

In this embodiment, the gate insulating layer is formed to have a structure in which the gate insulating layer 131 and the gate insulating layer 132 are stacked in this order over the gate electrode layer 101 (see FIG. 3B). As a stacked structure of the gate insulating layer, a structure in which a silicon nitride layer and a silicon oxide layer are stacked over the gate electrode layer 101 can be employed. The gate insulating layer with a thickness of 100 nm has a structure in which a silicon nitride layer ($SiN_y$ (y>0)) with a thickness of greater than or equal to 50 nm and less than or equal to 200 nm is formed as the gate insulating layer 131 by a sputtering method and a silicon oxide layer ($SiO_x$ (x>0)) containing a halogen element with a thickness of greater than or equal to 5 nm and less than or equal to 300 nm is formed as the gate insulating layer 132 over the gate insulating layer 131.

As a deposition gas (a sputtering gas) containing a halogen element which is introduced during deposition, $NF_3$ or the like can be used. With use of a gas containing a halogen element such as $NF_3$ described above for cleaning treatment on a treatment chamber for deposition, the gate insulating layer can be formed to contain a halogen element such as fluorine remaining in the treatment chamber. By addition of a halogen element to the gate insulating layer during deposition as described above, the gate insulating layer containing a halogen element can be formed without increase in the number of steps.

As a gas containing a halogen element, a gas containing fluorine (a fluorine-based gas such as tetrafluoride ($CF_4$), sulfur fluoride ($SF_6$), nitrogen fluoride ($NF_3$), or trifluoromethane ($CHF_3$)), a gas containing chlorine (a chlorine-based gas such as chlorine ($Cl_2$), boron chloride ($BCl_3$), silicon chloride ($SiCl_4$), or carbon tetrachloride ($CCl_4$)), or the like can be used as appropriate.

As a sputtering gas (including a gas containing a halogen element) used for deposition of the gate insulating layers 131 and 132, a high-purity gas is preferably used, in which an impurity such as hydrogen, water, hydroxyl, or hydride is reduced to such a degree that the impurity concentration level is represented by the unit "ppm" or "ppb".

Figure 3C:
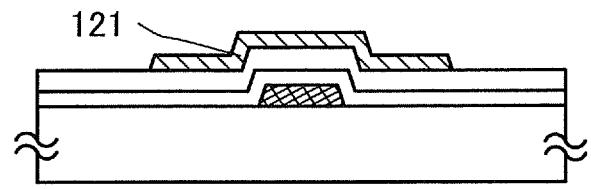
Figure 3D:
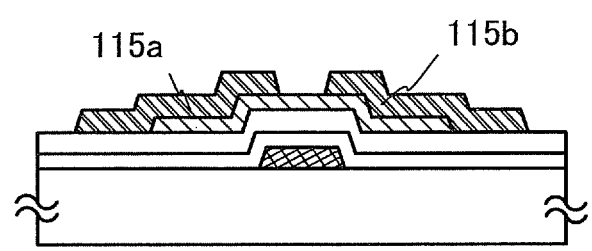

Next, an oxide semiconductor film is formed over the gate insulating layer 131 and the gate insulating layer 132, and is processed into an island-shaped oxide semiconductor layer 121 by a second photolithography step and an etching step (see FIG. 3C). In this embodiment, the oxide semiconductor film is formed using an In—Ga—Zn—O-based oxide semiconductor target by a sputtering method.

Then, a conductive film is formed over the gate insulating layer 132 and the oxide semiconductor layer 121. A third photolithography step is performed. A resist mask is formed over the conductive film, and selective etching is performed, so that the source electrode layer 115a and the drain electrode layer 115b are formed; after that, the resist mask is removed (see FIG. 3D).

Figure 3E:
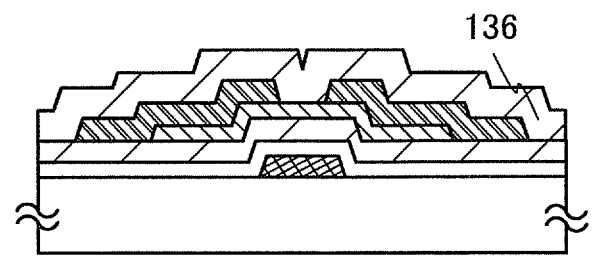

Then, the oxide insulating layer 136 is formed over the gate insulating layer 132, the oxide semiconductor layer 121, the source electrode layer 115a, and the drain electrode layer 115b (see FIG. 3E).

In order to suppress variation in electric characteristics of the thin film transistor in which the oxide semiconductor layer is used, in this embodiment, an oxide insulating layer containing a halogen element (a silicon oxide layer containing fluorine) is formed as the oxide insulating layer 136.

In this embodiment, as the oxide insulating layer 136, a silicon oxide layer containing a halogen element is formed in the following manner: the substrate 100 over which layers up to the source electrode layer 115a and the drain electrode layer 115b are formed is heated at lower than 100° C.; a sputtering gas containing high-purity oxygen and a halogen element from which hydrogen and moisture are removed is introduced; and a silicon semiconductor target is used.

A halogen element may be introduced into a deposition gas (a sputtering gas) during deposition so as to be contained in the oxide insulating layer 136. Alternatively, a halogen element remaining in a treatment chamber due to cleaning treatment in the previous step may be contained in the oxide insulating layer 136. Further alternatively, a halogen element may be added to the gate insulating layer and the oxide insulating layer after deposition.

As a deposition gas (a sputtering gas) containing a halogen element which is introduced during deposition, $NF_3$ or the like can be used. With use of a gas containing a halogen element such as $NF_3$ described above for cleaning treatment on a treatment chamber for deposition, the oxide insulating layer 136 can be formed to contain a halogen element such as fluorine remaining in the treatment chamber.

As a gas containing a halogen element, a gas containing fluorine (a fluorine-based gas such as tetrafluoride ($CF_4$), sulfur fluoride ($SF_6$), nitrogen fluoride ($NF_3$), or trifluoromethane ($CHF_3$)), a gas containing chlorine (a chlorine-based gas such as chlorine ($Cl_2$), boron chloride ($BCl_3$), silicon chloride ($SiCl_4$), or carbon tetrachloride ($CCl_4$)), or the like can be used as appropriate.

As a deposition gas (including a gas containing a halogen element) used for deposition of the oxide insulating layer 136, a high-purity gas is preferably used, in which an impurity such as hydrogen, water, hydroxyl, or hydride is reduced to such a degree that the impurity concentration level is represented by the unit "ppm" or "ppb".

In that case, remaining moisture in the treatment chamber is preferably removed in the deposition of the oxide insulating layer 136. This is for preventing hydrogen, hydroxyl, or moisture from being contained in the oxide semiconductor layer 121 and the oxide insulating layer 136.

Note that as the oxide insulating layer 136, a silicon oxynitride layer, an aluminum oxide layer, an aluminum oxynitride layer, or the like may be used instead of the silicon oxide layer.

Next, heat treatment is performed at 100° C. to 400° C. in the state where the gate insulating layer 132 containing a halogen element and the oxide insulating layer 136 containing a halogen element are in contact with the oxide semiconductor layer 121. By this heat treatment, hydrogen or moisture included in the oxide semiconductor layer 121 can be diffused into the gate insulating layer 132 containing a halogen element and the gate insulating layer 136 containing a halogen element. Since the gate insulating layer 132 and the oxide insulating layer 136 each contain a halogen element, an impurity such as hydrogen, hydroxyl, or moisture included in the island-shaped oxide semiconductor layer 121 is diffused into the gate insulating layer 132 or the oxide insulating layer 136 through the interface between the oxide semiconductor layer 121 and the gate insulating layer 132 or the interface between the oxide semiconductor layer 121 and the oxide insulating layer 136. Specifically, a hydrogen atom, a compound containing a hydrogen atom such as $H_2O$, or a compound containing a carbon atom in the oxide semiconductor layer 121 is easily diffused into the gate insulating layer 132 and the oxide insulating layer 136.

The oxide insulating layer 136 preferably contains excessive oxygen and includes a large number of defects such as dangling bonds. The oxide insulating layer 136 preferably includes a large number of defects because the oxide insulating layer 136 has higher binding energy mainly with respect to hydrogen, so that diffusion of an impurity from the oxide semiconductor layer to the oxide insulating layer 136 is promoted and the impurity can be stabilized in the oxide insulating layer 136.

Next, the protective insulating layer 103 is formed over the oxide insulating layer 136. As the protective insulating layer 103, a silicon nitride film, a silicon nitride oxide film, an aluminum nitride film, or the like is used. As the protective insulating layer 103, a silicon nitride film is formed by heating the substrate 100 over which layers up to the oxide insulating layer 136 are formed, to a temperature of 100° C. to 400° C., introducing a sputtering gas containing high-purity nitrogen from which hydrogen and moisture are removed, and using a target of a silicon semiconductor.

Through the above steps, an impurity such as hydrogen or moisture is eliminated, and the concentration of the impurity such as hydrogen or moisture is reduced as much as possible, whereby generation of parasitic channel on the back channel side, i.e., in a superficial portion of the oxide semiconductor layer can be suppressed.

Figure 3F:
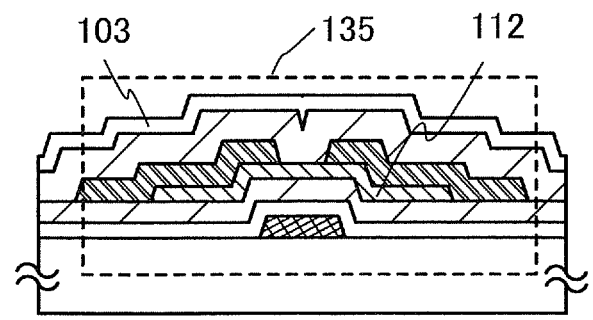

Therefore, the thin film transistor 135 including the oxide semiconductor layer 112 in which the concentration of hydrogen and hydride is reduced can be manufactured (see FIG. 3F).

By provision of the gate insulating layer 132 containing a halogen element and the oxide insulating layer 136 containing a halogen element in contact with the oxide semiconductor layer 112, an impurity containing a hydrogen atom such as hydrogen, hydroxyl, or moisture in the oxide semiconductor layer 112 can be diffused into the gate insulating layer 132 containing a halogen element and the oxide insulating layer 136 containing a halogen element, so that the impurity concentration in the oxide semiconductor layer 112, which is a factor of varying electric characteristics, can be reduced.

In the above-described manner, a highly reliable semiconductor device with stable electric characteristics including a thin film transistor in which an oxide semiconductor layer is used can be provided.

Embodiment 4

In this embodiment, another example of a thin film transistor applicable to a semiconductor device disclosed in this specification will be described. The same portion as or a portion having a function similar to those described in the above embodiments can be formed in a manner similar to that described in the above embodiments, and also the steps similar to those of the above embodiments can be performed in a manner similar to those described in the above embodiments; therefore, repetitive description is omitted. Detailed description of the same portions is omitted.

FIGS. 4A to 4D illustrate an example of a cross-sectional structure of a semiconductor device. A thin film transistor 180 illustrated in FIGS. 4A to 4D is a kind of bottom-gate structure and is also called an inverted staggered thin film transistor.

The thin film transistor 180 illustrated in FIGS. 4A to 4D includes a gate electrode layer 101, a gate insulating layer 131, a gate insulating layer 102, an oxide semiconductor layer 112, a source electrode layer 115a, and a drain electrode layer 115b over a substrate 100 having an insulating surface. In addition, an oxide insulating layer 116 which covers the thin film transistor 180 and is in contact with the oxide semiconductor layer 112 is provided, and a protective insulating layer 103 is stacked thereover.

In order to suppress variation in electric characteristics of the thin film transistor in which the oxide semiconductor layer is used, an impurity such as hydrogen, moisture, hydroxyl, or hydride (also referred to as a hydrogen compound) which is a factor of the variation is eliminated from the interface between the oxide semiconductor layer and the oxide insulating layer (a silicon oxide layer) provided in contact with the oxide semiconductor layer. Specifically, the interface between the oxide semiconductor layer and the oxide insulating layer provided in contact with the oxide semiconductor layer has a hydrogen concentration of $5 \times 10^{19}$ atoms/cm$^3$ or lower, preferably $1 \times 10^{19}$ atoms/cm$^3$ or lower.

An impurity such as hydrogen or moisture (e.g., a hydrogen atom or a compound containing a hydrogen atom such as H$_2$O) is eliminated from the oxide semiconductor layer with use of a halogen element typified by fluorine or chlorine, so that the impurity concentration in the oxide semiconductor layer is reduced.

Since a halogen element typified by fluorine or chlorine has high electronegativity and the difference between the electronegativity of a halogen element and that of hydrogen which is an impurity is large, the bond force of ion bond between a halogen element and hydrogen is high. Therefore, due to a halogen element contained in the gate insulating layer and/or the oxide insulating layer, an impurity such as hydrogen or moisture (e.g., a hydrogen atom or a compound containing a hydrogen atom such as H$_2$O) in the oxide semiconductor layer can be effectively diffused into the gate insulating layer and/or the oxide insulating layer, so that the impurity can be eliminated from the oxide semiconductor layer.

The gate insulating layer and the oxide insulating layer which are provided in contact with the oxide semiconductor layer can be formed to contain a halogen element. In addition, a halogen element may be attached to the oxide semiconductor layer through plasma treatment under an atmosphere of a gas containing a halogen element. At least one of the above methods for making a halogen element be contained in a semiconductor device (making a halogen element be contained in the gate insulating layer during deposition, making a halogen element be contained in the oxide insulating layer during deposition, and making a halogen element be attached to the interface between the oxide insulating layer and the oxide semiconductor layer through plasma treatment) may be used, and needless to say, a plurality of the above methods may be used.

By at least one of the above methods, an impurity such as hydrogen, moisture, hydroxyl, or hydride included in the oxide semiconductor layer is diffused into the gate insulating layer and/or the oxide insulating layer with use of a halogen element, so that the impurity concentration in the oxide semiconductor layer is reduced.

In this embodiment, a halogen element 133 is attached to the oxide semiconductor layer 112 through plasma treatment under an atmosphere of a gas containing a halogen element.

The thin film transistor 180 is described using a single-gate thin film transistor; a multi-gate thin film transistor including a plurality of channel formation regions can be formed when needed.

A process for forming the thin film transistor 180 over the substrate 100 is described below with reference to FIGS. 4A to 4D.

First, a conductive film is formed over the substrate 100 having an insulating surface, and then, the gate electrode layer 101 is formed through a first photolithography step and an etching step.

Next, a gate insulating layer is formed to have a stacked-layer structure of the gate insulating layer 131 and the gate insulating layer 102 over the gate electrode layer 101. As a stacked structure of the gate insulating layer, a structure in which a silicon nitride layer and a silicon oxide layer are stacked over the gate electrode layer 101 can be employed.

Next, an oxide semiconductor film is formed over the gate insulating layer 131 and the gate insulating layer 102, and is processed into an island-shaped oxide semiconductor layer 121 by a second photolithography step and an etching step. In this embodiment, the oxide semiconductor film is formed using an In—Ga—Zn—O-based oxide semiconductor target by a sputtering method.

Next, a conductive film is formed over the gate insulating layer 102 and the oxide semiconductor layer 121. A third photolithography step is performed. A resist mask is formed over the conductive film, and selective etching is performed, so that the source electrode layer 115a and the drain electrode layer 115b are formed; after that, the resist mask is removed (see FIG. 4A).

Next, the oxide semiconductor layer 121 may be subjected to plasma treatment under an atmosphere of a gas containing a halogen element so that the halogen element 133 is attached to the oxide semiconductor layer 121.

Plasma treatment for attaching a halogen element may be performed before a resist mask for forming the source electrode layer 115a and the drain electrode layer 115b is removed.

As a gas containing a halogen element, a gas containing fluorine (a fluorine-based gas such as tetrafluoride ($CF_4$), sulfur fluoride ($SF_6$), nitrogen fluoride ($NF_3$), or trifluoromethane ($CHF_3$)), a gas containing chlorine (a chlorine-based gas such as chlorine ($Cl_2$), boron chloride ($BCl_3$), silicon chloride ($SiCl_4$), or carbon tetrachloride ($CCl_4$)), or the like can be used as appropriate.

Figure 4A:
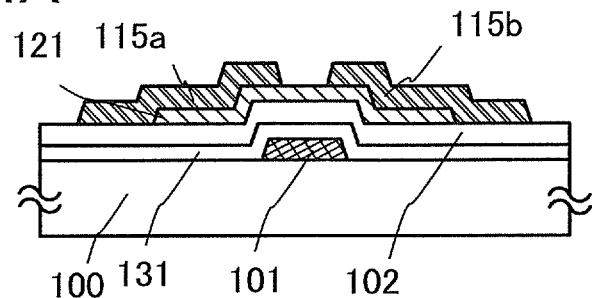
FIGS. 4A to 4D illustrate a semiconductor device and a method for manufacturing the semiconductor device.
Figure 4B:
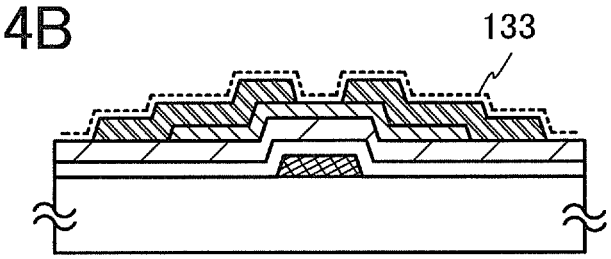
Figure 4C:
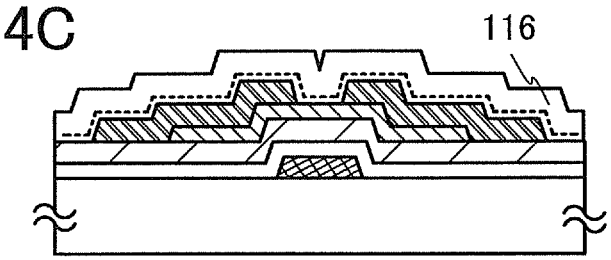

Then, the oxide insulating layer 116 is formed over the gate insulating layer 102, the oxide semiconductor layer 121, the source electrode layer 115a, and the drain electrode layer 115b (see FIG. 4C).

In this embodiment, as the oxide insulating layer 116, a silicon oxide layer containing a halogen element is formed in the following manner: the substrate 100 over which layers up to the source electrode layer 115a and the drain electrode layer 115b are formed is heated at lower than 100° C.; a sputtering gas containing high-purity oxygen and a halogen element from which hydrogen and moisture are removed is introduced; and a silicon semiconductor target is used.

Next, heat treatment is performed at 100° C. to 400° C. in the state where the oxide insulating layer 116 and the oxide semiconductor layer 121 are in contact with each other and the interface therebetween has the halogen element 133. By this heat treatment, hydrogen or moisture included in the oxide semiconductor layer 121 can be diffused into the oxide insulating layer 116 with use of the halogen element. Due to the halogen element which is present at the interface, an impurity such as hydrogen, hydroxyl, or moisture included in the island-shaped oxide semiconductor layer 121 is diffused into the oxide insulating layer 116 through the interface between the oxide semiconductor layer 121 and the oxide insulating layer 116. Specifically, a hydrogen atom, a compound containing a hydrogen atom such as $H_2O$, or a compound containing a carbon atom in the oxide semiconductor layer 121 is easily diffused into the oxide insulating layer 116.

Next, the protective insulating layer 103 is formed over the oxide insulating layer 116. As the protective insulating layer 103, a silicon nitride film, a silicon nitride oxide film, an aluminum nitride film, or the like is used. As the protective insulating layer 103, a silicon nitride film is formed by heating the substrate 100 over which layers up to the oxide insulating layer 116 are formed, to a temperature of 100° C. to 400° C., introducing a sputtering gas containing high-purity nitrogen from which hydrogen and moisture are removed, and using a target of a silicon semiconductor.

Through the above steps, an impurity such as hydrogen or moisture is eliminated, and the concentration of the impurity such as hydrogen or moisture is reduced as much as possible, whereby generation of parasitic channel on the back channel side, i.e., in a superficial portion of the oxide semiconductor layer can be suppressed.

Figure 4D:
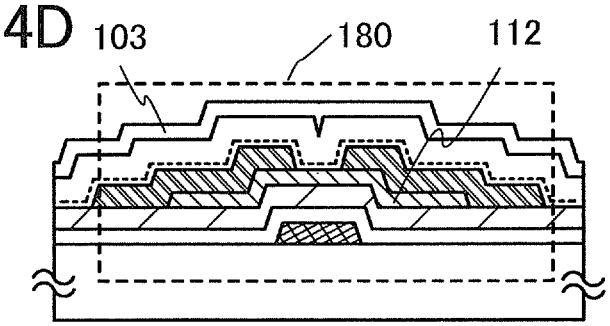

Therefore, the thin film transistor 180 including the oxide semiconductor layer 112 in which the concentration of hydrogen and hydride is reduced can be manufactured (see FIG. 4D).

By provision of a halogen element at the interface between the oxide insulating layer 116 and the oxide semiconductor layer 112, an impurity containing a hydrogen atom such as hydrogen, hydroxyl, or moisture in the oxide semiconductor layer 112 can be diffused into the oxide insulating layer 116 due to the halogen element, so that the impurity concentration in the oxide semiconductor layer 112, which is a factor of varying characteristics, can be reduced.

In the above-described manner, a highly reliable semiconductor device with stable electric characteristics including a thin film transistor in which an oxide semiconductor layer is used can be provided.

This embodiment can be implemented in combination with any of the other embodiments as appropriate.

Embodiment 5

In this embodiment, another example of a thin film transistor applicable to a semiconductor device disclosed in this specification will be described.

In this embodiment, one embodiment of a semiconductor device and a method for manufacturing the semiconductor device will be described with reference to FIGS. 5A to 5E.

FIGS. 5A to 5E illustrate an example of a cross-sectional structure of a semiconductor device. A thin film transistor 160 illustrated in FIGS. 5A to 5E is a kind of bottom-gate structure called a channel-protective type (channel-stop type) and is also called an inverted staggered thin film transistor.

In order to suppress variation in electric characteristics of the thin film transistor in which the oxide semiconductor layer is used, an impurity such as hydrogen, moisture, hydroxyl, or hydride (also referred to as a hydrogen compound) which is a factor of the variation is eliminated from the interface between the oxide semiconductor layer and the oxide insulating layer (a silicon oxide layer) provided in contact with the oxide semiconductor layer. Specifically, the interface between the oxide semiconductor layer and the oxide insulating layer provided in contact with the oxide semiconductor layer has a hydrogen concentration of $5\times10^{19}$ atoms/$cm^3$ or lower, preferably $1\times10^{19}$ atoms/$cm^3$ or lower.

An impurity such as hydrogen or moisture (e.g., a hydrogen atom or a compound containing a hydrogen atom such as H₂O) is eliminated from the oxide semiconductor layer with use of a halogen element typified by fluorine or chlorine, so that the impurity concentration in the oxide semiconductor layer is reduced.

The gate insulating layer and the oxide insulating layer which are provided in contact with the oxide semiconductor layer can be formed to contain a halogen element. In addition, a halogen element may be attached to the oxide semiconductor layer through plasma treatment under an atmosphere of a gas containing a halogen element. At least one of the above methods for making a halogen element be contained in a semiconductor device (making a halogen element be contained in the gate insulating layer during deposition, making a halogen element be contained in the oxide insulating layer during deposition, and making a halogen element be attached to the interface between the oxide insulating layer and the oxide semiconductor layer through plasma treatment) may be used, and needless to say, a plurality of the above methods may be used.

In the case where the gate insulating layer and the oxide insulating layer contain a halogen element, the concentration of the halogen element in the gate insulating layer and the oxide insulating layer may be approximately $5 \times 10^{18}$ atoms/cm$^3$ to $1 \times 10^{20}$ atoms/cm$^3$.

By at least one of the above methods, an impurity such as hydrogen, moisture, hydroxyl, or hydride included in the oxide semiconductor layer is diffused into the gate insulating layer and/or the oxide insulating layer with use of a halogen element, so that the impurity concentration in the oxide semiconductor layer is reduced.

The thin film transistor 160 is described using a single-gate thin film transistor; a multi-gate thin film transistor including a plurality of channel formation regions can be formed when needed.

A process for forming the thin film transistor 160 over a substrate 150 is described below with reference to FIGS. 5A to 5E.

First, a conductive film is formed over the substrate 150 having an insulating surface, and then, a gate electrode layer 151 is formed through a first photolithography step and an etching step. Note that a resist mask may be formed by an inkjet method. Formation of the resist mask by an inkjet method needs no photomask; thus, manufacturing cost can be reduced.

The gate electrode layer 151 can be formed to have a single-layer structure or a stacked-layer structure using a metal material such as molybdenum, titanium, chromium, tantalum, tungsten, aluminum, copper, neodymium, or scandium, or an alloy material which contains any of these materials as its main component.

Next, a gate insulating layer 154 and a gate insulating layer 152 are formed over the gate electrode layer 151. As the gate insulating layer 152, an oxide insulating layer containing a halogen element may be formed.

A halogen element may be introduced into a deposition gas (a sputtering gas) during deposition so as to be contained in the gate insulating layer. Alternatively, a halogen element remaining in a treatment chamber due to cleaning treatment in the previous step may be contained in the gate insulating layer. Further alternatively, a halogen element may be added to the gate insulating layer and the oxide insulating layer after deposition.

As a deposition gas (a sputtering gas) containing a halogen element which is introduced during deposition, NF₃ or the like can be used. With use of a gas containing a halogen element such as NF₃ described above for cleaning treatment on a treatment chamber for deposition, the gate insulating layer can be formed to contain a halogen element such as fluorine remaining in the treatment chamber.

In this embodiment, a silicon nitride layer is formed as the gate insulating layer 154 by a sputtering method, and a silicon oxide layer is formed as the gate insulating layer 152 by a sputtering method.

Next, an oxide semiconductor film is formed over the gate insulating layer 152, and is processed into an island-shaped oxide semiconductor layer 171 by a second photolithography step and an etching step. In this embodiment, the oxide semiconductor film is formed using an In—Ga—Zn—O-based oxide semiconductor target by a sputtering method.

The substrate is held in a treatment chamber which is kept in a reduced-pressure state, and the substrate is heated at lower than 400° C. Then, a sputtering gas from which hydrogen and moisture are removed is introduced into the treatment chamber from which remaining moisture is being removed, and an oxide semiconductor film is deposited over the substrate 150 with use of a metal oxide as a target. In order to remove remaining moisture in the treatment chamber, an entrapment vacuum pump is preferably used. For example, a cryopump, an ion pump, or a titanium sublimation pump is preferably used. The evacuation unit may be a turbo molecular pump provided with a cold trap. In the deposition chamber which is evacuated with the cryopump, a hydrogen atom, a compound containing a hydrogen atom such as H₂O, a compound containing a carbon atom, and the like are removed, whereby the impurity concentration in the oxide semiconductor film formed in the deposition chamber can be reduced.

As one example of the deposition condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulse-direct current (DC) power source is preferable because dust can be reduced and the film thickness can be uniform. The thickness of the oxide semiconductor film is preferably greater than or equal to 5 nm and less than or equal to 30 nm Note that an appropriate thickness differs depending on an oxide semiconductor material, and the thickness may be set as appropriate depending on the material.

The oxide semiconductor layer 171 may be subjected to plasma treatment under an atmosphere of a gas containing a halogen element so that a halogen element such as fluorine or chlorine is attached to the oxide semiconductor layer 171.

Figure 5A:
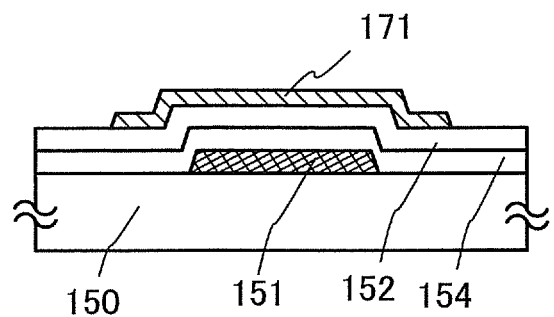
FIGS. 5A to 5E illustrate a semiconductor device and a method for manufacturing the semiconductor device.
Figure 5B:
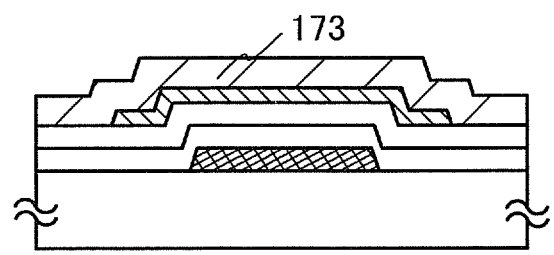
Figure 5C:
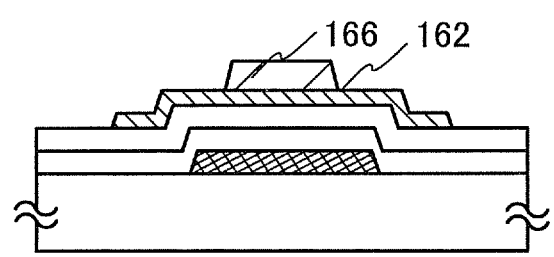

Next, an oxide insulating layer 173 is formed over the gate insulating layer 152 and the oxide semiconductor layer 171 (see FIG. 5B).

As the oxide insulating layer 173, a silicon oxide layer is formed in the following manner: the substrate 150 over which layers up to the island-shaped oxide semiconductor layer 171 are formed is heated at lower than 100° C.; a sputtering gas containing high-purity oxygen from which hydrogen and moisture are removed is introduced; and a silicon semiconductor target is used.

In order to suppress variation in electric characteristics of the thin film transistor in which the oxide semiconductor layer is used, in this embodiment, an oxide insulating layer containing a halogen element is formed as the oxide insulating layer 173.

A halogen element may be introduced into a deposition gas (a sputtering gas) during deposition so as to be contained in the oxide insulating layer 173. Alternatively, a halogen element remaining in a treatment chamber due to cleaning treatment in the previous step may be contained in the oxide insulating layer 173. Further alternatively, a halogen element may be added to the gate insulating layer and the oxide insulating layer after deposition.

As a deposition gas (a sputtering gas) containing a halogen element which is introduced during deposition, $NF_3$ or the like can be used. With use of a gas containing a halogen element such as $NF_3$ described above for cleaning treatment on a treatment chamber for deposition, the oxide insulating layer 173 can be formed to contain a halogen element such as fluorine remaining in the treatment chamber.

The oxide insulating layer 173 preferably includes many oxygen dangling bonds as defects because hydrogen or an impurity containing hydrogen is more likely to be diffused into the oxide insulating layer 173 from the oxide semiconductor layer 171.

For example, the oxide insulating layer 173 is formed by a pulse DC sputtering method under the following condition: a boron-doped silicon target having a purity of 6N (99.9999%) (resistivity: 0.01 Ωcm) is used; the distance between the target and the substrate (the T-S distance) is 89 mm; the pressure is 0.4 Pa; the direct-current (DC) power source is 6 kW; and the atmosphere is an oxygen atmosphere (the proportion of the oxygen flow rate is 100%). The film thickness is 300 nm Note that instead of a silicon target, quartz (preferably, synthetic quartz) can be used as the target for forming the oxide insulating layer 173. Although the oxide insulating layer 173 may be formed in the state where the substrate 150 is heated, the oxide insulating layer 173 is preferably formed at 0° C.° to about 50° C., more preferably room temperature, so that the oxide insulating layer 173 includes defects.

In that case, remaining moisture in the treatment chamber is preferably removed in the deposition of the oxide insulating layer 173. This is for preventing hydrogen, hydroxyl, or moisture from being contained in the oxide semiconductor layer 171 and the oxide insulating layer 173.

Note that as the oxide insulating layer 173, a silicon oxynitride layer, an aluminum oxide layer, an aluminum oxynitride layer, or the like may be used instead of the silicon oxide layer.

Next, heat treatment is performed at 100° C. to 400° C. in the state where the oxide semiconductor layer 171 and the oxide insulating layer 173 containing a halogen element are in contact with each other. By this heat treatment, hydrogen or moisture included in the oxide semiconductor layer 171 can be diffused into the oxide insulating layer 173 containing a halogen element. Since the oxide insulating layer 173 contains a halogen element, an impurity such as hydrogen, hydroxyl, or moisture included in the island-shaped oxide semiconductor layer 171 is diffused into the oxide insulating layer 173 through the interface between the oxide semiconductor layer 171 and the oxide insulating layer 173. Specifically, a hydrogen atom, a compound containing a hydrogen atom such as $H_2O$, or a compound containing a carbon atom in the oxide semiconductor layer 171 is easily diffused into the oxide insulating layer 173.

An oxide semiconductor layer 162 in which the concentration of hydrogen and hydroxyl is reduced can be formed. Specifically, the interface between the oxide semiconductor layer 162 and the oxide insulating layer 173 has a hydrogen concentration of $5 \times 10^{19}$ atoms/cm$^3$ or lower, preferably $1 \times 10^{19}$ atoms/cm$^3$ or lower.

A third photolithography step is performed. A resist mask is formed over the oxide insulating layer 173, and selective etching is performed to form an oxide insulating layer 166; after that, the resist mask is removed (see FIG. 5C).

Next, a conductive film is formed over the gate insulating layer 154, the gate insulating layer 152, the oxide semiconductor layer 162, and the oxide insulating layer 166. After that, in a fourth photolithography step, a resist mask is formed, and selective etching is performed to form a source electrode layer 165a and a drain electrode layer 165b. Then, the resist mask is removed (see FIG. 5D).

As a material of the source electrode layer 165a and the drain electrode layer 165b, an element selected from Al, Cr, Cu, Ta, Ti, Mo, or W; an alloy containing any of these elements as a component; an alloy film containing any of these elements in combination; and the like can be given. Further, the metal conductive film may have a single-layer structure or a stacked-layer structure of two or more layers.

Figure 5D:
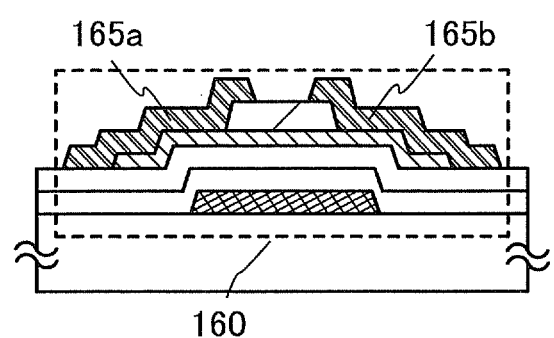
Figure 5E:
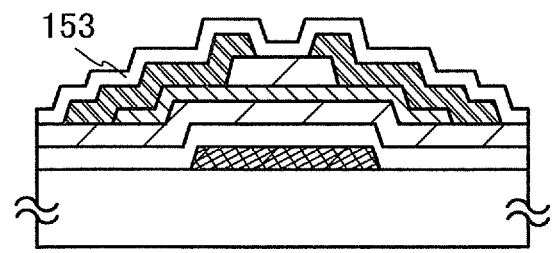

Though the above steps, the thin film transistor 160 including the oxide semiconductor layer 162 in which the concentration of hydrogen and hydride is reduced can be manufactured (see FIG. 5D).

When the oxide semiconductor film is formed in the above manner, remaining moisture in a reaction atmosphere is removed; thus, the concentration of hydrogen and hydride in the oxide semiconductor film can be reduced. Thus, the oxide semiconductor film can be stabilized.

A protective insulating layer may be provided over the oxide insulating layer. In this embodiment, a protective insulating layer 153 is provided over the oxide insulating layer 166, the source electrode layer 165a, and the drain electrode layer 165b. As the protective insulating layer 153, a silicon nitride film, a silicon nitride oxide film, an aluminum nitride film, or the like is used. In this embodiment, the protective insulating layer 153 is formed using a silicon nitride film (see FIG. 5E).

An oxide insulating layer may be further formed over the source electrode layer 165a, the drain electrode layer 165b, and the oxide insulating layer 166, and the protective insulating layer 153 may be stacked over the oxide insulating layer. Further, a planarization insulating layer may be formed over the protective insulating layer 153.

When the silicon nitride layer is formed over the silicon insulating layer in the state where the substrate is heated, hydrogen or moisture can be further diffused from the oxide semiconductor layer into the oxide insulating layer, and at the same time, the barrier film for prevention of entry of moisture from an outer atmosphere can be provided.

When the oxide semiconductor layer serving as the channel formation region is formed over the gate insulating layer, remaining moisture in a reaction atmosphere is removed; thus, the concentration of hydrogen and hydride in the oxide semiconductor layer can be reduced. By provision of the insulating layer containing a halogen element in contact with the oxide semiconductor layer, hydrogen or moisture in the oxide semiconductor layer can be diffused into the insulating layer containing a halogen element, so that the concentration of hydrogen and hydride in the oxide semiconductor layer can be reduced.

This embodiment can be implemented in combination with any of the other embodiments as appropriate.

In the above-described manner, a highly reliable semiconductor device with stable electric characteristics including a thin film transistor in which an oxide semiconductor layer is used can be provided.

Embodiment 6

In this embodiment, another example of a thin film transistor which can be applied to a semiconductor device disclosed in this specification will be described.

In this embodiment, one embodiment of a semiconductor device and a method for manufacturing the semiconductor device will be described with reference to FIGS. 6A to 6C.

In order to suppress variation in electric characteristics of the thin film transistor in which the oxide semiconductor layer is used, an impurity such as hydrogen, moisture, hydroxyl, or hydride (also referred to as a hydrogen compound) which is factor of the variation is eliminated from the interface between the oxide semiconductor layer and the oxide insulating layer (a silicon oxide layer) provided in contact with the oxide semiconductor layer. Specifically, the interface between the oxide semiconductor layer and the oxide insulating layer provided in contact with the oxide semiconductor layer has a hydrogen concentration of $5 \times 10^{19}$ atoms/cm$^3$ or lower, preferably $1 \times 10^{19}$ atoms/cm$^3$ or lower.

An impurity such as hydrogen or moisture (e.g., a hydrogen atom or a compound containing a hydrogen atom such as H$_2$O) is eliminated from the oxide semiconductor layer with use of a halogen element typified by fluorine or chlorine, so that the impurity concentration in the oxide semiconductor layer is reduced.

The gate insulating layer and the oxide insulating layer which are provided in contact with the oxide semiconductor layer can be formed to contain a halogen element. In addition, a halogen element may be attached to the oxide semiconductor layer through plasma treatment under an atmosphere of a gas containing a halogen element. At least one of the above methods for making a halogen element be contained in a semiconductor device (making a halogen element be contained in the gate insulating layer during deposition, making a halogen element be contained in the oxide insulating layer during deposition, and making a halogen element be attached to the interface between the oxide insulating layer and the oxide semiconductor layer through plasma treatment) may be used, and needless to say, a plurality of the above methods may be used.

In the case where the gate insulating layer and the oxide insulating layer contain a halogen element, the concentration of the halogen element in the gate insulating layer and the oxide insulating layer may be approximately $5 \times 10^{18}$ atoms/cm$^3$ to $1 \times 10^{20}$ atoms/cm$^3$.

By at least one of the above methods, an impurity such as hydrogen, moisture, hydroxyl, or hydride included in the oxide semiconductor layer is diffused into the gate insulating layer and/or the oxide insulating layer with use of a halogen element, so that the impurity concentration in the oxide semiconductor layer is reduced.

A thin film transistor 190 is described using a single-gate thin film transistor; a multi-gate thin film transistor including a plurality of channel formation regions can be formed when needed.

A process for forming the thin film transistor 190 over a substrate 140 is described below with reference to FIGS. 6A to 6C.

First, a conductive film is formed over the substrate 140 having an insulating surface, and then, a gate electrode layer 181 is formed through a first photolithography step and an etching step. In this embodiment, a tungsten film with a thickness of 150 nm is formed using a sputtering method as the gate electrode layer 181.

Next, a gate insulating layer 143 and a gate insulating layer 142 are formed over the gate electrode layer 181. As the gate insulating layer 142, an oxide insulating layer containing a halogen element may be formed.

A halogen element may be introduced into a deposition gas (a sputtering gas) during deposition so as to be contained in the gate insulating layer. Alternatively, a halogen element remaining in a treatment chamber due to cleaning treatment in the previous step may be contained in the gate insulating layer. Further alternatively, a halogen element may be added to the gate insulating layer and the oxide insulating layer after deposition.

As a deposition gas (a sputtering gas) containing a halogen element which is introduced during deposition, NF$_3$ or the like can be used. With use of a gas containing a halogen element such as NF$_3$ described above for cleaning treatment on a treatment chamber for deposition, the gate insulating layer can be formed to contain a halogen element such as fluorine remaining in the treatment chamber.

In this embodiment, by a plasma CVD method, a silicon nitride layer is formed as the gate insulating layer 143 and a silicon oxide layer is formed as the gate insulating layer 142.

Next, a conductive film is formed over the gate insulating layer 142. After that, in a second photolithography step, a resist mask is formed over the conductive film, and selective etching is performed to form a source electrode layer 195a and a drain electrode layer 195b. Then, the resist mask is removed.

Figure 6A:
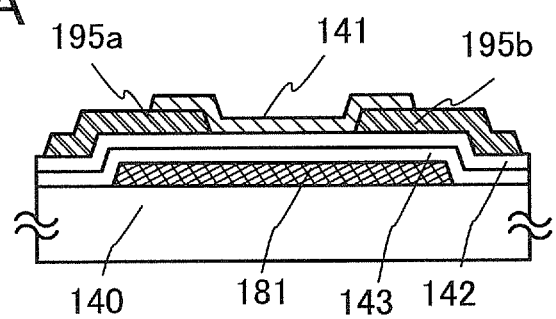
FIGS. 6A to 6C illustrate a semiconductor device and a method for manufacturing the semiconductor device.
Figure 6B:
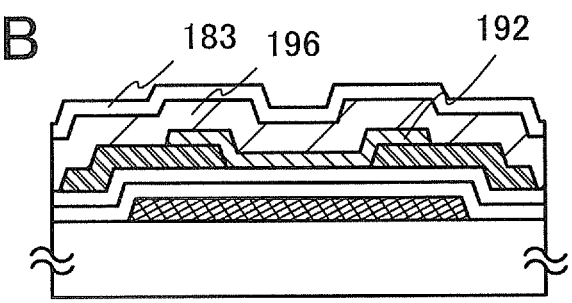

Next, an oxide semiconductor film is formed and processed into an island-shaped oxide semiconductor layer 141 in a third photolithography step and an etching step (see FIG. 6A). In this embodiment, the oxide semiconductor film is formed using an In—Ga—Zn—O-based oxide semiconductor target by a sputtering method.

The substrate is held in a treatment chamber which is kept in a reduced-pressure state, and the substrate is heated at lower than 400° C. Then, a sputtering gas from which hydrogen and moisture are removed is introduced into the treatment chamber from which remaining moisture is being removed, and an oxide semiconductor film is deposited over the substrate 140 with use of a metal oxide as a target. In order to remove remaining moisture in the treatment chamber, an entrapment vacuum pump is preferably used. For example, a cryopump, an ion pump, or a titanium sublimation pump is preferably used. The evacuation unit may be a turbo molecular pump provided with a cold trap. In the deposition chamber which is evacuated with the cryopump, a hydrogen atom, a compound containing a hydrogen atom such as H$_2$O, a compound containing a carbon atom, and the like are removed, whereby the impurity concentration in the oxide semiconductor film formed in the deposition chamber can be reduced.

As one example of the deposition condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulse direct-current (DC) power source is preferable because dust can be reduced and the film thickness can be uniform. The thickness of the oxide semiconductor film is preferably greater than or equal to 5 nm and less than or equal to 30 nm Note that an appropriate thickness differs depending on an oxide semiconductor material, and the thickness may be set as appropriate depending on the material.

The oxide semiconductor layer 141 may be subjected to plasma treatment under an atmosphere of a gas containing a halogen element such as fluorine or chlorine so that a halogen element such as fluorine or chlorine is attached to the oxide semiconductor layer 141.

Then, an oxide insulating layer 196 is formed over the gate insulating layer 142, the oxide semiconductor layer 141, the source electrode layer 195a, and the drain electrode layer 195b.

As the oxide insulating layer 196, a silicon oxide layer is formed in the following manner: the substrate 140 over which layers up to an island-shaped oxide semiconductor layer 192 are formed is heated at lower than 100° C.; a sputtering gas containing high-purity oxygen from which hydrogen and moisture are removed is introduced; and a silicon semiconductor target is used.

In order to suppress variation in electric characteristics of the thin film transistor in which the oxide semiconductor layer is used, in this embodiment, an oxide insulating layer containing a halogen element (a silicon oxide layer containing fluorine) is formed as the oxide insulating layer 196.

A halogen element may be introduced into a deposition gas (a sputtering gas) during deposition so as to be contained in the oxide insulating layer 196. Alternatively, a halogen element remaining in a treatment chamber due to cleaning treatment in the previous step may be contained in the oxide insulating layer 196. Further alternatively, a halogen element may be added to the gate insulating layer and the oxide insulating layer after deposition.

As a deposition gas (a sputtering gas) containing a halogen element which is introduced during deposition, $NF_3$ or the like can be used. With use of a gas containing a halogen element such as $NF_3$ described above for cleaning treatment on a treatment chamber for deposition, the oxide insulating layer 196 can be formed to contain a halogen element such as fluorine remaining in the treatment chamber.

The oxide insulating layer 196 preferably includes many oxygen dangling bonds as defects because hydrogen or an impurity containing hydrogen is more likely to be diffused into the oxide insulating layer 196 from the oxide semiconductor layer 141.

For example, the oxide insulating layer 196 is formed by a pulse DC sputtering method under the following condition: a boron-doped silicon target having a purity of 6N (99.9999%) (resistivity: 0.01 Ωcm) is used; the distance between the target and the substrate (the T-S distance) is 89 mm; the pressure is 0.4 Pa; the direct-current (DC) power source is 6 kW; and the atmosphere is an oxygen atmosphere (the proportion of the oxygen flow rate is 100%). The film thickness is 300 nm Note that instead of a silicon target, quartz (preferably, synthetic quartz) can be used as the target for forming the oxide insulating layer 196. Although the oxide insulating layer 196 may be formed in the state where the substrate 140 is heated, the oxide insulating layer 196 is preferably formed at 0° C.° to about 50° C., more preferably room temperature, so that the oxide insulating layer 196 includes defects.

In that case, remaining moisture in the treatment chamber is preferably removed in the deposition of the oxide insulating layer 196. This is for preventing hydrogen, hydroxyl, or moisture from being contained in the oxide semiconductor layer 141 and the oxide insulating layer 196.

Note that as the oxide insulating layer 196, a silicon oxynitride layer, an aluminum oxide layer, an aluminum oxynitride layer, or the like may be used instead of the silicon oxide layer.

Next, a protective insulating layer 183 is formed over the oxide insulating layer 196. As the protective insulating layer 183, a silicon nitride film, a silicon nitride oxide film, an aluminum nitride film, or the like is used. As the protective insulating layer 183, a silicon nitride film is formed by heating the substrate 140 over which layers up to the oxide insulating layer 196 are formed, to a temperature of 100° C. to 400° C., introducing a sputtering gas containing high-purity nitrogen from which hydrogen and moisture are removed, and using a target of a silicon semiconductor.

The substrate 140 is heated to a temperature of 100° C. to 400° C. at the time of deposition of the protective insulating layer 183, whereby hydrogen or moisture included in the oxide semiconductor layer can be diffused into the oxide insulating layer 196 containing a halogen element. Since the oxide insulating layer 196 contains a halogen element, an impurity such as hydrogen, hydroxyl, or moisture included in the island-shaped oxide semiconductor layer 141 is diffused into the oxide insulating layer 196 containing a halogen element through the interface between the oxide semiconductor layer 141 and the oxide insulating layer 196 containing a halogen element. Specifically, a hydrogen atom, a compound containing a hydrogen atom such as $H_2O$, or a compound containing a carbon atom in the oxide semiconductor layer 141 is easily diffused into the oxide insulating layer 196 containing a halogen element.

Figure 6C:
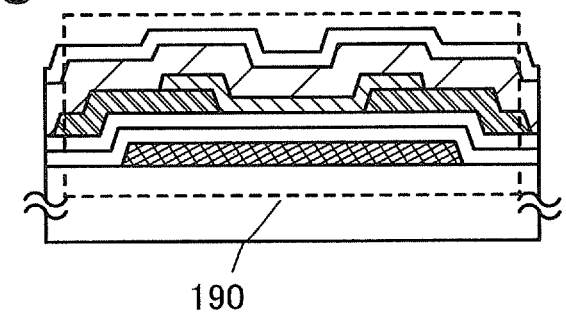

Through the above steps, the thin film transistor 190 including the oxide semiconductor layer 192 in which the concentration of hydrogen and hydride is reduced can be manufactured (see FIG. 6C). Specifically, the interface between the oxide semiconductor layer 141 and the oxide insulating layer 196 has a hydrogen concentration of $5 \times 10^{19}$ atoms/cm$^3$ or lower, preferably $1 \times 10^{19}$ atoms/cm$^3$ or lower.

This embodiment can be implemented in combination with any of the other embodiments as appropriate.

In the above-described manner, a highly reliable semiconductor device with stable electric characteristics including a thin film transistor in which an oxide semiconductor layer is used can be provided.

Embodiment 7

In this embodiment, an example of a thin film transistor which can be applied to a semiconductor device disclosed in this specification will be described.

In this embodiment, an example of using a conductive material having a light-transmitting property for a gate electrode layer, a source electrode layer, and a drain electrode layer will be described. Therefore, part of this embodiment can be performed in a manner similar to that of the above embodiments, and repetitive description of the same portions as or portions having functions similar to those in the above embodiments and steps for manufacturing such portions will be omitted. In addition, detailed description of the same portions is not repeated.

For example, materials of the gate electrode layer, the source electrode layer, and the drain electrode layer can be a conductive material that transmits visible light, and any of the following metal oxides can be applied for example: an In—Sn—O-based metal oxide, an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. The thickness thereof can be set in the range of greater than or equal to 50 nm and less than or equal to 300 nm, as appropriate. As a deposition method of the metal oxide used for the gate electrode layer, the source electrode layer, and the drain electrode layer, a sputtering method, a vacuum evaporation method (an electron beam evaporation method or the like), an arc discharge ion plating method, or a spray method is used. When a sputtering method is employed, it is preferable that deposition be performed using a target including $SiO_2$ at greater than or equal to 2 wt % and less than or equal to 10 wt %, so that SiO$_x$ (x>0) which inhibits crystallization is contained in the light-transmitting conductive film; in this way, the oxide semiconductor can be prevented from being crystallized in heat treatment performed later.

Note that the unit of the percentage of components in the light-transmitting conductive film is atomic percent, and the percentage of components is evaluated by analysis using an electron probe X-ray microanalyzer (EPMA).

In a pixel provided with a thin film transistor, when a pixel electrode layer, another electrode layer (such as a capacitor electrode layer), or a wiring layer (such as a capacitor wiring layer) is formed using a conductive film that transmits visible light, a display device having high aperture ratio can be realized. Needless to say, it is preferable that a gate insulating layer, an oxide insulating layer, a protective insulating layer, and a planarization insulating layer in the pixel be also each formed using a film that transmits visible light.

In this specification, a film that transmits visible light means a film having such a thickness as to have transmittance of visible light of 75% to 100%. In the case where the film has conductivity, the film is also referred to as a transparent conductive film. Further, a conductive film which is semi-transmissive with respect to visible light may be used for metal oxide applied to the gate electrode layer, the source electrode layer, the drain electrode layer, the pixel electrode layer, another electrode layer, or another wiring layer. The conductive film which is semi-transmissive with respect to visible light indicates a film having transmittance of visible light of 50% to 75%.

When a thin film transistor has a light-transmitting property, the aperture ratio can be increased. For small liquid crystal display panels of 10 inches or smaller in particular, a high aperture ratio can be achieved even when the size of pixels is decreased in order to realize higher resolution of display images by increasing the number of gate wirings, for example. Further, by using a film having a light-transmitting property for components of a thin film transistor, a high aperture ratio can be achieved even when one pixel is divided into a plurality of sub-pixels in order to realize a wide viewing angle. That is, a high aperture ratio can be maintained even when a group of high-density thin film transistors is provided, so that a sufficient area of a display region can be secured. For example, in the case where one pixel includes two to four sub-pixels, an aperture ratio can be improved because the thin film transistor has a light-transmitting property. Further, a storage capacitor may be formed using the same material by the same step as the component in the thin film transistor so that the storage capacitor can have a light-transmitting property, whereby the aperture ratio can be further improved.

This embodiment can be implemented in combination with any of the other embodiments as appropriate.

Embodiment 8

In this embodiment, an example of a thin film transistor which can be applied to a semiconductor device disclosed in this specification will be described.

Figure 7:
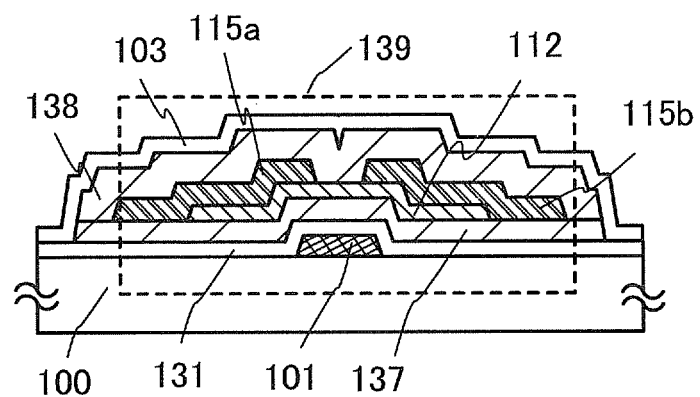
FIG. 7 illustrates a semiconductor device.

In this embodiment, an example in which an oxide semiconductor layer is surrounded by nitride insulating layers when seen in cross section will be described with reference to FIG. 7. FIG. 7 is the same as FIG. 23 except the top surface shape of the oxide insulating layers, the positions of end portions of the oxide insulating layers, and the structure of the gate insulating layer. Thus, the same portions will be denoted by the same reference numerals and the detailed description of the same portions will be omitted.

A thin film transistor 139 illustrated in FIG. 7 is a bottom-gate thin film transistor and includes a gate electrode layer 101, a gate insulating layer 131 formed using a nitride insulating layer, a gate insulating layer 137 formed using an oxide insulating layer containing a halogen element, an oxide semiconductor layer 112, a source electrode layer 115a, and a drain electrode layer 115b over a substrate 100 having an insulating surface. Further, an oxide insulating layer 138 containing a halogen element, which covers the thin film transistor 139 and is in contact with a channel formation region of the oxide semiconductor layer 112, is provided. A protective insulating layer 103 formed using a nitride insulating layer is further provided over the oxide insulating layer 138. The protective insulating layer 103 is in contact with the gate insulating layer 131 formed using a nitride insulating layer.

In the thin film transistor 139 in this embodiment, the gate insulating layer has a stacked-layer structure in which the nitride insulating layer and the oxide insulating layer are stacked over the gate electrode layer. Further, before the protective insulating layer 103 formed using a nitride insulating layer is formed, the oxide insulating layer 138 formed using an oxide insulating layer and the gate insulating layer 137 which contain a halogen element are selectively removed to expose the gate insulating layer 131 formed using a nitride insulating layer.

At least the area of the top surface of the oxide insulating layer 138 and that of the top surface of the gate insulating layer 137 are larger than that of the top surface of the oxide semiconductor layer 112, and the top surface of the oxide insulating layer 138 and the top surface of the gate insulating layer 137 preferably cover the thin film transistor 139.

Further, the protective insulating layer 103 formed using a nitride insulating layer covers the top surface of the oxide insulating layer 138 and the side surfaces of the oxide insulating layer 138 and the gate insulating layer 137, and is in contact with the gate insulating layer 131 formed using a nitride insulating layer.

For the protective insulating layer 103 and the gate insulating layer 131 which are each formed using a nitride insulating layer, an inorganic insulating film which does not contain an impurity such as moisture, a hydrogen ion, or OH$^-$ and blocks entry of the impurity from the outside is used: for example, a silicon nitride film, a silicon oxynitride film, an aluminum nitride film, or an aluminum oxynitride film obtained by a sputtering method or a plasma CVD method is used.

In this embodiment, as the protective insulating layer 103 formed using a nitride insulating layer, a silicon nitride layer having a thickness of 100 nm is formed by an RF sputtering method so as to cover the bottom surface, the top surface, and the side surfaces of the oxide semiconductor layer 112.

With the structure illustrated in FIG. 7, an impurity such as hydrogen, moisture, hydroxyl, or hydride in the oxide semiconductor layer is reduced due to the gate insulating layer 137 containing a halogen element and the oxide insulating layer 138 containing a halogen element which are provided to surround and be in contact with the oxide semiconductor layer, and entry of moisture from the outside in a manufacturing process after formation of the protective insulating layer 103 can be prevented because the oxide semiconductor layer is surrounded by the gate insulating layer 131 and the protective insulating layer 103 which are each formed using a nitride insulating layer. Moreover, entry of moisture from the outside can be prevented in the long term even after the device is completed as a semiconductor device, for example, as a display device; thus, the long-term reliability of the device can be improved.

In this embodiment, the structure in which one thin film transistor is covered with a nitride insulating layer is described; however, one embodiment of the present invention is not limited this structure. A plurality of thin film transistors may be covered with a nitride insulating layer, or a plurality of thin film transistors in a pixel portion may be collectively covered with a nitride insulating layer. A region where the protective insulating layer 103 and the gate insulating layer 131 are in contact with each other may be formed so that at least the pixel portion of the active matrix substrate is surrounded.

This embodiment can be implemented in combination with any of the other embodiments as appropriate.

Embodiment 9

In this embodiment, an example is described in which an active matrix light-emitting display device is manufactured using a thin film transistor and a light-emitting element utilizing electroluminescence in the semiconductor devices described in any of Embodiments 1 to 8.

Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. Then, the carriers (electrons and holes) recombine, so that the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission which utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made in this embodiment using an organic EL element as a light-emitting element.

Figure 8:
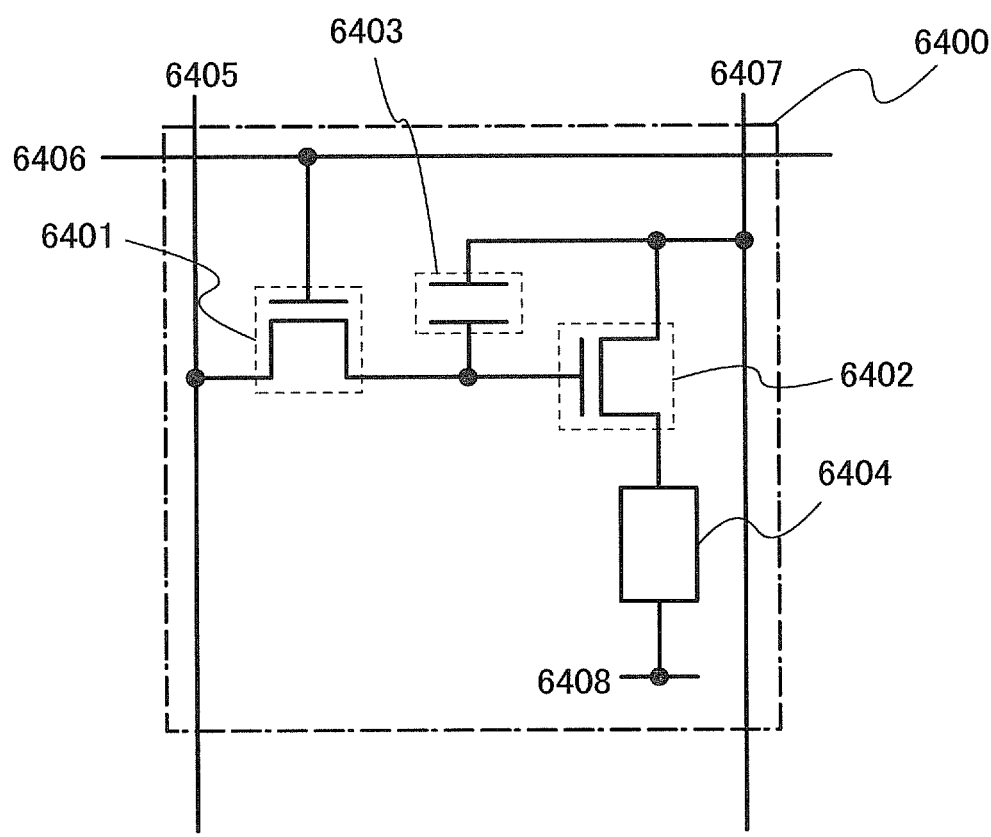
FIG. 8 illustrates a pixel equivalent circuit of a semiconductor device.

FIG. 8 illustrates an example of a pixel configuration to which digital time grayscale driving can be applied as an example of the semiconductor device.

The configuration and operation of a pixel to which digital time grayscale driving can be applied will be described. An example is described in this embodiment in which one pixel includes two n-channel transistors using an oxide semiconductor layer in a channel formation region.

A pixel 6400 includes a switching transistor 6401, a driving transistor 6402, a light-emitting element 6404, and a capacitor 6403. In the switching transistor 6401, a gate thereof is connected to a scan line 6406, a first electrode thereof (one of source and drain electrodes) is connected to a signal line 6405, and a second electrode thereof (the other of the source and drain electrodes) is connected to a gate of the driving transistor 6402. In the driving transistor 6402, the gate thereof is connected to a power supply line 6407 through the capacitor 6403, a first electrode thereof is connected to the power supply line 6407, and a second electrode thereof is connected to a first electrode (pixel electrode) of the light-emitting element 6404. A second electrode of the light-emitting element 6404 corresponds to a common electrode 6408. The common electrode 6408 is electrically connected to a common potential line provided over the same substrate.

Note that the second electrode (common electrode 6408) of the light-emitting element 6404 is set to a low power supply potential. Note that the low power supply potential is a potential satisfying the low power supply potential<a high power supply potential with reference to the high power supply potential that is set on the power supply line 6407. As the low power supply potential, GND, 0 V, or the like may be employed, for example. The difference between the high power supply potential and the low power supply potential is applied to the light-emitting element 6404 so that current flows through the light-emitting element 6404, whereby the light-emitting element 6404 emits light. Thus, each potential is set so that the difference between the high power supply potential and the low power supply potential is greater than or equal to a forward threshold voltage of the light-emitting element 6404.

When the gate capacitance of the driving transistor 6402 is used as a substitute for the capacitor 6403, the capacitor 6403 can be omitted. The gate capacitance of the driving transistor 6402 may be formed between the channel region and the gate electrode.

In the case of using a voltage-input voltage driving method, a video signal is input to the gate of the driving transistor 6402 so that the driving transistor 6402 is in either of two states of being sufficiently turned on and turned off. That is, the driving transistor 6402 operates in a linear region, and thus a voltage higher than the voltage of the power supply line 6407 is applied to the gate of the driving transistor 6402. Note that a voltage higher than or equal to the following is applied to the signal line 6405: power supply line voltage+$V_{th}$ of the driving transistor 6402.

In the case of performing analog grayscale driving instead of digital time grayscale driving, the same pixel configuration as FIG. 8 can be employed by inputting signals in a different way.

In the case of performing analog grayscale driving, voltage higher than or equal to the following is applied to the gate of the driving transistor 6402: forward voltage of the light-emitting element 6404+$V_{th}$ of the driving transistor 6402. The forward voltage of the light-emitting element 6404 refers to voltage to obtain a desired luminance, and includes at least forward threshold voltage. By input of a video signal which enables the driving transistor 6402 to operate in a saturation region, it is possible to feed current to the light-emitting element 6404. In order that the driving transistor 6402 can operate in the saturation region, the potential of the power supply line 6407 is set higher than a gate potential of the driving transistor 6402. When an analog video signal is used, it is possible to feed current to the light-emitting element 6404 in accordance with the video signal and perform analog grayscale driving.

Note that the pixel configuration is not limited to that illustrated in FIG. 8. For example, the pixel illustrated in FIG. 8 may further include a switch, a resistor, a capacitor, a transistor, a logic circuit, or the like.

Next, structures of the light-emitting element will be described with reference to FIGS. 9A to 9C. Here, a cross-sectional structure of a pixel will be described by taking an n-channel driving TFT as an example. Driving TFTs 7001, 7011, and 7021 which are used for semiconductor devices of FIGS. 9A, 9B, and 9C, respectively can be manufactured in a manner similar to that of the thin film transistor described in any of Embodiments 1 to 8. In this embodiment, the thin film transistor described in Embodiment 2 or 7 is used, and a light-transmitting thin film transistor including an oxide semiconductor layer, which can be manufactured in a manner similar to that of Embodiment 2 or 7, is described as an example.

In the driving TFTs 7001, 7011, and 7021, insulating layers 7031, 7041, and 7051 containing a halogen element are respectively stacked as in Embodiment 2, and hydrogen or water in the oxide semiconductor layers is diffused into the insulating layers 7031, 7041, and 7051 through heat treatment, so that hydrogen or water in the oxide semiconductor layers is reduced. Therefore, the driving TFTs 7001, 7011, and 7021 are highly reliable thin film transistors having stable electric characteristics.

The gate insulating layer and the insulating layer which are provided in contact with the oxide semiconductor layer can be formed to contain a halogen element. In addition, a halogen element may be attached to the oxide semiconductor layer through plasma treatment under an atmosphere of a gas containing a halogen element. At least one of the above methods for making a halogen element be contained in a semiconductor device (making a halogen element be contained in the gate insulating layer during deposition, making a halogen element be contained in the insulating layer during deposition, and making a halogen element be attached to the interface between the insulating layer and the oxide semiconductor layer through plasma treatment) may be used, and needless to say, a plurality of the above methods may be used.

In order to extract light emitted from the light-emitting element, at least one of the anode and the cathode is required to transmit light. A thin film transistor and a light-emitting element are formed over a substrate. A light-emitting element can have a top emission structure in which light is extracted through the surface opposite to the substrate, a bottom emission structure in which light is extracted through the surface on the substrate side, or a dual emission structure in which light is extracted through the surface opposite to the substrate and the surface on the substrate side. The pixel configuration can be applied to a light-emitting element having any of these emission structures.

A light-emitting element having a bottom emission structure will be described with reference to FIG. 9A.

FIG. 9A is a cross-sectional view of a pixel in the case where the driving TFT 7011 is of an n-type and light is emitted from a light-emitting element 7012 to a first electrode 7013 side. In FIG. 9A, the first electrode 7013 of the light-emitting element 7012 is formed over a light-transmitting conductive film 7017 which is electrically connected to a drain electrode layer of the driving TFT 7011, and an EL layer 7014 and a second electrode 7015 are stacked in that order over the first electrode 7013.

As the light-transmitting conductive film 7017, a light-transmitting conductive film such as a film of indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added can be used.

The first electrode 7013 of the light-emitting element can be formed using various materials. For example, in the case where the first electrode 7013 is used as a cathode, a material having a low work function, for example, an alkali metal such as Li or Cs, an alkaline-earth metal such as Mg, Ca, or Sr, an alloy containing any of these (Mg: Ag, Al: Li, or the like), a rare-earth metal such as Yb or Er, or the like, is preferably used. In FIG. 9A, the thickness of the first electrode 7013 is approximately the thickness that transmits light (preferably, approximately 5 nm to 30 nm). For example, an aluminum film having a thickness of 20 nm is used for the first electrode 7013.

Note that the light-transmitting conductive film and the aluminum film may be stacked and selectively etched to form the light-transmitting conductive film 7017 and the first electrode 7013; in this case, the light-transmitting conductive film 7017 and the first electrode 7013 can be etched with the use of the same mask, which is preferable.

The peripheral portion of the first electrode 7013 is covered with a partition 7019. The partition 7019 is formed using an organic resin film such as polyimide, acrylic, polyamide, or epoxy, an inorganic insulating film, or organic polysiloxane. It is particularly preferable that the partition 7019 be formed using a photosensitive resin material to have an opening over the first electrode 7013 so that a sidewall of the opening is formed as an inclined surface with continuous curvature. In the case where a photosensitive resin material is used for the partition 7019, a step of forming a resist mask can be omitted.

The EL layer 7014 formed over the first electrode 7013 and the partition 7019 may be formed using a single layer or a plurality of layers stacked as long as it includes at least a light-emitting layer. When the EL layer 7014 is formed using a plurality of layers, the EL layer 7014 is formed by stacking an electron-injection layer, an electron-transport layer, a light-emitting layer, a hole-transport layer, and a hole-injection layer in that order over the first electrode 7013 functioning as a cathode. Note that not all of these layers need to be provided.

The stacking order is not limited to the above stacking order. The first electrode 7013 may function as an anode, and a hole-injection layer, a hole-transport layer, a light-emitting layer, an electron-transport layer, and an electron-injection layer may be stacked in that order over the first electrode 7013. However, when power consumption is compared, it is preferable that the first electrode 7013 function as a cathode and an electron-injection layer, an electron-transport layer, a light-emitting layer, a hole-transport layer, and a hole-injection layer be stacked in that order over the first electrode 7013, because an increase in voltage in the driver circuit portion can be suppressed and power consumption can be reduced.

As the second electrode 7015 formed over the EL layer 7014, various materials can be employed. For example, in the case where the second electrode 7015 is used as an anode, a material having a high work function such as ZrN, Ti, W, Ni, Pt, or Cr; or a light-transmitting conductive material such as ITO, IZO, or ZnO is preferably used. As a light-blocking film 7016 over the second electrode 7015, a metal which blocks light, a metal which reflects light, or the like is used. In this embodiment, an ITO film is used for the second electrode 7015, and a Ti film is used for the light-blocking film 7016.

The light-emitting element 7012 corresponds to a region where the EL layer 7014 including a light-transmitting layer is sandwiched between the first electrode 7013 and the second electrode 7015. In the case of the element structure illustrated in FIG. 9A, light is emitted from the light-emitting element 7012 to the first electrode 7013 side as indicated by an arrow.

Note that an example in which a light-transmitting conductive film is used as a gate electrode layer and a light-transmitting thin film is used as source and drain electrode layers is illustrated in FIG. 9A. Light emitted from the light-emitting element 7012 passes through a color filter layer 7033, and can be emitted through the substrate.

The color filter layer 7033 is formed by a droplet discharge method such as an inkjet method, a printing method, photolithography, etching, or the like.

The color filter layer 7033 is covered with an overcoat layer 7034, and also covered with a protective insulating layer 7035. Note that the overcoat layer 7034 with a small thickness is illustrated in FIG. 9A; however, the overcoat layer 7034 has a function to planarize a surface with unevenness due to the color filter layer 7033.

A contact hole which is formed in the protective insulating layer 7035, an insulating layer 7032, and the insulating layer 7031 and which reaches the drain electrode layer is provided in a portion which overlaps with the partition 7019.

Next, a light-emitting element having a dual emission structure will be described with reference to FIG. 9B.

In FIG. 9B, a first electrode 7023 of a light-emitting element 7022 is formed over a light-transmitting conductive film 7027 which is electrically connected to a drain electrode layer of the driving TFT 7021, and an EL layer 7024 and a second electrode 7025 are stacked in that order over the first electrode 7023.

For the light-transmitting conductive film 7027, a light-transmitting conductive film of indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or the like can be used.

The first electrode 7023 can be formed using various materials. For example, in the case where the first electrode 7023 is used as a cathode, a material having a low work function, specifically, an alkali metal such as Li or Cs; an alkaline-earth metal such as Mg, Ca, or Sr; an alloy containing any of these (Mg: Ag, Al: Li, or the like); a rare-earth metal such as Yb or Er; or the like is preferable. In this embodiment, the first electrode 7023 is used as a cathode and the thickness of the first electrode 7023 is formed to a thickness that can transmit light (preferably, approximately 5 nm to 30 nm). For example, a 20-nm-thick aluminum film is used as the cathode.

Note that the light-transmitting conductive film and the aluminum film may be stacked and then selectively etched, whereby the light-transmitting conductive film 7027 and the first electrode 7023 may be formed. In this case, etching can be performed with the use of the same mask, which is preferable.

The periphery of the first electrode 7023 is covered with a partition 7029. The partition 7029 is formed using an organic resin film such as polyimide, acrylic, polyamide, or epoxy; an inorganic insulating film; or organic polysiloxane. It is particularly preferable that the partition 7029 be formed using a photosensitive resin material to have an opening over the first electrode 7023 so that a sidewall of the opening is formed as an inclined surface with continuous curvature. In the case where a photosensitive resin material is used for the partition 7029, a step of forming a resist mask can be omitted.

The EL layer 7024 formed over the first electrode 7023 and the partition 7029 may be formed using either a single layer or a plurality of layers stacked as long as it includes at least a light-emitting layer. When the EL layer 7024 is formed using a plurality of layers, the EL layer 7024 is formed by stacking an electron-injection layer, an electron-transport layer, a light-emitting layer, a hole-transport layer, and a hole-injection layer in that order over the first electrode 7023 functioning as a cathode. Note that not all of these layers need to be provided.

The stacking order is not limited to the above stacking order. The first electrode 7023 may function as an anode, and a hole-injection layer, a hole-transport layer, a light-emitting layer, an electron-transport layer, and an electron-injection layer may be stacked in that order over the anode. However, when power consumption is compared, it is preferable that the first electrode 7023 function as a cathode and an electron-injection layer, an electron-transport layer, a light-emitting layer, a hole-transport layer, and a hole-injection layer be stacked in that order over the cathode for lower power consumption.

As the second electrode 7025 formed over the EL layer 7024, various materials can be employed. For example, in the case where the second electrode 7025 is used as an anode, a material having a high work function, for example, a light-transmitting conductive material of ITO, IZO, ZnO, or the like can be preferably used. In this embodiment, the second electrode 7025 is used as an anode, and an ITO film containing silicon oxide is formed as the second electrode 7025.

The light-emitting element 7022 corresponds to a region where the EL layer 7024 including a light-emitting layer is sandwiched between the first electrode 7023 and the second electrode 7025. In the case of the element structure illustrated in FIG. 9B, light is emitted from the light-emitting element 7022 to both the second electrode 7025 side and the first electrode 7023 side as indicated by arrows.

Note that an example in which a light-transmitting conductive film is used as a gate electrode layer and a light-transmitting thin film is used as source and drain electrode layers is illustrated in FIG. 9B. Light emitted from the light-emitting element 7022 to the first electrode 7023 side passes through a color filter layer 7043, and can be extracted through the substrate.

The color filter layer 7043 is formed by a droplet discharge method such as an inkjet method, a printing method, photolithography, etching, or the like.

The color filter layer 7043 is covered with an overcoat layer 7044, and also covered with a protective insulating layer 7045.

A contact hole which is formed in the protective insulating layer 7045, an insulating layer 7042, and the insulating layer 7041 and which reaches the drain electrode layer is provided in a portion which overlaps with the partition 7029.

Note that when a light-emitting element having a dual emission structure is used and full color display is performed on both display surfaces, light from the second electrode 7025 side does not pass through the color filter layer 7043; therefore, a sealing substrate provided with another color filter layer is preferably provided on the second electrode 7025.

Next, a light-emitting element having a top emission structure is described with reference to FIG. 9C.

FIG. 9C is a cross-sectional view of a pixel in the case where the driving TFT 7001 is of n-type and light is emitted from a light-emitting element 7002 to a second electrode 7005 side. In FIG. 9C, a drain electrode layer of the driving TFT 7001 and a first electrode 7003 are in contact with each other, and the driving TFT 7001 and the first electrode 7003 of the light-emitting element 7002 are electrically connected to each other. An EL layer 7004 and the second electrode 7005 are stacked in that order over the first electrode 7003.

The first electrode 7003 can be formed using a variety of materials. For example, in the case where the first electrode 7003 is used as a cathode, a material having a low work function, specifically, an alkali metal such as Li or Cs; an alkaline-earth metal such as Mg, Ca, or Sr; an alloy containing any of these (Mg: Ag, Al: Li, or the like); a rare-earth metal such as Yb or Er; or the like, is preferable.

The periphery of the first electrode 7003 is covered with a partition 7009. The partition 7009 is formed using an organic resin film such as polyimide, acrylic, polyamide, or epoxy; an inorganic insulating film; or organic polysiloxane. It is particularly preferable that the partition 7009 be formed using a photosensitive resin material to have an opening over the first electrode 7003 so that a sidewall of the opening is formed as an inclined surface with continuous curvature. In the case where a photosensitive resin material is used for the partition 7009, a step of forming a resist mask can be omitted.

The EL layer 7004 formed over the first electrode 7003 and the partition 7009 may be formed using either a single layer or a plurality of layers stacked as long as it includes at least a light-emitting layer. When the EL layer 7004 is formed using a plurality of layers, the EL layer 7004 is formed by stacking an electron-injection layer, an electron-transport layer, a light-emitting layer, a hole-transport layer, and a hole-injection layer in that order over the first electrode 7003 used as a cathode. Note that not all of these layers need to be provided.

The stacking order is not limited to the above stacking order, and a hole-injection layer, a hole-transport layer, a light-emitting layer, an electron-transport layer, and an electron-injection layer may be stacked in that order over the first electrode 7003 used as an anode.

In FIG. 9C, a hole-injection layer, a hole-transport layer, a light-emitting layer, an electron-transport layer, and an electron-injection layer are stacked in that order over a stacked film in which a Ti film, an aluminum film, and a Ti film are stacked in that order, and thereover, a stacked layer of a Mg:Ag alloy thin film and ITO is formed.

However, in the case where the driving TFT 7001 is of an n-type, it is preferable that an electron-injection layer, an electron-transport layer, a light-emitting layer, a hole-transport layer, and a hole-injection layer be stacked in that order over the first electrode 7003, because an increase in voltage in the driver circuit can be suppressed and power consumption can be reduced.

The second electrode 7005 is formed using a light-transmitting conductive material through which light can pass, and for example, a light-transmitting conductive film of indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or the like can be used.

The light-emitting element 7002 corresponds to a region where the EL layer 7004 is sandwiched between the first electrode 7003 and the second electrode 7005. In the case of the pixel illustrated in FIG. 9C, light is emitted from the light-emitting element 7002 to the second electrode 7005 side as indicated by an arrow.

In FIG. 9C, the drain electrode layer of the driving TFT 7001 is electrically connected to the first electrode 7003 through a contact hole provided in the insulating layer 7051, a protective insulating layer 7052, a planarization insulating layer 7056, a planarization insulating layer 7053, and an insulating layer 7055. The planarization insulating layers 7036, 7046, 7053, and 7056 are formed using a resin material such as polyimide, acrylic, benzocyclobutene, polyamide, or epoxy. In addition to such resin materials, it is also possible to use a low-dielectric constant material (low-k material), a siloxane-based resin, phosphosilicate glass (PSG), borophosphosilicate glass (BPSG), or the like. Note that the planarization insulating layers 7036, 7046, 7053, and 7056 may be formed by stacking a plurality of insulating films formed of these materials. There is no particular limitation on the method for forming the planarization insulating layers 7036, 7046, 7053, and 7056, and the planarization insulating layers 7036, 7046, 7053, and 7056 can be formed, depending on the material, by a sputtering method, a spin coating method, a dipping method, a spray coating method, a droplet discharge method (such as an inkjet method, screen printing, offset printing, or the like), a roll coating method, a curtain coating method, a knife coating method, or the like.

The partition 7009 is provided in order to insulate the first electrode 7003 from a first electrode of an adjacent pixel. The partition 7009 is formed using an organic resin film of polyimide, acrylic, polyamide, epoxy, or the like, an inorganic insulating film, or organic polysiloxane. It is particularly preferable that the partition 7009 be formed using a photosensitive resin material to have the opening over the first electrode 7003 so that the sidewall of the opening is formed as an inclined surface with continuous curvature. When the partition 7009 is formed using a photosensitive resin material, a step of forming a resist mask can be omitted.

In the structure of FIG. 9C, when full color display is performed, for example, the light-emitting element 7002 is used as a green light-emitting element, one of adjacent light-emitting elements is used as a red light-emitting element, and the other is used as a blue light-emitting element. Alternatively, a light-emitting display device capable of full color display may be manufactured using four kinds of light-emitting elements, which include white light-emitting elements as well as three kinds of light-emitting elements.

In the structure of FIG. 9C, a light-emitting display device capable of full color display may be manufactured in such a way that all of a plurality of light-emitting elements which is arranged is white light-emitting elements and a sealing substrate having a color filter or the like is arranged on the light-emitting element 7002. A material which exhibits light of a single color such as white can be formed and combined with a color filter or a color conversion layer, whereby full color display can be performed.

Needless to say, display of monochromatic light can also be performed. For example, a lighting device may be formed with the use of white light emission, or an area-color light-emitting device may be formed with the use of a single color light emission.

If necessary, an optical film such as a polarizing film including a circularly polarizing plate may be provided.

Although an organic EL element is described here as a light-emitting element, an inorganic EL element can also be provided as a light-emitting element.

Note that the example is described in which a thin film transistor (driving TFT) which controls the driving of a light-emitting element is electrically connected to the light-emitting element; however, a structure may be employed in which a TFT for current control is connected between the driving TFT and the light-emitting element.

This embodiment can be implemented in combination with any of the other embodiments as appropriate.

Embodiment 10

Figure 10A:
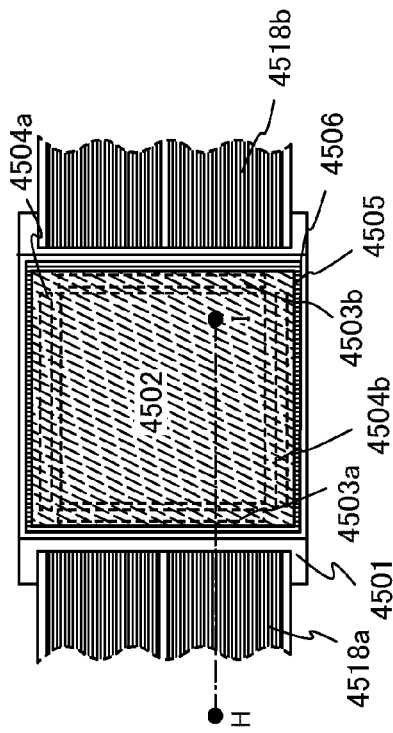
FIGS. 10A and 10B illustrate a semiconductor device.
Figure 10B:
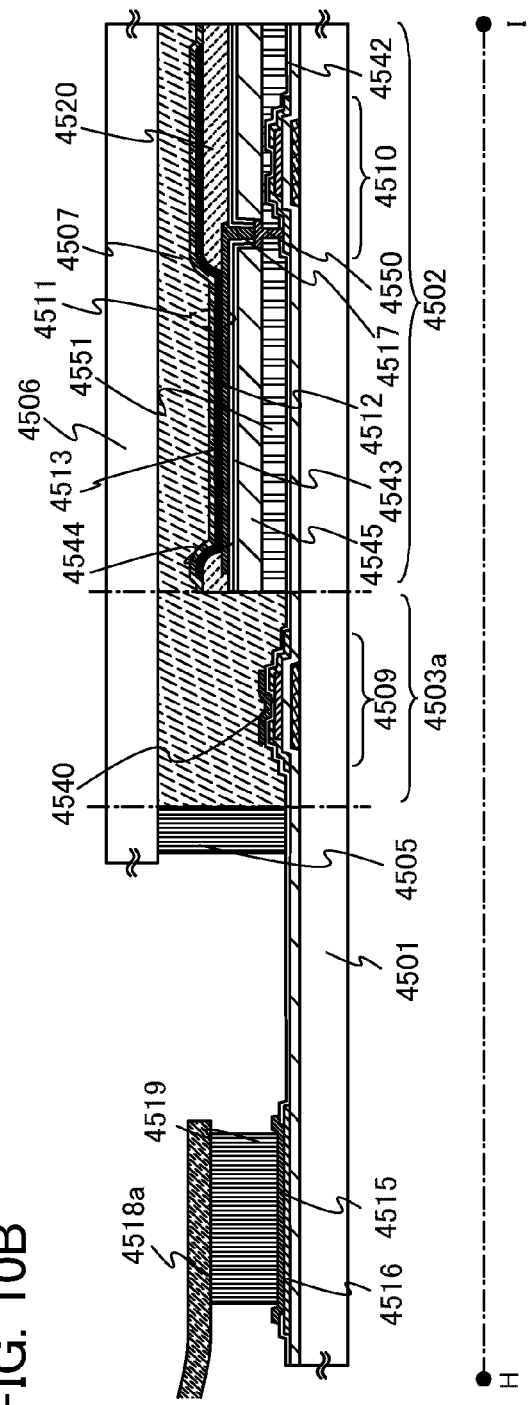

In this embodiment, the appearance and a cross section of a light-emitting display panel (also referred to as a light-emitting panel) will be described with reference to FIGS. 10A and 10B. FIG. 10A is a plan view of a panel in which a thin film transistor and a light-emitting element are sealed between a first substrate and a second substrate with a sealant. FIG. 10B is a cross-sectional view taken along line H-I of FIG. 10A.

A sealant 4505 is provided to surround a pixel portion 4502, a signal line driver circuit 4503a, a signal line driver circuit 4503b, a scan line driver circuit 4504a, and a scan line driver circuit 4504b, which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a display device be thus packaged (sealed) with a protective film (such as a bonding film or an ultraviolet curable resin film) or a cover material with high air-tightness and little degasification so that the display device is not exposed to the outside air.

The pixel portion 4502, the signal line driver circuits 4503a and 4503b, and the scan line driver circuits 4504a and 4504b provided over the first substrate 4501 each include a plurality of thin film transistors, and a thin film transistor 4510 included in the pixel portion 4502 and a thin film transistor 4509 included in the signal line driver circuit 4503a are illustrated as an example in FIG. 10B.

Any of the thin film transistors of Embodiments 1 to 8 can be used as appropriate as the thin film transistors 4509 and 4510, and they can be formed using steps and materials similar to those for the thin film transistors of Embodiments 1 to 8. In each of the thin film transistors 4509 and 4510, an oxide insulating layer containing a halogen element and/or a gate insulating layer containing a halogen element are/is provided in contact with an oxide semiconductor layer, and hydrogen or water included in the oxide semiconductor layer is diffused into the oxide insulating layer and/or the gate insulating layer through heat treatment, so that hydrogen or water in the oxide semiconductor layer is reduced. Therefore, the thin film transistors 4509 and 4510 are highly reliable thin film transistors having stable electric characteristics.

The gate insulating layer and the insulating layer which are provided in contact with the oxide semiconductor layer can be formed to contain a halogen element. In addition, a halogen element may be attached to the oxide semiconductor layer through plasma treatment under an atmosphere of a gas containing a halogen element. At least one of the above methods for making a halogen element be contained in a semiconductor device (making a halogen element be contained in the gate insulating layer during deposition, making a halogen element be contained in the insulating layer during deposition, and making a halogen element be attached to the interface between the insulating layer and the oxide semiconductor layer through plasma treatment) may be used, and needless to say, a plurality of the above methods may be used.

Note that the thin film transistor 4509 for a driver circuit has a conductive layer in a position which overlaps with the channel formation region of the oxide semiconductor layer in the thin film transistor. In this embodiment, the thin film transistors 4509 and 4510 are n-channel thin film transistors.

A conductive layer 4540 is provided over an oxide insulating layer 4542, so as to overlap with a channel formation region of the oxide semiconductor layer in the thin film transistor 4509 in the driver circuit. The conductive layer 4540 is provided so as to overlap with the channel formation region of the oxide semiconductor layer, whereby the amount of change in the threshold voltage of the thin film transistor 4509 between before and after a BT test can be reduced. The potential of the conductive layer 4540 may be the same as or different from that of a gate electrode layer of the thin film transistor 4509. The conductive layer 4540 can function as a second gate electrode layer. Alternatively, the potential of the conductive layer 4540 may be GND, 0 V or the conductive layer 4540 may be in a floating state.

In addition, the conductive layer 4540 functions to block external electric field (particularly, block static electricity), that is, to prevent external electric field from acting the inside (a circuit portion including the thin film transistor). A blocking function of the conductive layer 4540 can prevent variation in electric characteristics of the thin film transistor due to the effect of external electric field such as static electricity.

Further, the oxide insulating layer 4542 is formed to cover the oxide semiconductor layer of the thin film transistor 4510. The source or drain electrode layer of the thin film transistor 4510 is electrically connected to a wiring layer 4550 in an opening formed in the oxide insulating layer 4542 and an insulating layer 4551 which are formed over the thin film transistor. The wiring layer 4550 is formed in contact with a first electrode 4517, and the thin film transistor 4510 and the first electrode 4517 are electrically connected to each other through the wiring layer 4550.

In the case where the oxide insulating layer 4542 contains a halogen element, the oxide insulating layer 4542 may be formed using a material and a method similar to those of the oxide insulating layer 136 described in Embodiment 2.

A color filter layer 4545 is formed over the insulating layer 4551 so as to overlap with a light-emitting region of a light-emitting element 4511.

Further, in order to reduce the surface roughness of the color filter layer 4545, the color filter layer 4545 is covered with an overcoat layer 4543 functioning as a planarization insulating film.

Further, an insulating layer 4544 is formed over the overcoat layer 4543. The insulating layer 4544 may be formed in a manner similar to that of the protective insulating layer 103 described in Embodiment 1, and a silicon nitride film may be formed by a sputtering method, for example.

Reference numeral 4511 denotes a light-emitting element, and the first electrode 4517 that is a pixel electrode included in the light-emitting element 4511 is electrically connected to the source or drain electrode layer of the thin film transistor 4510 through the wiring layer 4550. Note that a structure of the light-emitting element 4511 is not limited to the illustrated structure, which includes the first electrode 4517, an electroluminescent layer 4512, and a second electrode 4513. The structure of the light-emitting element 4511 can be changed as appropriate depending on the direction in which light is extracted from the light-emitting element 4511, or the like.

A partition 4520 is formed using an organic resin film, an inorganic insulating film, or organic polysiloxane. It is particularly preferable that the partition 4520 be formed of a photosensitive material to have an opening over the first electrode 4517 so that a sidewall of the opening is formed as an inclined surface with continuous curvature.

The electroluminescent layer 4512 may be formed using a single layer or a plurality of layers stacked.

A protective film may be formed over the second electrode 4513 and the partition 4520 in order to prevent oxygen, hydrogen, moisture, carbon dioxide, or the like from entering the light-emitting element 4511. As the protective film, a silicon nitride film, a silicon nitride oxide film, a DLC film, or the like can be formed.

In addition, a variety of signals and potentials are supplied to the signal line driver circuits 4503a and 4503b, the scan line driver circuits 4504a and 4504b, or the pixel portion 4502 from FPCs 4518a and 4518b.

A connection terminal electrode 4515 is formed using the same conductive film as the first electrode 4517 included in the light-emitting element 4511, and a terminal electrode 4516 is formed using the same conductive film as the source and drain electrode layers included in the thin film transistor 4509.

The connection terminal electrode 4515 is electrically connected to a terminal included in the FPC 4518a through an anisotropic conductive film 4519.

The second substrate located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. For example, nitrogen is used as the filler.

In addition, if needed, an optical film such as a polarizing plate, a circularly polarizing plate (including an elliptically polarizing plate), or a retardation plate (a quarter-wave plate or a half-wave plate) may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The sealant can be deposited using a screen printing method, an inkjet apparatus, or a dispensing apparatus. As the sealant, typically, a material containing a visible light curable resin, an ultraviolet curable resin, or a thermosetting resin can be used. Further, a filler may be contained.

The signal line driver circuits 4503a and 4503b and the scan line driver circuits 4504a and 4504b may be mounted as driver circuits formed using a single crystal semiconductor film or a polycrystalline semiconductor film over a substrate separately prepared. Alternatively, only the signal line driver circuits or part thereof, or only the scan line driver circuits or part thereof may be separately formed and mounted. This embodiment is not limited to the structure illustrated in FIGS. 10A and 10B.

Through the above process, a highly reliable light-emitting display device (display panel) as a semiconductor device can be manufactured.

This embodiment can be implemented in combination with any of the other embodiments as appropriate.

Embodiment 11

The appearance and a cross section of a liquid crystal display panel, which is one embodiment of a semiconductor device, will be described with reference to FIGS. 16A to 16C. FIGS. 16A and 16C are plan views of panels in each of which thin film transistors 4010 and 4011 and a liquid crystal element 4013 are sealed between a first substrate 4001 and a second substrate 4006 with a sealant 4005. FIG. 16B is a cross-sectional view taken along line M-N in FIGS. 16A and 16C.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 formed using a single crystal semiconductor film or a polycrystalline semiconductor film over a substrate separately prepared is mounted in a region different from the region surrounded by the sealant 4005 over the first substrate 4001.

Note that a connection method of the driver circuit which is separately formed is not particularly limited, and a COG method, a wire bonding method, a TAB method, or the like can be used. FIG. 16A illustrates an example of mounting the signal line driver circuit 4003 by a COG method, and FIG. 16C illustrates an example of mounting the signal line driver circuit 4003 by a TAB method.

The pixel portion 4002 and the scan line driver circuit 4004 provided over the first substrate 4001 each include a plurality of thin film transistors, and the thin film transistor 4010 included in the pixel portion 4002 and the thin film transistor 4011 included in the scan line driver circuit 4004 are illustrated as an example in FIG. 16B. Protective insulating layers 4041, 4042, and 4021 are provided over the thin film transistors 4010 and 4011.

Any of the thin film transistors of Embodiments 1 to 8 can be used as appropriate as the thin film transistors 4010 and 4011, and they can be formed using steps and materials similar to those for the thin film transistors of Embodiments 1 to 8. In each of the thin film transistors 4010 and 4011, the insulating layer 4041 containing a halogen element and/or a gate insulating layer 4020 containing a halogen element are/is provided in contact with an oxide semiconductor layer, and hydrogen or water included in the oxide semiconductor layer is diffused into the oxide insulating layer and/or the gate insulating layer through heat treatment, so that hydrogen or water in the oxide semiconductor layer is reduced. Therefore, the thin film transistors 4010 and 4011 are highly reliable thin film transistors having stable electric characteristics.

The gate insulating layer and the insulating layer which are provided in contact with the oxide semiconductor layer can be formed to contain a halogen element. In addition, a halogen element may be attached to the oxide semiconductor layer through plasma treatment under an atmosphere of a gas containing a halogen element. At least one of the above methods for making a halogen element be contained in a semiconductor device (making a halogen element be contained in the gate insulating layer during deposition, making a halogen element be contained in the insulating layer during deposition, and making a halogen element be attached to the interface between the insulating layer and the oxide semiconductor layer through plasma treatment) may be used, and needless to say, a plurality of the above methods may be used.

A conductive layer 4040 is provided over the insulating layer 4021, so as to overlap with a channel formation region of the oxide semiconductor layer in the thin film transistor 4011 in the driver circuit. The conductive layer 4040 is provided so as to overlap with the channel formation region of the oxide semiconductor layer, whereby the amount of change in the threshold voltage of the thin film transistor 4011 between before and after a BT test can be reduced. Further, the potential of the conductive layer 4040 may be the same as or different from that of a gate electrode layer of the thin film transistor 4011. The conductive layer 4040 can function also as a second gate electrode layer. Alternatively, the potential of the conductive layer 4040 may be GND or 0 V, or the conductive layer 4040 may be in a floating state.

In addition, a pixel electrode layer 4030 of the liquid crystal element 4013 is electrically connected to a source electrode layer or a drain electrode layer of the thin film transistor 4010. A counter electrode layer 4031 of the liquid crystal element 4013 is formed over the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 which function as alignment films, and the liquid crystal layer 4008 is sandwiched between the pixel electrode layer 4030 and the counter electrode layer 4031 with the insulating layers 4032 and 4033 therebetween.

Note that a light-transmitting substrate can be used as the first substrate 4001 and the second substrate 4006; glass, ceramics, or plastics can be used. As plastics, a fiberglass-reinforced plastics (FRP) plate, a polyvinyl fluoride (PVF) film, a polyester film, or an acrylic resin film can be used.

Reference numeral 4035 denotes a columnar spacer which is obtained by selective etching of an insulating film and is provided to control the distance between the pixel electrode layer 4030 and the counter electrode layer 4031 (a cell gap). Alternatively, a spherical spacer may also be used. In addition, the counter electrode layer 4031 is electrically connected to a common potential line formed over the same substrate as the thin film transistor 4010. With use of a common connection portion, the counter electrode layer 4031 and the common potential line can be electrically connected to each other through conductive particles arranged between a pair of substrates. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is generated only within a narrow range of temperature, a liquid crystal composition containing a chiral agent at 5 wt % or more is used for the liquid crystal layer 4008 so as to improve the temperature range. The liquid crystal composition which includes liquid crystal exhibiting a blue phase and includes a chiral agent has a short response time of 1 msec or less and has optical isotropy. Thus, an alignment process is unneeded and viewing angle dependence is small. In addition, since an alignment film is not necessary provided, rubbing treatment becomes unnecessary. Thus, electrostatic discharge damage caused by the rubbing treatment can be prevented and defects and damage of a liquid crystal display device can be reduced in a manufacturing process. Thus, productivity of the liquid crystal display device can be increased. A thin film transistor that uses an oxide semiconductor layer particularly has a possibility that electric characteristics of the thin film transistor may fluctuate significantly by the influence of static electricity and deviate from the designed range. Therefore, it is more effective to use a liquid crystal material exhibiting a blue phase for the liquid crystal display device including a thin film transistor that uses an oxide semiconductor layer.

Note that this embodiment can also be applied to a transflective liquid crystal display device in addition to a transmissive liquid crystal display device.

An example of the liquid crystal display device is described in which a polarizing plate is provided on the outer surface of the substrate (on the viewer side) and a coloring layer and an electrode layer used for a display element are provided on the inner surface of the substrate; however, the polarizing plate may be provided on the inner surface of the substrate. The stacked structure of the polarizing plate and the coloring layer is not limited to this embodiment and may be set as appropriate depending on materials of the polarizing plate and the coloring layer or conditions of the manufacturing process. Further, a light-blocking film serving as a black matrix may be provided in a portion other than the display portion.

Over the thin film transistors 4011 and 4010, the insulating layer 4041 is formed in contact with the oxide semiconductor layer. In the case where the insulating layer contains a halogen element, the insulating layer 4041 may be formed using a material and a method similar to those of the oxide insulating layer 136 described in Embodiment 2. In this embodiment, a silicon oxide layer containing a halogen element is formed as the insulating layer 4041 by a sputtering method with reference to Embodiment 2. Further, the protective insulating layer 4042 is formed on and in contact with the insulating layer 4041. The protective insulating layer 4042 can be formed in the same manner as the protective insulating layer 103 described in Embodiment 1; for example, a silicon nitride layer can be used. In addition, in order to reduce the surface roughness due to the thin film transistors, the protective insulating layer 4042 is covered with the insulating layer 4021 functioning as a planarization insulating film.

The insulating layer 4021 is formed as the planarizing insulating film. As the insulating layer 4021, an organic material having heat resistance such as polyimide, acrylic, benzocyclobutene, polyamide, or epoxy can be used. In addition to such organic materials, it is also possible to use a low-dielectric constant material (low-k material), a siloxane-based resin, phosphosilicate glass (PSG), borophosphosilicate glass (BPSG), or the like. Note that the insulating layer 4021 may be formed by stacking a plurality of insulating films formed using these materials.

There is no particular limitation on the method for forming the insulating layer 4021, and the insulating layer 4021 can be formed, depending on a material thereof, by a sputtering method, a spin coating method, a dipping method, a spray coating method, a droplet discharging method (e.g., an inkjet method, a screen printing method, or an offset printing method), a roll coating method, a curtain coating method, a knife coating method, or the like. The baking step of the insulating layer 4021 also serves as annealing of the semiconductor layer, whereby a semiconductor device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Conductive compositions including a conductive high molecule (also referred to as a conductive polymer) can be used for the pixel electrode layer 4030 and the counter electrode layer 4031. The pixel electrode formed using the conductive composition preferably has a sheet resistance of less than or equal to 10000 Ω/square and a transmittance of greater than or equal to 70% at a wavelength of 550 nm. Further, the resistivity of the conductive high molecule included in the conductive composition is preferably less than or equal to 0.1 Ω·cm.

As the conductive high molecule, a so-called π-electron conjugated conductive high molecule can be used. For example, polyaniline or a derivative thereof, polypyrrole or a derivative thereof, polythiophene or a derivative thereof, a copolymer of two or more kinds of them, and the like can be given.

Further, a variety of signals and potentials are supplied to the signal line driver circuit 4003 which is formed separately, the scan line driver circuit 4004, or the pixel portion 4002 from an FPC 4018.

A connection terminal electrode 4015 is formed using the same conductive film as the pixel electrode layer 4030 included in the liquid crystal element 4013, and a terminal electrode 4016 is formed using the same conductive film as the source and drain electrode layers included in the thin film transistors 4010 and 4011.

The connection terminal electrode 4015 is electrically connected to a terminal included in the FPC 4018 through an anisotropic conductive film 4019.

Note that FIGS. 16A to 16C illustrate an example in which the signal line driver circuit 4003 is formed separately and mounted over the first substrate 4001; however, the structure is not limited thereto. The scan line driver circuit may be separately formed and then mounted, or only part of the signal line driver circuit or part of the scan line driver circuit may be separately formed and then mounted.

A black matrix (a light-blocking layer), an optical member (an optical substrate) such as a polarizing member, a retardation member, or an anti-reflection member, and the like are provided as appropriate. For example, circular polarization may be employed by using a polarizing substrate and a retardation substrate. In addition, a backlight, a side light, or the like may be used as a light source.

In an active matrix liquid crystal display device, pixel electrodes arranged in a matrix form are driven to form a display pattern on a screen. Specifically, voltage is applied between a selected pixel electrode and a counter electrode corresponding to the pixel electrode, so that a liquid crystal layer provided between the pixel electrode and the counter electrode is optically modulated and this optical modulation is recognized as a display pattern by an observer.

In displaying moving images, a liquid crystal display device has a problem that a long response time of liquid crystal molecules themselves causes afterimages or blurring of moving images. In order to improve the moving-image characteristics of a liquid crystal display device, a driving method called black insertion is employed in which black is displayed on the whole screen every other frame period.

Moreover, a driving method so-called double-frame rate driving may be employed in which the vertical synchronizing frequency is 1.5 times or more, or twice or more as high as a conventional vertical synchronizing frequency, whereby the response speed is increased.

Further alternatively, in order to improve moving-image characteristics of a liquid crystal display device, a driving method may be employed, in which a plurality of LEDs (light-emitting diodes) or a plurality of EL light sources are used to form a surface light source as a backlight, and each light source of the surface light source is independently driven in a pulsed manner in one frame period. As the surface light source, three or more kinds of LEDs may be used and an LED emitting white light may also be used. Since a plurality of LEDs can be controlled independently, the light emission timing of LEDs can be synchronized with the timing at which a liquid crystal layer is optically modulated. According to this driving method, LEDs can be partly turned off; therefore, an effect of reducing power consumption can be obtained particularly in the case of displaying an image having a large part on which black is displayed.

By combining these driving methods, the display characteristics of a liquid crystal display device, such as moving-image characteristics, can be improved as compared to those of conventional liquid crystal display devices.

Since a thin film transistor is easily broken due to static electricity or the like, a protective circuit is preferably provided additionally over the same substrate as the pixel portion or the driver circuit. The protective circuit is preferably formed using a non-linear element including an oxide semiconductor layer. For example, a protective circuit is provided between the pixel portion and a scan line input terminal and between the pixel portion and a signal line input terminal. In this embodiment, a plurality of protective circuits are provided so as to prevent breakage of a pixel transistor and the like when surge voltage due to static electricity or the like is applied to a scan line, a signal line, and a capacitor bus line. Therefore, the protective circuit is formed so as to release charge to a common wiring when surge voltage is applied to the protective circuit. Further, the protective circuit includes non-linear elements arranged in parallel to each other with the scan line therebetween. The non-linear element includes a two-terminal element such as a diode or a three-terminal element such as a transistor. For example, the non-linear element can be formed through the same steps as the thin film transistor provided in the pixel portion, and can be made to have the same properties as a diode by connecting a gate terminal to a drain terminal of the non-linear element.

For the liquid crystal display module, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

Thus, there is no particular limitation on the semiconductor device disclosed in this specification, and a liquid crystal including a TN liquid crystal, an OCB liquid crystal, a STN liquid crystal, a VA liquid crystal, an ECB liquid crystal, a GH liquid crystal, a polymer dispersed liquid crystal, a discotic liquid crystal, or the like can be used. Above all, a normally black liquid crystal panel such as a transmissive liquid crystal display device utilizing a vertical alignment (VA) mode is preferable. Some examples are given as the vertical alignment mode. For example, a multi-domain vertical alignment (MVA) mode, a patterned vertical alignment (PVA) mode, an ASV mode, and the like can be used.

An example of the VA liquid crystal display device is described below.

The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. In this embodiment, in particular, a pixel is divided into some regions (subpixels), and molecules are aligned in different directions in their respective regions. This is referred to as multi-domain or multi-domain design. A liquid crystal display device of multi-domain design is described below.

Figure 12:
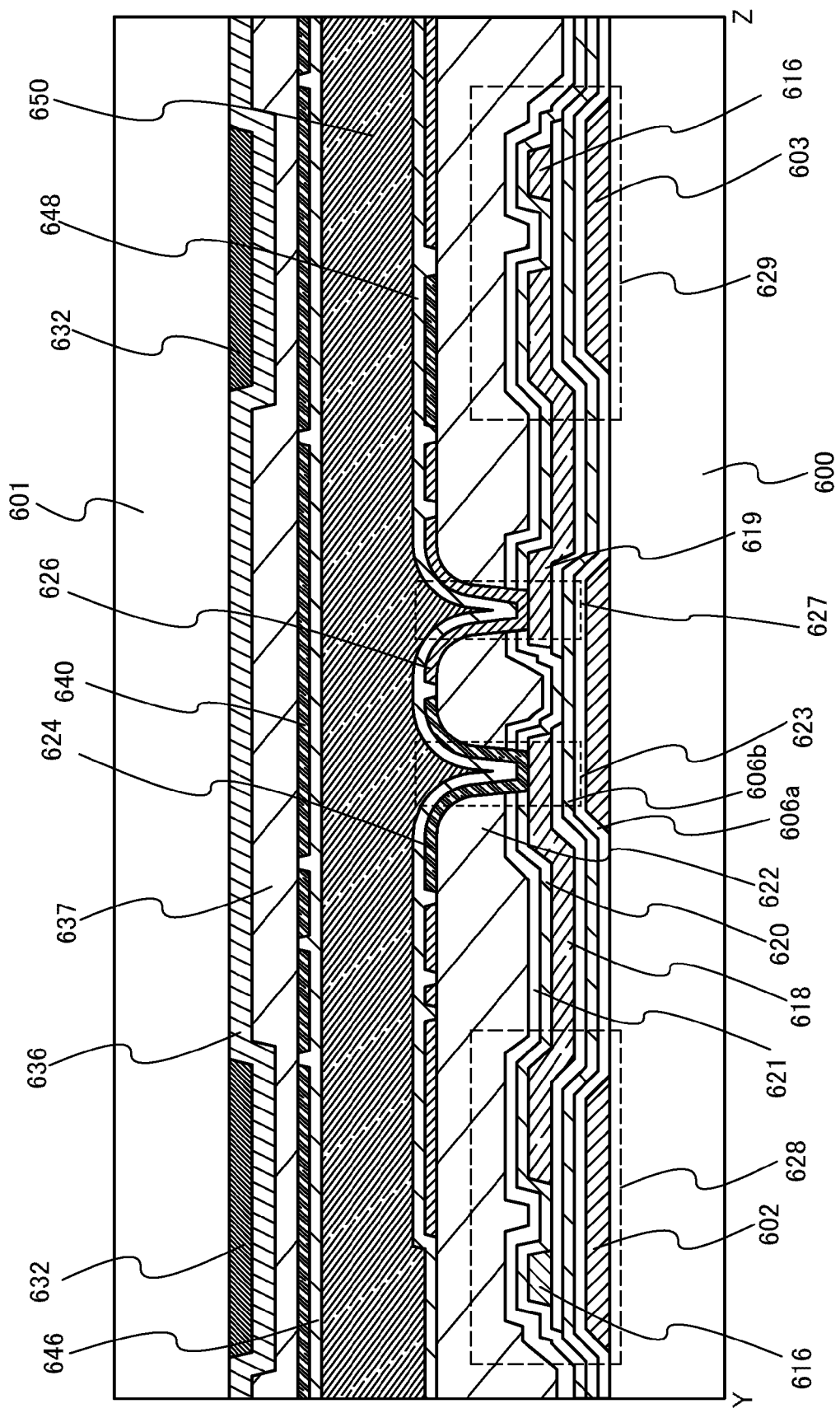
FIG. 12 illustrates a semiconductor device.
Figure 13:
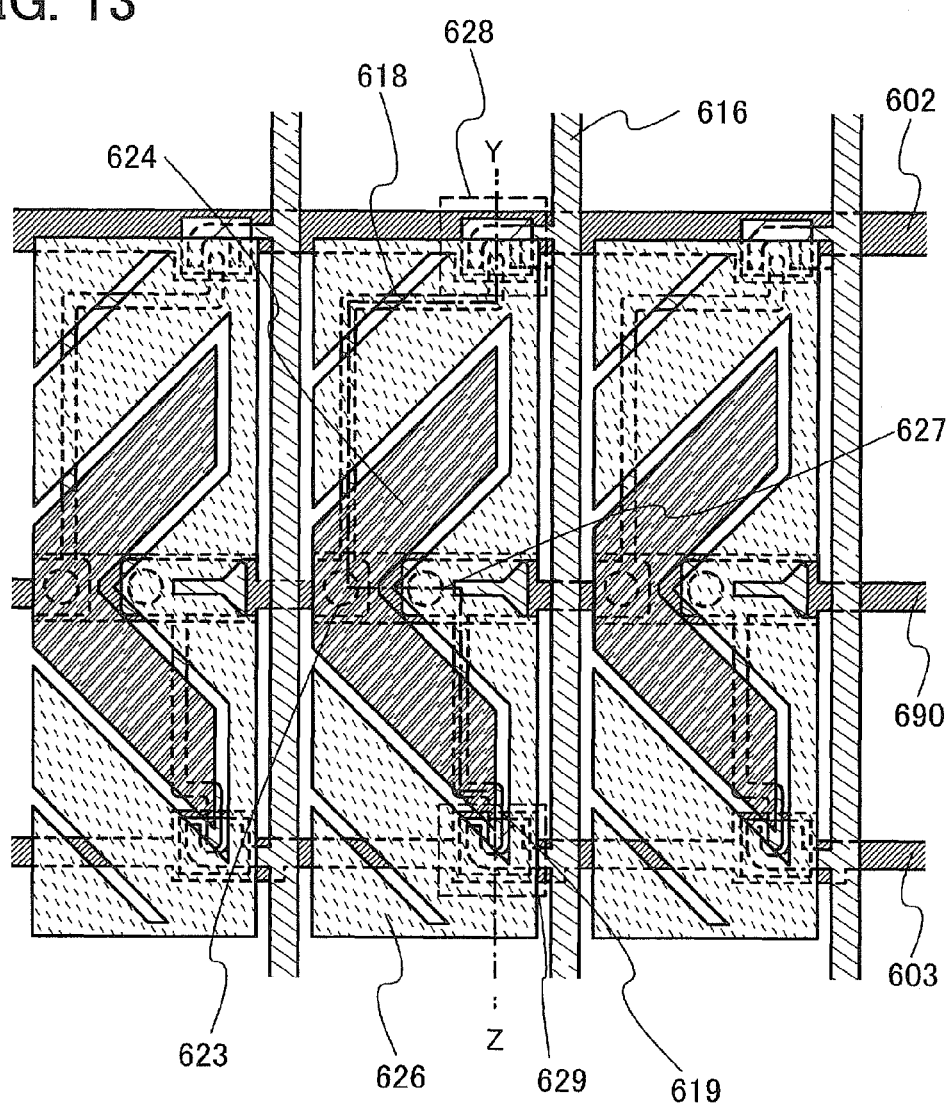
FIG. 13 illustrates a semiconductor device.

FIG. 12 and FIG. 13 illustrate a pixel structure of the VA liquid crystal display panel. FIG. 13 is a plan view of a substrate 600. FIG. 12 illustrates a cross-sectional structure taken along line Y-Z in FIG. 13. Description below will be given with reference to both the drawings.

In this pixel structure, a plurality of pixel electrode layers are provided for one pixel, and each pixel electrode layer is connected to a TFT. Each TFT is driven by a different gate signal. In other words, in the pixel of multi-domain design, signals applied to the respective pixel electrode layers are individually controlled.

A pixel electrode layer 624 is connected to a TFT 628 through a wiring 618 in a contact hole 623 penetrating both an oxide insulating layer 620 and an insulating film 622. A pixel electrode layer 626 is connected to a TFT 629 through a wiring 619 in a contact hole 627 penetrating both the oxide insulating layer 620 and the insulating film 622. A gate wiring 602 of the TFT 628 is separated from a gate wiring 603 of the TFT 629 so that different gate signals can be supplied. On the other hand, a source or drain electrode layer 616 serving as a data line is shared by the TFTs 628 and 629. Note that a gate insulating layer 606a and a gate insulating layer 606b are formed over the gate wirings 602 and 603.

As each of the TFTs 628 and 629, any of the thin film transistors described in Embodiments 1 to 8 can be used as appropriate. The TFTs 628 and 629 of this embodiment are examples in which a halogen element is contained in the gate insulating layer 606b and the oxide insulating layer 620 which are in contact with an oxide semiconductor layer, such as the thin film transistor described in Embodiment 3. The gate insulating layer and the oxide insulating layer which contain a halogen element are formed in contact with the oxide semiconductor layer and heat treatment is performed. Thus, an impurity such as hydrogen, moisture, hydroxyl, or hydride included in the oxide semiconductor layer is reduced. Therefore, the TFTs 628 and 629 have stable electrical characteristics and high reliability.

The gate insulating layer and the insulating layer which are provided in contact with the oxide semiconductor layer can be formed to contain a halogen element. In addition, a halogen element may be attached to the oxide semiconductor layer through plasma treatment under an atmosphere of a gas containing a halogen element. At least one of the above methods for making a halogen element be contained in a semiconductor device (making a halogen element be contained in the gate insulating layer during deposition, making a halogen element be contained in the insulating layer during deposition, and making a halogen element be attached to the interface between the insulating layer and the oxide semi-conductor layer through plasma treatment) may be used, and needless to say, a plurality of the above methods may be used.

Further, a storage capacitor is formed using a capacitor wiring 690, a stacked layer of the gate insulating layers 606a and 606b as a dielectric, and the pixel electrode layer or a capacitor electrode electrically connected to the pixel electrode layer.

Figure 15:
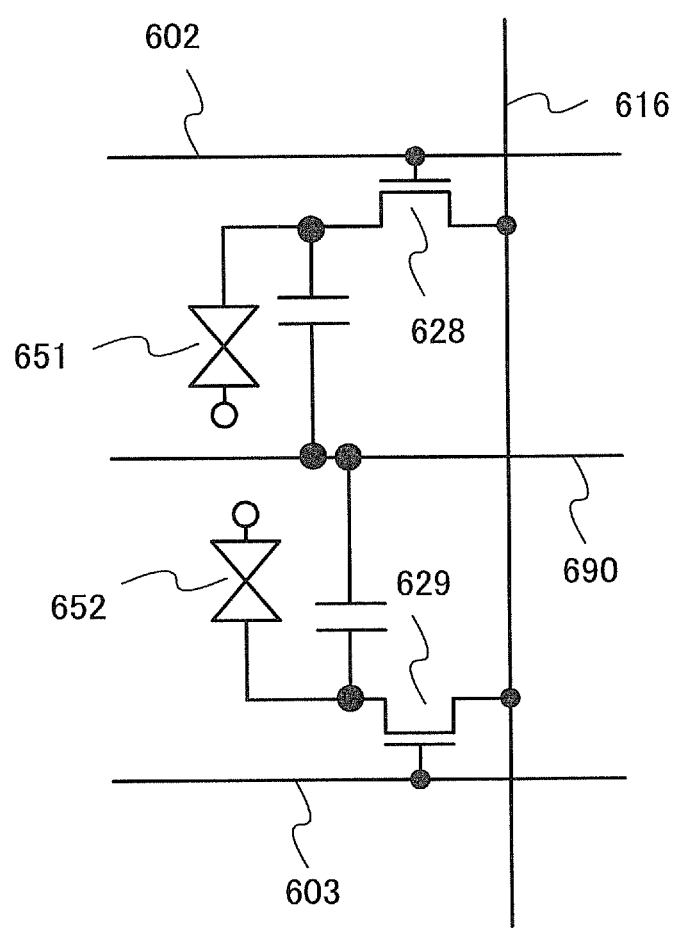
FIG. 15 illustrates a pixel equivalent circuit of a semiconductor device.

The shape of the pixel electrode layer 624 is different from that of the pixel electrode layer 626, and the pixel electrode layers are separated by slits 625. The pixel electrode layer 626 is formed so as to surround the external side of the pixel electrode layer 624 which spreads into a V shape. The timings at which voltages are applied to the pixel electrode layers 624 and 626 are made to be different in the TFTs 628 and 629, whereby alignment of liquid crystals is controlled. FIG. 15 shows an equivalent circuit of this pixel structure. The TFTs 628 and 629 are both connected to the source or drain layer 616. When different gate signals are supplied to the gate wirings 602 and 603, operations of liquid crystal elements 651 and 652 can be different. In other words, when operations of the TFTs 628 and 629 are individually controlled, alignment of liquid crystals can be precisely controlled; accordingly, viewing angle can be increased.

Figure 14:
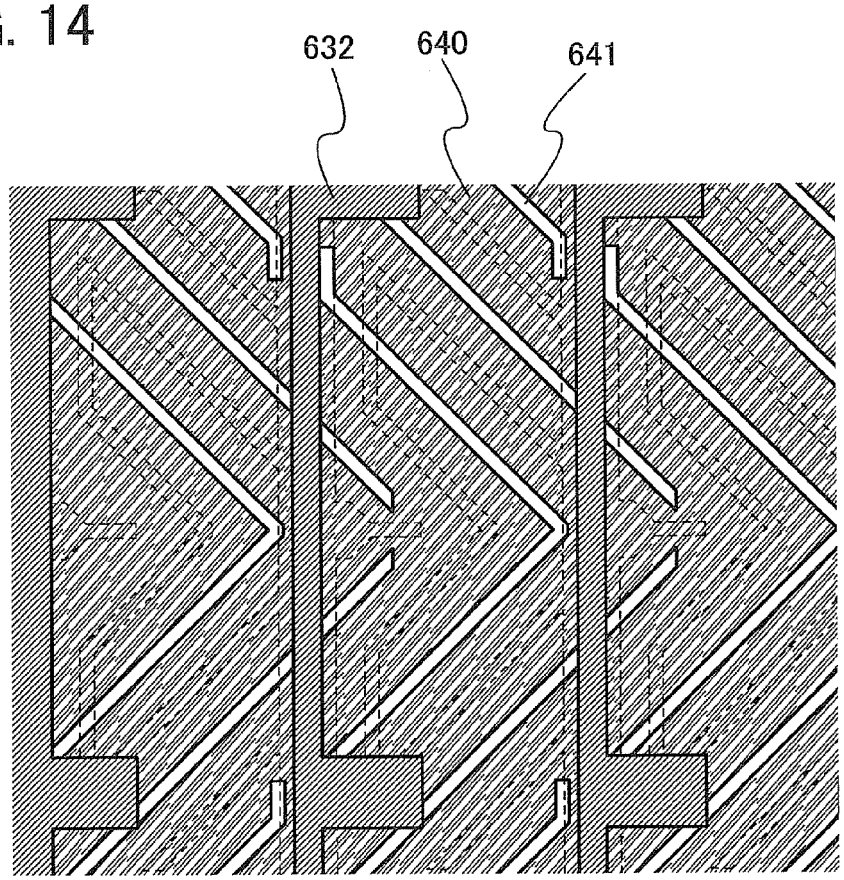
FIG. 14 illustrates a semiconductor device.

A counter substrate 601 is provided with a light-blocking film 632, a second coloring film 636, and a counter electrode layer 640. A planarization film 637 which is also called an overcoat film is formed between the second coloring film 636 and the counter electrode layer 640 to prevent alignment disorder of liquid crystals. FIG. 14 shows a structure of the counter substrate side. The counter electrode layer 640 is an electrode shared by different pixels and slits 641 are formed. The slits 641 and slits on the pixel electrode layers 624 and 626 side are alternately arranged in an engaging manner; thus, an oblique electric field is effectively generated, and the alignment of liquid crystals can be controlled. Accordingly, the orientation of the liquid crystals can be varied in different places, so that the viewing angle is widened.

The counter electrode layer 640 is a first counter electrode layer provided in the pixel portion and has the same potential as a second counter electrode layer which has an opening pattern and is provided in a driver circuit portion. When the second counter electrode layer having an opening pattern is provided in the driver circuit portion, a highly reliable semiconductor device with low power consumption can be manufactured.

The pixel electrode layer 624, a liquid crystal layer 650, and the counter electrode layer 640 overlap with each other to form a first liquid crystal element. Further, the pixel electrode layer 626, the liquid crystal layer 650, and the counter electrode layer 640 overlap with each other to form a second liquid crystal element. Furthermore, the multi-domain structure is employed in which the first liquid crystal element and the second liquid crystal element are provided for one pixel.

This embodiment can be implemented in combination with any of the other embodiments as appropriate.

Embodiment 12

In this embodiment, an example of an electronic paper will be described as a semiconductor device of one embodiment of the present invention.

Figure 11:
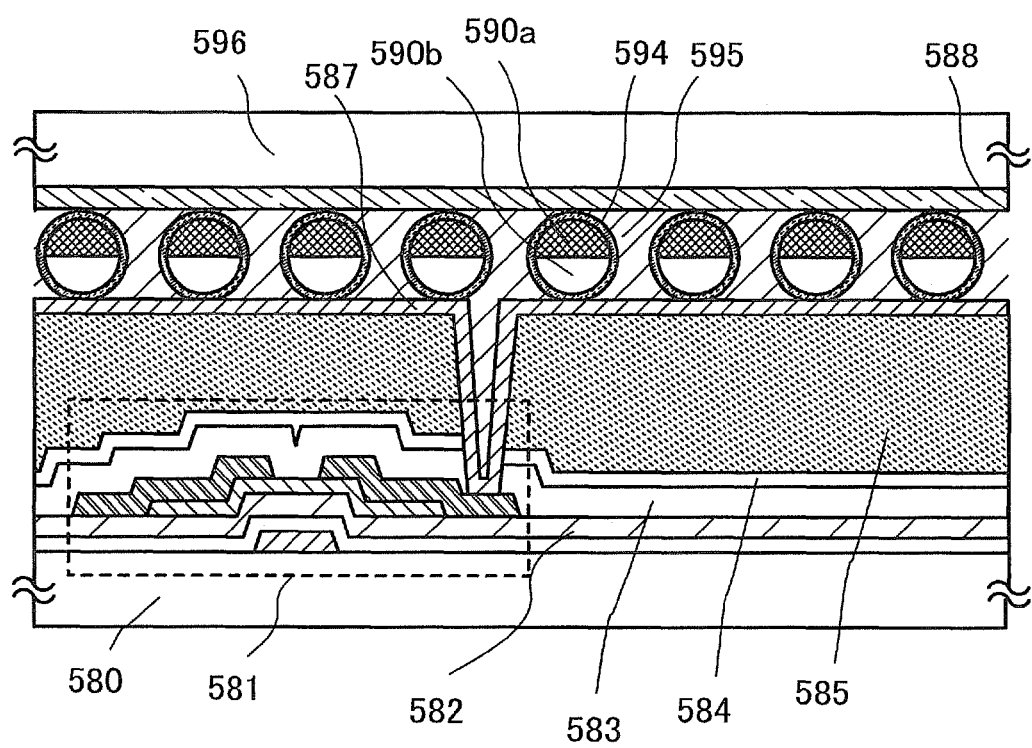
FIG. 11 illustrates a semiconductor device.

FIG. 11 illustrates an active matrix electronic paper as an example of a semiconductor device to which one embodiment of the present invention is applied. As a thin film transistor 581 used for the semiconductor device, any of the thin film transistors described in Embodiments 1 to 8 can be used as appropriate, and steps and materials similar to those of any of the thin film transistors described in Embodiments 1 to 8 can be used.

The thin film transistor 581 of this embodiment is an example in which a halogen element is contained in a gate insulating layer 582 which is in contact with an oxide semiconductor layer, such as the thin film transistor described in Embodiment 1. The gate insulating layer containing a halogen element is formed in contact with the oxide semiconductor layer and heat treatment is performed. Thus, an impurity such as hydrogen, moisture, hydroxyl, or hydride included in the oxide semiconductor layer is reduced. Therefore, the thin film transistor 581 has stable electrical characteristics and high reliability.

The gate insulating layer and the insulating layer which are provided in contact with the oxide semiconductor layer can be formed to contain a halogen element. In addition, a halogen element may be attached to the oxide semiconductor layer through plasma treatment under an atmosphere of a gas containing a halogen element. At least one of the above methods for making a halogen element be contained in a semiconductor device (making a halogen element be contained in the gate insulating layer during deposition, making a halogen element be contained in the insulating layer during deposition, and making a halogen element be attached to the interface between the insulating layer and the oxide semiconductor layer through plasma treatment) may be used, and needless to say, a plurality of the above methods may be used.

The electronic paper in FIG. 11 is an example of a display device using a twisting ball display system. The twisting ball display system refers to a method in which spherical particles each colored in black and white are used for a display element and arranged between a first electrode layer and a second electrode layer which are electrode layers, and a potential difference is generated between the first electrode layer and the second electrode layer to control orientation of the spherical particles, so that display is performed.

The thin film transistor 581 provided over a substrate 580 has a bottom-gate structure in which a source or drain electrode layer is in contact with and electrically connected to a first electrode layer 587 in an opening formed in an oxide insulating layer 583, a protective insulating layer 584, and an insulating layer 585.

Between the first electrode layer 587 and a second electrode layer 588, spherical particles are provided. Each spherical particle includes a black region 590*a*, a white region 590*b*, and a cavity 594 filled with liquid around the black region 590*a* and the white region 590*b*. The circumference of a spherical particle is filled with a filler 595 such as a resin (see FIG. 11). In this embodiment, the first electrode layer 587 corresponds to a pixel electrode and the second electrode layer 588 provided on a counter substrate 596 corresponds to a common electrode.

Further, instead of the twisting ball, an electrophoretic element can also be used. A microcapsule having a diameter of about 10 μm to 200 μm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and the black microparticles move to opposite sides, so that white or black can be displayed. A display element using this principle is an electrophoretic display element and is generally called an electronic paper. The electrophoretic display element has higher reflectance than a liquid crystal display element, and thus, an auxiliary light is unnecessary, power consumption is low, and a display portion can be recognized even in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through the above process, a highly reliable electronic paper as a semiconductor device can be manufactured.

This embodiment can be implemented in combination with any of the other embodiments as appropriate.

Embodiment 13

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 17A:
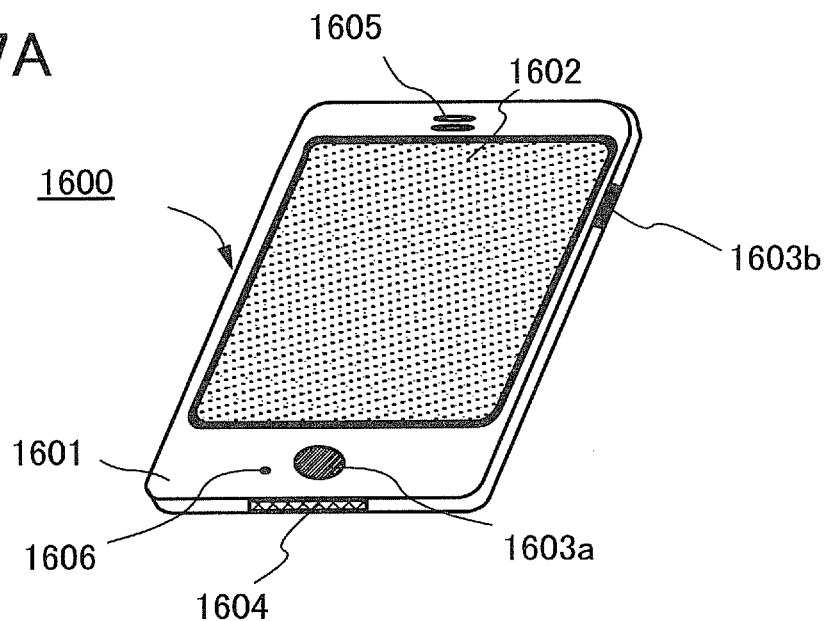
FIGS. 17A and 17B illustrate electronic devices.

FIG. 17A illustrates a mobile phone 1600 which is an example of a mobile phone. The mobile phone 1600 is provided with a display portion 1602 incorporated in a housing 1601, operation buttons 1603*a* and 1603*b*, an external connection port 1604, a speaker 1605, a microphone 1606, and the like.

When the display portion 1602 is touched with a finger or the like, data can be input to the mobile phone 1600 illustrated in FIG. 17A. In addition, operations such as making a call and composing a mail can be performed when the display portion 1602 is touched with a finger or the like.

There are mainly three screen modes of the display portion 1602. The first mode is a display mode mainly for displaying images. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1602 so that text displayed on a screen can be input. In this case, it is preferable to display a keyboard or number buttons on almost all area of the screen of the display portion 1602.

When a detection device including a sensor for detecting inclination, such as a gyroscope or an acceleration sensor, is provided inside the mobile phone 1600, display on the screen of the display portion 1602 can be automatically switched by determining the direction of the mobile phone 1600 (whether the mobile phone 1600 is placed horizontally or vertically for a landscape mode or a portrait mode).

The screen modes are switched by touching the display portion 1602, or operating the operation buttons 1603*a* and 1603*b* of the housing 1601. Alternatively, the screen modes may be switched depending on the kind of image displayed on the display portion 1602. For example, when a signal of an image displayed on the display portion is a signal of moving image data, the screen mode is changed to the display mode. When the signal is a signal of text data, the screen mode is changed to the input mode.

Further, in the input mode, when input by touching the display portion 1602 is not performed for a certain period while a signal detected by an optical sensor in the display portion 1602 is detected, the screen mode may be controlled so as to be changed from the input mode to the display mode.

The display portion 1602 may function as an image sensor. For example, an image of a palm print, a fingerprint, or the like is taken when the display portion 1602 is touched with a palm or a finger, whereby personal identification can be performed. Further, by providing a backlight or a sensing light source which emits near-infrared light in the display portion, an image of a finger vein, a palm vein, or the like can be taken.

Any of the semiconductor devices described in the above embodiments can be applied to the display portion 1602. For example, a plurality of thin film transistors described in the above embodiments can be disposed as switching elements of pixels.

Figure 17B:
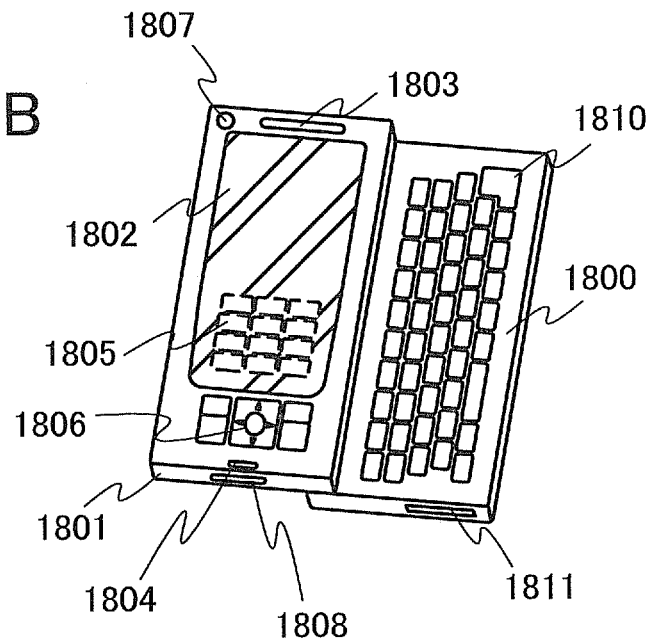

FIG. 17B also illustrates an example of a mobile phone. A portable information terminal whose example is illustrated in FIG. 17B can have a plurality of functions. For example, in addition to a telephone function, such a portable information terminal can have a function of processing a variety of pieces of data by incorporating a computer.

The portable information terminal illustrated in FIG. 17B is formed of a housing 1800 and a housing 1801. The housing 1800 includes a display panel 1802, a speaker 1803, a microphone 1804, a pointing device 1806, a camera lens 1807, an external connection terminal 1808, and the like. The housing 1801 includes a keyboard 1810, an external memory slot 1811, and the like. In addition, an antenna is incorporated in the housing 1801.

Further, the display panel 1802 is provided with a touch panel. A plurality of operation keys 1805 which are displayed as images are illustrated by dashed lines in FIG. 17B.

Further, in addition to the above structure, a contactless IC chip, a small memory device, or the like may be incorporated.

The semiconductor device described in the above embodiments can be used for the display panel 1802 and the direction of display is changed appropriately depending on an application mode. Further, the semiconductor device is provided with the camera lens 1807 on the same surface as the display panel 1802, and thus it can be used as a videophone. The speaker 1803 and the microphone 1804 can be used for videophone calls, recording, and playing sound, etc. as well as voice calls. Moreover, the housings 1800 and 1801 in a state where they are developed as illustrated in FIG. 17B can shift so that one is lapped over the other by sliding; therefore, the size of the portable information terminal can be reduced, which makes the portable information terminal suitable for being carried.

The external connection terminal 1808 can be connected to an AC adapter and various types of cables such as a USB cable, and charging and data communication with a personal computer are possible. Moreover, a storage medium can be inserted into the external memory slot 1811 so that a large amount of data can be stored and can be moved.

Further, in addition to the above functions, an infrared communication function, a television reception function, or the like may be provided.

Figure 18A:
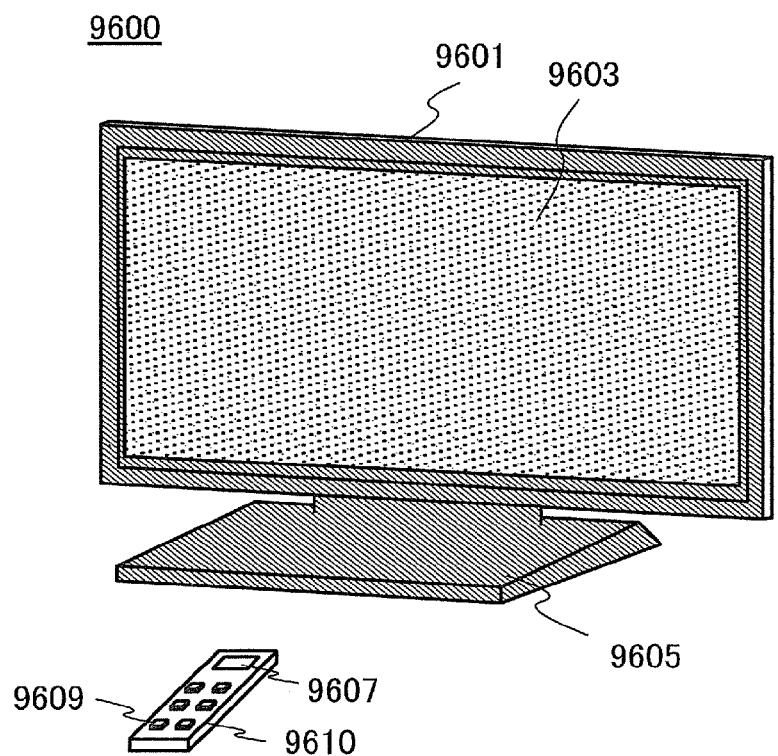
FIGS. 18A and 18B illustrate electronic devices.

FIG. 18A illustrates a television set 9600 which is an example of a television set. In the television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

Any of the semiconductor devices described in the above embodiments can be applied to the display portion 9603. For example, a plurality of thin film transistors described in the above embodiments can be disposed as switching elements of pixels.

Figure 18B:
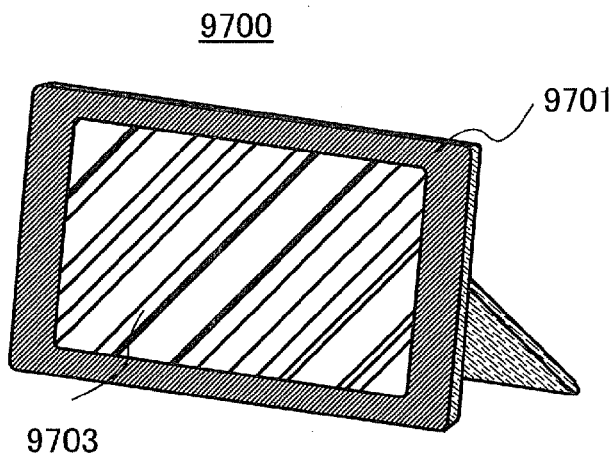

FIG. 18B illustrates a digital photo frame 9700 which is an example of a digital photo frame. For example, in the digital photo frame 9700, a display portion 9703 is incorporated in a housing 9701. The display portion 9703 can display a variety of images. For example, the display portion 9703 can display data of an image taken with a digital camera or the like and function as a normal photo frame.

Any of the semiconductor devices described in the above embodiments can be applied to the display portion 9703. For example, a plurality of thin film transistors described in the above embodiments can be disposed as switching elements of pixels.

Note that the digital photo frame 9700 is provided with an operation portion, an external connection terminal (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory in which image data taken with a digital camera is stored is inserted in the recording medium insertion portion of the digital photo frame 9700, whereby the image data can be displayed on the display portion 9703.

The digital photo frame 9700 may be configured to transmit and receive data wirelessly. The structure may be employed in which desired image data is transferred wirelessly to be displayed.

Figure 19:
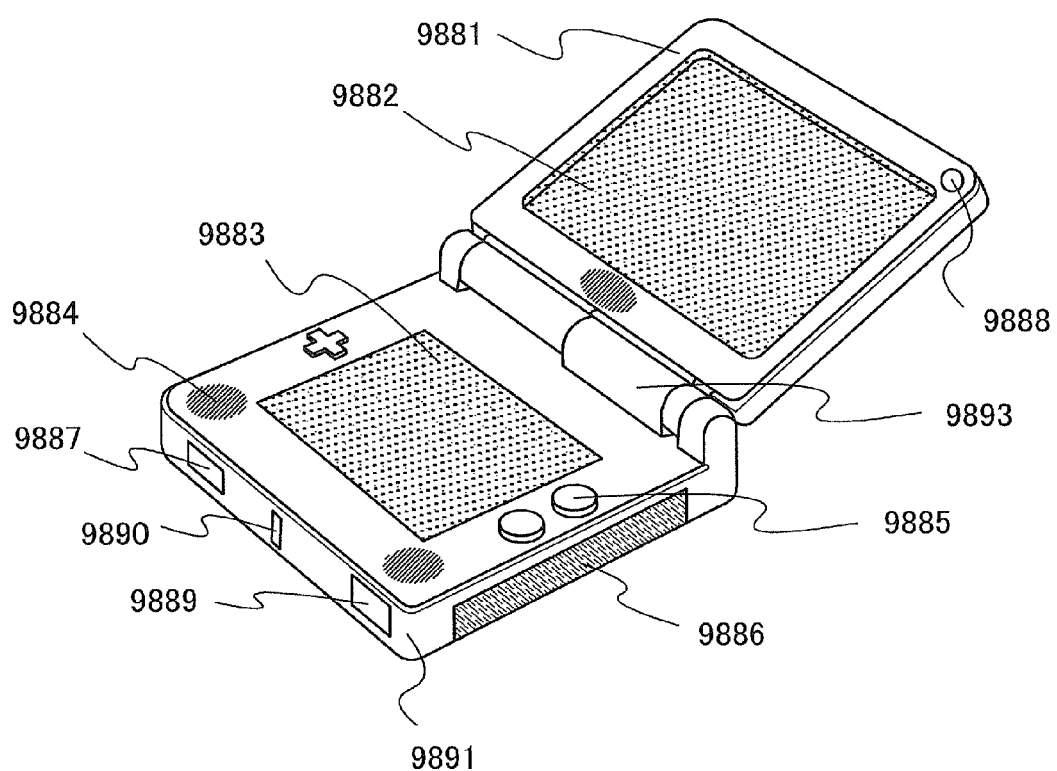
FIG. 19 illustrates an electronic device.

FIG. 19 illustrates a portable amusement machine including two housings, a housing 9881 and a housing 9891. The housings 9881 and 9891 are joined with a connection portion 9893 such that the portable amusement machine is foldable. A display portion 9882 and a display portion 9883 are incorporated in the housing 9881 and the housing 9891, respectively.

Any of the semiconductor devices described in the above embodiments can be applied to the display portion 9883. For example, a plurality of thin film transistors described in the above embodiments can be disposed as switching elements of pixels.

In addition, the portable amusement machine illustrated in FIG. 19 includes a speaker portion 9884, a recording medium insertion portion 9886, an LED lamp 9890, an input unit (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 9889), and the like. It is needless to say that the structure of the portable amusement machine is not limited to the above and other structures provided with at least a thin film transistor disclosed in this specification can be employed. The portable amusement machine may be provided with an additional accessory as appropriate. The portable amusement machine illustrated in FIG. 19 has a function of reading a program or data stored in a recording medium to display it on the display portion, and a function of sharing information with another portable amusement machine by wireless communication. The portable amusement machine illustrated in FIG. 19 can have various functions without limitation to the above.

Figure 21:
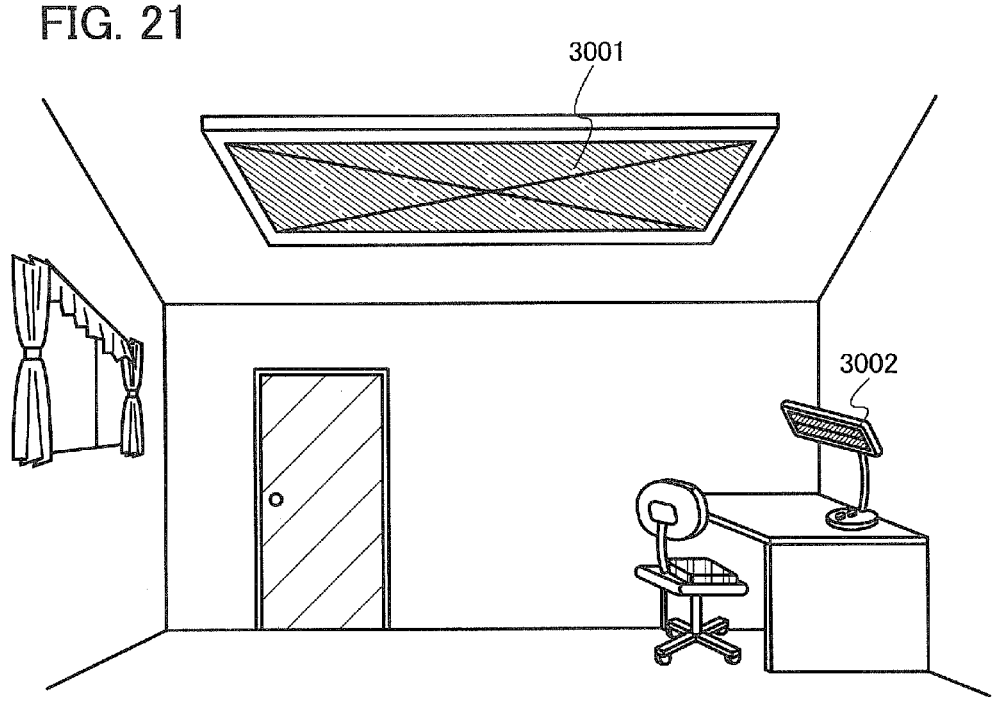
FIG. 21 illustrates electronic devices.

FIG. 21 illustrates an example in which a light-emitting device which is an example of the semiconductor device formed using any of the above embodiments is used as an indoor lighting device 3001. Since the light-emitting device in this specification can be enlarged, the light-emitting device can be used as a large-area lighting device. Further, the light-emitting device described in the above embodiment can be used as a desk lamp 3002. Note that a lighting device includes, in its category, a wall light, a light for an inside of a car, an evacuation light, and the like in addition to a ceiling light and a desk lamp.

In the above-described manner, the semiconductor device described in any of Embodiments 1 to 12 can be applied to a display panel of a variety of electronic devices such as the ones described above, whereby highly reliable electronic devices can be provided.

Embodiment 14

A semiconductor device disclosed in this specification can be applied to an electronic paper. An electronic paper can be used for electronic devices of a variety of fields as long as they display data. For example, an electronic paper can be applied to an e-book reader (electronic book), a poster, an advertisement in a vehicle such as a train, or displays of various cards such as a credit card. An example of the electronic device is illustrated in FIG. 20.

Figure 20:
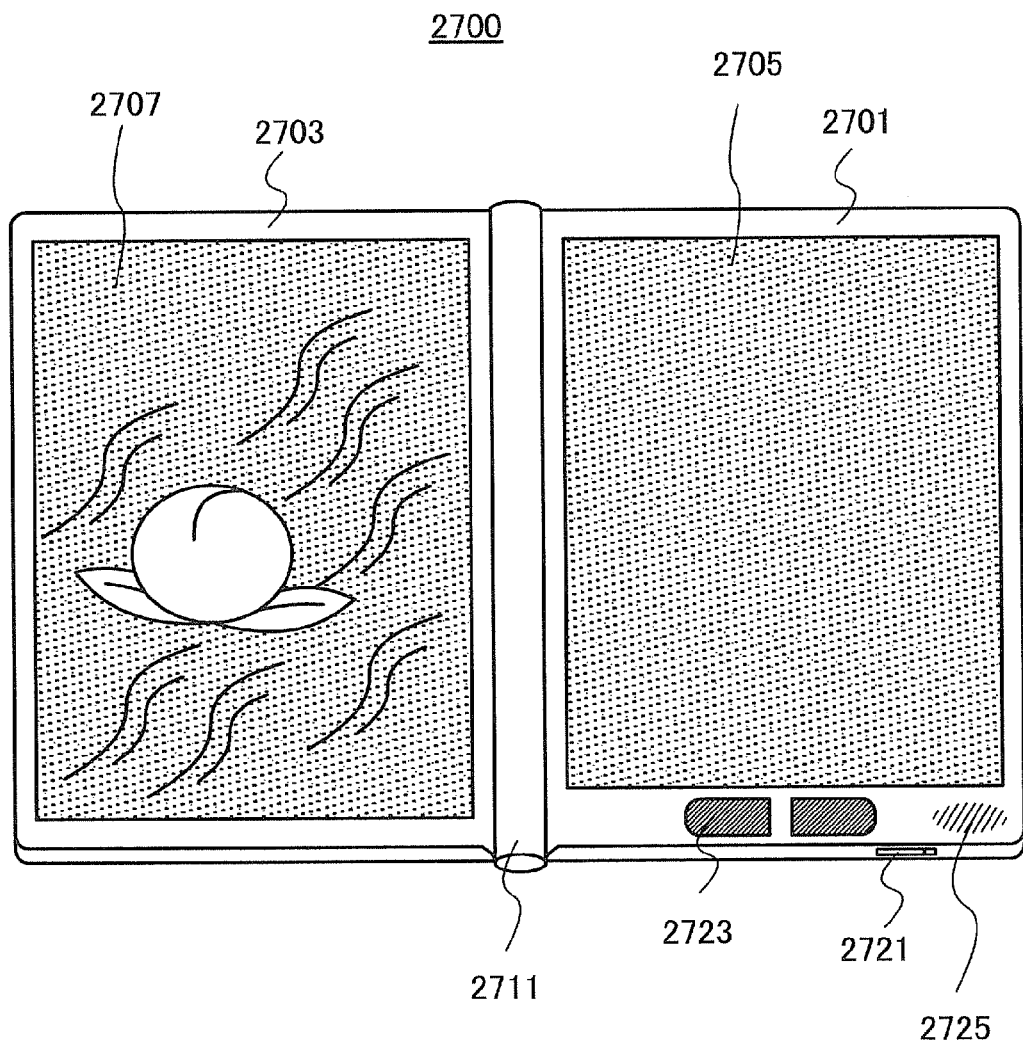
FIG. 20 illustrates an electronic device.

FIG. 20 illustrates an e-book reader 2700 which is an example of an e-book reader. For example, the e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 20) can display text and a display portion on the left side (the display portion 2707 in FIG. 20) can display graphics.

FIG. 20 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may transmit and receive data wirelessly. Through wireless communication, desired book data or the like can be purchased and downloaded from an electronic book server.

This embodiment can be implemented in combination with any of the other embodiments as appropriate.

Embodiment 15

In this embodiment, an example of a thin film transistor which can be applied to a semiconductor device disclosed in this specification will be described.

In this embodiment, an example of a structure in which a gate insulating layer and/or a protective insulating layer in contact with an oxide semiconductor layer are/is formed using a nitride insulating layer is described with reference to FIG. 29. Thus, a thin film transistor of this embodiment is the same as any of the thin film transistors described in the above embodiments except for that structure; therefore, the same portions are denoted by the same reference numerals and detailed description of the same portions is not repeated.

Figure 29:
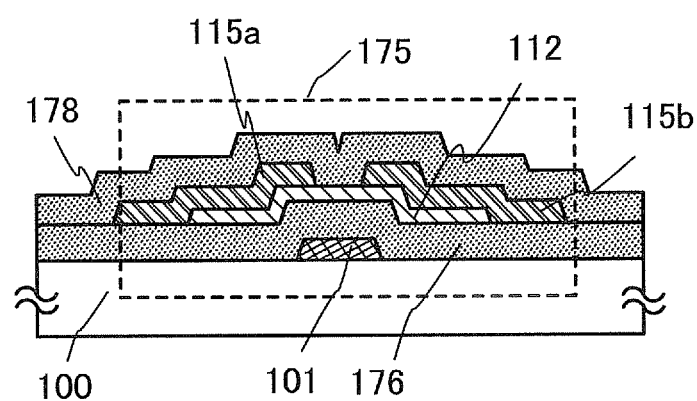
FIG. 29 illustrates a semiconductor device.

A thin film transistor 175 illustrated in FIG. 29 is a bottom-gate thin film transistor and includes a gate electrode layer 101, a gate insulating layer 176, an oxide semiconductor layer 112, a source electrode layer 115a, and a drain electrode layer 115b over a substrate 100 having an insulating surface. Further, an insulating layer 178 which covers the thin film transistor 175 and is in contact with a channel formation region of the oxide semiconductor layer 112 is provided as a protective insulating layer.

In order to suppress variation in electric characteristics of the thin film transistor in which the oxide semiconductor layer is used, an impurity such as hydrogen, moisture, hydroxyl, or hydride (also referred to as a hydrogen compound) which is factor of the variation is eliminated from the interface between the oxide semiconductor layer and the insulating layer provided in contact with the oxide semiconductor layer. Specifically, the interface between the oxide semiconductor layer and the insulating layer provided in contact with the oxide semiconductor layer has a hydrogen concentration of $5\times10^{19}$ atoms/cm$^3$ or lower, preferably $1\times10^{19}$ atoms/cm$^3$ or lower.

An impurity such as hydrogen or moisture (e.g., a hydrogen atom or a compound containing a hydrogen atom such as $H_2O$) is eliminated from the oxide semiconductor layer with use of a halogen element typified by fluorine or chlorine, so that the impurity concentration in the oxide semiconductor layer is reduced. In the case where the gate insulating layer and the insulating layer contain a halogen element, the concentration of the halogen element in the gate insulating layer and the insulating layer may be approximately $5\times10^{18}$ atoms/cm$^3$ to $1\times10^{20}$ atoms/cm$^3$.

The gate insulating layer and the insulating layer which are provided in contact with the oxide semiconductor layer can be formed to contain a halogen element. In addition, a halogen element may be attached to the oxide semiconductor layer through plasma treatment under an atmosphere of a gas containing a halogen element. At least one of the above methods for making a halogen element be contained in a semiconductor device (making a halogen element be contained in the gate insulating layer during deposition, making a halogen element be contained in the insulating layer during deposition, and making a halogen element be attached to the interface between the oxide insulating layer and the oxide semiconductor layer through plasma treatment) may be used, and needless to say, a plurality of the above methods may be used.

By at least one of the above methods, an impurity such as hydrogen, moisture, hydroxyl, or hydride included in the oxide semiconductor layer is diffused into the gate insulating layer and/or the insulating layer with use of a halogen element, so that the impurity concentration in the oxide semiconductor layer is reduced.

In this embodiment, an example in which the gate insulating layer 176 and the insulating layer 178 contain a halogen element is employed; thus, the gate insulating layer 176 and the insulating layer 178 which are provided in contact with the oxide semiconductor layer 112 contain a halogen element.

In this embodiment, the gate insulating layer 176 and/or the insulating layer 178 in contact with the oxide semiconductor layer are/is formed using a nitride insulating layer. Both of the gate insulating layer 176 and the insulating layer 178 may be formed using a nitride insulating layer. Alternatively, one of them may be formed using a nitride insulating layer and the other of them may be formed using an oxide insulating layer. A structure in which the gate insulating layer 176 is formed using a nitride insulating layer and the insulating layer 178 is formed using an oxide insulating layer (for example, the gate insulating layer 176 is formed using a silicon nitride layer and the insulating layer 178 is formed using a silicon oxide layer), a structure in which the gate insulating layer 176 is formed using an oxide insulating layer and the insulating layer 178 is formed using a nitride insulating layer (for example, the gate insulating layer 176 is formed using a silicon oxide layer and the insulating layer 178 is formed using a silicon nitride layer), or the like can be employed.

With the use of a nitride insulating layer, entry of moisture from the outside can be prevented, so that long-term reliability of the device can be improved.

The gate insulating layer 176 and the insulating layer 178 can be formed by a plasma CVD method, a sputtering method, or the like. High-density plasma CVD using a microwave (2.45 GHz) is preferably used, in which case an insulating layer which is dense, has high withstand voltage, and has high quality can be formed.

As a nitride insulating layer that can be used for the gate insulating layer 176 and the insulating layer 178, a single-layer structure or a stacked-layer structure of a silicon nitride layer, a silicon nitride oxide layer, an aluminum nitride layer, an aluminum nitride oxide layer, or the like can be used.

As an oxide insulating layer that can be used for the gate insulating layer 176 and the insulating layer 178, a single-layer structure or a stacked-layer structure of a silicon oxide layer, a silicon oxynitride layer, an aluminum oxide layer, an aluminum oxynitride layer, or the like can be used.

In this embodiment, the gate insulating layer 176 is formed using a silicon nitride layer containing a halogen element by a high-density plasma CVD method using a microwave (2.45 GHz), and the insulating layer 178 is formed using a silicon nitride layer containing a halogen element by a sputtering method.

By provision of the gate insulating layer 176 containing a halogen element and the insulating layer 178 containing a halogen element in contact with the oxide semiconductor layer 112, an impurity containing a hydrogen atom such as hydrogen, hydroxyl, or moisture in the oxide semiconductor layer 112 can be diffused into the gate insulating layer 176 containing a halogen element and the insulating layer 178 containing a halogen element, so that the impurity concentration in the oxide semiconductor layer 112, which is a factor of varying characteristics, can be reduced.

In the above-described manner, a highly reliable semiconductor device with stable electric characteristics including a thin film transistor in which an oxide semiconductor layer is used can be provided.

This embodiment can be implemented in combination with any of the other embodiments as appropriate.

This application is based on Japanese Patent Application serial no. 2009-242777 filed with Japan Patent Office on Oct. 21, 2009, the entire contents of which are hereby incorporated by reference.

EXPLANATION OF REFERENCE

100: substrate, 101: gate electrode layer, 102: gate insulating layer, 103: protective insulating layer, 110: thin film transistor, 112: oxide semiconductor layer, 115a: source electrode layer, 115b: drain electrode layer, 116: oxide insulating layer, 121: oxide semiconductor layer, 130: thin film transistor, 131: gate insulating layer, 132: gate insulating layer, 133: halogen element, 135: thin film transistor, 136: oxide insulating layer, 137: gate insulating layer, 138: oxide insulating layer, 139: thin film transistor, 140: substrate, 141: oxide semiconductor layer, 142: gate insulating layer, 143: gate insulating layer, 150: substrate, 151: gate electrode layer, 152: gate insulating layer, 153: protective insulating layer, 154: gate insulating layer, 160: thin film transistor, 162: oxide semiconductor layer, 165a: source electrode layer, 165b: drain electrode layer, 166: oxide insulating layer, 171: oxide semiconductor layer, 173: oxide insulating layer, 175: thin film transistor, 176: gate insulating layer, 178: insulating layer, 180: thin film transistor, 181: gate electrode layer, 183: protective insulating layer, 190: thin film transistor, 192: oxide semiconductor layer, 195a: source electrode layer, 195b: drain electrode layer, 196: oxide insulating layer, 580: substrate, 581: thin film transistor, 582: gate insulating layer, 583: oxide insulating layer, 584: protective insulating layer, 585: insulating layer, 587: first electrode layer, 588: second electrode layer, 590a: black region, 590b: white region, 594: cavity, 595: filler, 596: counter substrate, 600: substrate, 601: counter substrate, 602: gate wiring, 603: gate wiring, 606a: gate insulating layer, 606b: gate insulating layer, 616: source or drain electrode layer, 618: wiring, 619: wiring, 620: oxide insulating layer, 622: insulating film, 623: contact hole, 624: pixel electrode layer, 625: slit, 626: pixel electrode layer, 627: contact hole, 628: TFT, 629: TFT, 632: light-blocking film, 636: coloring film, 637: planarization film, 640: counter electrode layer, 641: slit, 650: liquid crystal layer, 651: liquid crystal element, 652: liquid crystal element, 690: capacitor wiring, 1000: deposition apparatus, 1100: transfer chamber, 1101: transfer unit, 1110: load chamber, 1111: cassette, 1120: unload chamber, 1121: cassette, 1200: transfer chamber, 1201: transfer unit, 1205: evacuation unit, 1210: treatment chamber, 1211: substrate-heating unit, 1215: evacuation unit, 1220: treatment chamber, 1225:

evacuation unit, 1230: treatment chamber, 1235: evacuation unit, 1240: treatment chamber, 1245: evacuation unit, 1600: mobile phone, 1601: housing, 1602: display portion, 1603a: operation button, 1603b: operation button, 1604: external connection port, 1605: speaker, 1606: microphone, 1800: housing, 1801: housing, 1802: display panel, 1803: speaker, 1804: microphone, 1805: operation key, 1806: pointing device, 1807: camera lens, 1808: external connection terminal, 1810: keyboard, 1811: external memory slot, 2700: e-book reader, 2701: housing, 2703: housing, 2705: display portion, 2707: display portion, 2711: hinge, 2721: power switch, 2723: operation key, 2725: speaker, 3000: deposition apparatus, 3001: lighting device, 3002: desk lamp, 3100: transfer chamber, 3101: transfer unit, 3105: evacuation unit, 3110: load chamber, 3111: cassette, 3115: evacuation unit, 3120: unload chamber, 3121: cassette, 3125: evacuation unit, 3210: treatment chamber, 3211: substrate-heating unit, 3215: evacuation unit, 3220: treatment chamber, 3225: evacuation unit, 3230: treatment chamber, 3235: evacuation unit, 3240: treatment chamber, 3241: substrate-heating unit, 3245: evacuation unit, 3250: treatment chamber, 3251: cooling unit, 3255: evacuation unit, 4001: first substrate, 4002: pixel portion, 4003: signal line driver circuit, 4004: scan line driver circuit, 4005: sealant, 4006: second substrate, 4008: liquid crystal layer, 4010: thin film transistor, 4011: thin film transistor, 4013: liquid crystal element, 4015: connection terminal electrode, 4016: terminal electrode, 4018: FPC, 4019: anisotropic conductive film, 4020: gate insulating layer, 4021: insulating layer, 4030: pixel electrode layer, 4031: counter electrode layer, 4032: insulating layer, 4040: conductive layer, 4041: insulating layer, 4042: protective insulating layer, 4501: first substrate, 4502: pixel portion, 4503a: signal line driver circuit, 4503b: signal line driver circuit, 4504a: scan line driver circuit, 4504b: scan line driver circuit, 4505: sealant, 4506: second substrate, 4507: filler, 4509: thin film transistor, 4510: thin film transistor, 4511: light-emitting element, 4512: electroluminescent layer, 4513: second electrode, 4515: connection terminal electrode, 4516: terminal electrode, 4517: first electrode, 4518a: FPC, 4518b: FPC, 4519: anisotropic conductive film, 4520: partition, 4540: conductive layer, 4542: oxide insulating layer, 4543: overcoat layer, 4544: insulating layer, 4545: color filter layer, 4550: wiring layer, 4551: insulating layer, 5001: dry pump, 5002: evacuation chamber, 5003: power supply, 5004: target, 5005: cathode, 5006: stage elevator, 5007: substrate stage, 5008: gate valve, 5009: cooling water, 5010: flow rate controller, 5011: gas tank, 6400: pixel, 6401: switching transistor, 6402: driving transistor, 6403: capacitor, 6404: light-emitting element, 6405: signal line, 6406: scan line, 6407: power supply line, 6408: common electrode, 7001: driving TFT, 7002: light-emitting element, 7003: first electrode, 7004: EL layer, 7005: second electrode, 7009: partition, 7011: driving TFT, 7012: light-emitting element, 7013: first electrode, 7014: EL layer, 7015: second electrode, 7016: light-blocking film, 7017: conductive film, 7019: partition, 7021: driving TFT, 7022: light-emitting element, 7023: first electrode, 7024: EL layer, 7025: second electrode, 7027: conductive film, 7029: partition, 7031: insulating layer, 7032: insulating layer, 7033: color filter layer, 7034: overcoat layer, 7035: protective insulating layer, 7036: planarization insulating layer, 7042: insulating layer, 7043: color filter layer, 7044: overcoat layer, 7045: protective insulating layer, 7051: insulating layer, 7052: protective insulating layer, 7053: planarization insulating layer, 7055: insulating layer, 7056: planarization insulating layer, 9600: television set, 9601: housing, 9603: display portion, 9605: stand, 9607: display portion, 9609: operation key, 9610: remote controller, 9700: digital photo frame, 9701: housing, 9703: display portion, 9881: housing, 9882: display portion, 9883: display portion, 9884: speaker portion, 9885: operation key, 9886: recording medium insertion portion, 9887: connection terminal, 9888: sensor, 9889: microphone, 9890: LED lamp, 9891: housing, and 9893: connection portion

What is claimed is:

1. A method of manufacturing a semiconductor device comprising the steps of:
forming a first oxide insulating layer over a gate electrode;
forming an oxide semiconductor layer over the first oxide insulating layer, wherein the oxide semiconductor layer overlaps with the gate electrode;
performing plasma treatment on the oxide semiconductor layer under an atmosphere of a gas containing a halogen element;
forming a second oxide insulating layer over the oxide semiconductor layer, the second oxide insulating layer containing silicon, oxygen, and the halogen element;
forming a source electrode and a drain electrode over the second oxide insulating layer, the source electrode and the drain electrode being electrically connected to the oxide semiconductor layer; and
heating the oxide semiconductor layer.

2. The method according to claim 1, wherein the halogen element is added during deposition of the second oxide insulating layer.

3. The method according to claim 1, wherein the oxide semiconductor layer is in contact with the second oxide insulating layer.

4. The method according to claim 1, wherein the oxide semiconductor layer contains hydrogen at a concentration of $5\times10^{19}$ atoms/cm$^3$ or lower.

5. The method according to claim 1, wherein the second oxide insulating layer contains the halogen element at a concentration of $5\times10^{18}$ atoms/cm$^3$ or higher.

6. The method according to claim 1, wherein the oxide semiconductor layer is non-single crystalline.

7. The method according to claim 1, wherein the step of heating is performed at a temperature of 100° C. to 400° C.

8. The method according to claim 1, further processing the oxide semiconductor layer into an island shape before performing the plasma treatment.

9. A method of manufacturing a semiconductor device comprising the steps of:
forming a first oxide insulating layer over a gate electrode;
forming an oxide semiconductor layer over the first oxide insulating layer, wherein the oxide semiconductor layer overlaps with the gate electrode;
performing plasma treatment on the oxide semiconductor layer under an atmosphere of a gas containing fluorine;
forming a second oxide insulating layer over the oxide semiconductor layer;
forming a source electrode and a drain electrode over the second oxide insulating layer, the source electrode and the drain electrode being electrically connected to the oxide semiconductor layer;
forming a silicon nitride layer over the source electrode and the drain electrode; and
heating the oxide semiconductor layer at a temperature of 100° C. or higher after forming the second oxide insulating layer,
wherein the second oxide insulating layer contains silicon, oxygen, and fluorine.

10. The method according to claim 9, wherein fluorine is added to the second oxide insulating layer after forming the second oxide insulating layer.

11. The method according to claim 9, wherein fluorine is added to the second oxide insulating layer during forming the second oxide insulating layer.

12. The method according to claim 9, wherein the oxide semiconductor layer contains hydrogen at a concentration of $5 \times 10^{19}$ atoms/cm$^3$ or lower.

13. The method according to claim 9, wherein the second oxide insulating layer contains fluorine at a concentration of $5 \times 10^{18}$ atoms/cm$^3$ or higher.

14. The method according to claim 9, wherein the oxide semiconductor layer is non-single crystalline.

15. The method according to claim 9, further processing the oxide semiconductor layer into an island shape before performing the plasma treatment.

16. A method of manufacturing a semiconductor device comprising the steps of:
forming an oxide semiconductor layer over a substrate;
performing plasma treatment on the oxide semiconductor layer under an atmosphere of a gas containing fluorine;
forming an oxide insulating layer containing silicon and oxygen on the oxide semiconductor layer;
adding fluorine to the oxide insulating layer;
forming a source electrode and a drain electrode over the oxide insulating layer, the source electrode and the drain electrode being electrically connected to the oxide semiconductor layer; and
performing a heat treatment after the step of adding fluorine at a temperature of 100° C. or higher.

17. The method according to claim 16, wherein the oxide semiconductor layer contains hydrogen at a concentration of $5 \times 10^{19}$ atoms/cm$^3$ or lower.

18. The method according to claim 16, wherein the oxide semiconductor layer is non-single crystalline.

19. The method according to claim 16, wherein the oxide semiconductor layer has a thickness of greater than or equal to 2 nm and less than or equal to 200 nm.

20. The method according to claim 16, further processing the oxide semiconductor layer into an island shape before performing the plasma treatment.

* * * * *